United States Patent

Shingai et al.

[11] Patent Number: 5,886,877
[45] Date of Patent: Mar. 23, 1999

[54] CIRCUIT BOARD, MANUFACTURING METHOD THEREFOR, AND BUMP-TYPE CONTACT HEAD AND SEMICONDUCTOR COMPONENT PACKAGING MODULE USING THE CIRCUIT BOARD

[75] Inventors: Noboru Shingai, Yokohama; Tatsuo Wada, Ayase; Katsuro Aoshima, Hadano, all of Japan

[73] Assignees: Meiko Electronics Co., Ltd., Kanagawa; Machine Active Contact Co., Ltd., Tokyo, both of Japan

[21] Appl. No.: 727,973

[22] Filed: Oct. 9, 1996

[30] Foreign Application Priority Data

Oct. 13, 1995 [JP] Japan .................................... 7-265701
Mar. 5, 1996 [JP] Japan .................................... 8-047744
Apr. 10, 1996 [JP] Japan .................................... 8-088265

[51] Int. Cl.[6] .................................................. H01L 23/485
[52] U.S. Cl. .......................... 361/768; 361/751; 361/774; 361/783; 174/255; 174/257; 174/264; 257/698; 257/700; 257/737; 257/781; 29/846; 228/180.22; 438/614
[58] Field of Search ..................................... 361/751, 768, 361/774, 780, 783, 794; 174/254, 255, 257, 264; 228/180.22; 257/698, 700, 738, 774, 778, 780, 737, 781; 438/614; 343; 29/846

[56] References Cited

U.S. PATENT DOCUMENTS

| | | | |
|---|---|---|---|
| 3,781,596 | 12/1973 | Galli et al. | 228/180.22 |
| 3,832,769 | 9/1974 | Olyphant, Jr. et al. | 361/751 |
| 4,332,343 | 6/1982 | Koopman et al. | 228/180.22 |
| 4,968,589 | 11/1990 | Perry | 430/314 |
| 5,090,118 | 2/1992 | Kwon et al. | 29/846 |
| 5,118,386 | 6/1992 | Kataoka et al. | 174/254 |
| 5,177,438 | 1/1993 | Littlebury et al. | 324/754 |
| 5,251,806 | 10/1993 | Agarwala et al. | 228/180.22 |
| 5,310,965 | 5/1994 | Senba et al. | 174/250 |
| 5,361,491 | 11/1994 | Oomachi et al. | 29/852 |
| 5,383,093 | 1/1995 | Nagasaka | 361/751 |
| 5,431,328 | 7/1995 | Chang et al. | 228/180.22 |
| 5,513,430 | 5/1996 | Yanof et al. | 29/846 |
| 5,564,617 | 10/1996 | Degani et al. | 228/180.22 |

FOREIGN PATENT DOCUMENTS

| | | |
|---|---|---|
| 0258451 A1 | 3/1988 | European Pat. Off. . |
| 0321239 A2 | 6/1989 | European Pat. Off. . |
| 0607732 A2 | 7/1994 | European Pat. Off. . |

OTHER PUBLICATIONS

Patent Abstracts of Japan, vol. 017, No. 235 (P–1533), May 12, 1993 & JP 04 362507 A (TDK Corp.), Dec. 15, 1992.
Patent Abstracts of Japan, vol. 017, No. 640 (E–1465), Nov. 26, 1993 & JP 05 206201 A (Furukawa Electric Co., Ltd: The Others: 01), Aug. 13, 1993.

*Primary Examiner*—Leo P. Picard
*Assistant Examiner*—John B. Vigushin
*Attorney, Agent, or Firm*—Frishauf, Holtz, Goodman, Langer & Chick

[57] ABSTRACT

A circuit board, which is formed with bump patterns subject to a narrow variation in height on the surface of the circuit board, and which permits high-density packaging of a semiconductor component thereon. In this circuit board, conductor circuits formed by electroplating are embedded in an insulating base that is formed of a resist layer and an insulating substrate, and bumps are exposed in the surface of the insulating base. The bumps and the conductor circuits are connected electrically with one another by means of pillar-shaped conductors that are formed by electroplating. Each bump is a multilayer structure in two or more layers formed by successively depositing different electrically conductive materials by electroplating.

12 Claims, 31 Drawing Sheets

CIRCUIT BOARD, MANUFACTURING METHOD THEREFOR, AND BUMP-TYPE CONTACT HEAD AND SEMICONDUCTOR COMPONENT PACKAGING MODULE USING THE CIRCUIT BOARD

BACKGROUND OF THE INVENTION

1. Field of the Invention

The present invention relates to a circuit board having patterns in the form of bumps with a very narrow variation in height projecting from at least one surface thereof, and more specifically, to a circuit board formed having high-reliability conduction structures between its general output and input terminals and conductor circuits and which is capable of high-density packaging of semiconductor devices. The present invention also relates to a bump-type contact head obtained with use of the circuit board, capable of satisfactorily checking even fine-pitch circuit components, such as LSIs, liquid crystal panels, TABs, PDPs, etc., for wiring failures, and which enjoys high accuracy in pitches between inspection terminals and excellent high-frequency characteristics. In addition, the present invention relates to a method for manufacturing these elements with high productivity and at low cost.

Still further, the invention relates to a semiconductor component packaging module of a novel connection structure, using the aforesaid circuit board as a packaging substrate and having various semiconductor components mounted on the substrate by die bonding.

2. Prior Art

Usually, a semiconductor device package, which may be incorporated in various electronic apparatuses such as a computer, portable communication apparatus, liquid crystal panel, etc., is constructed so that one semiconductor device, such as a bare chip, is mounted on a circuit board that is formed with predetermined patterns for conductor circuits, the continuity between this device and the respective output and input terminals of the conductor circuits is established to package the semiconductor device, and the whole structure is resin-molded.

The semiconductor device may be packaged by a method in which it is die-bonded to the circuit board and the output and input terminals of the circuit board and the terminals (lands) of the semiconductor device are wire-bonded, a method in which a flip chip is connected to the output and input terminals of the circuit board by, for example, soldering, or a method in which the output and input terminals of the circuit board and lead terminals of the semiconductor device are directly connected by soldering.

The semiconductor device package manufactured in this manner is incorporated in practical equipment by being mounted on a mother board (packaging substrate) on which the conductor circuits with the predetermined patterns are arranged. Usually, in this case, the area ratio of one semiconductor device package to the mother board ranges from about 1/10 to 1/5, so that a plurality of semiconductor device packages can be mounted on the mother board.

Conventionally, wire bonding is partially used for the mounting on the mother board. To meet the requirement for high-density packaging, however, a novel method has recently started to be widely used such that cream solder is pattern-printed on the lands of the mother board, the terminals (lead terminals or ball grid arrays) of the semiconductor device package are registered on the resulting pattern, and the whole resulting structure is subjected to blanket soldering in a reflow device.

There is a growing tendency for modern electronic apparatuses to become smaller in size, higher in operating speed, and more diverse in function. Accordingly, there is an increasing demand for the development of circuit boards capable of high-density packaging of semiconductor components despite the smallness in overall size.

To this end, it is advisable to use multilayer circuit boards and fine-pattern conductor circuits to be formed. Usually, however, conventional multilayer circuit boards are manufactured by the so-called build-up method, so that they involve the following problems.

In manufacturing a multilayer circuit board by the build-up method, a unit circuit board is first prepared by forming a conductor circuit, which serves as a signal pattern, on the surface of an insulating substrate as a bottom layer. Another unit circuit board, which is formed with another conductor circuit as another signal pattern, is put on the first one for unification. This operation is repeated so that a plurality of unit circuit boards are successively assembled from bottom to top.

In this case, a conduction structure between conductor circuits in each two adjacent layers, upper and lower, usually includes a plurality of through holes bored in a predetermined plane pattern through the unit circuit board in the thickness direction thereof. After the wall surface of each through hole is given electrical conductivity by, for example, electroless plating, electroplating is carried out with use of the conductor circuit in the lower layer as an electrical conduction path, and the respective lands of the conductor circuits in the upper and lower layers are connected electrically by means of the resulting deposit.

In order to effect the high-density packaging, therefore, the through holes should be made small in diameter. Practically, however, the hole diameter can be reduced only limitedly.

Generally, the through holes are formed by drilling, so that their diameter cannot be made very small in consideration of the drilling strength. Normally, the diameter of drilled holes ranges from 150 to 200 $\mu$m. The diameter of through holes formed by photolithography ranges from about 100 to 150 $\mu$m.

In the case where a deposit is formed on the wall surface of each bored through hole by combining the electroless plating and electroplating, it must secure a certain measure of thickness, since the electrical continuity between the conductor circuits in the upper and lower layers cannot be satisfactory if the deposit is too thin. For good electrical conduction between the conductor circuits, the thickness of the deposit is normally adjusted to about 20 to 30 $\mu$m, depending on the type of the circuit board.

In general, therefore, a deposit with a thickness of 15 to 20 $\mu$m is formed on the surface of each through hole with a diameter of 150 to 200 $\mu$m, in the conduction structure based on the through holes. In the center of each through hole, in this case, exists a dead space with a diameter of about 100 to 150 $\mu$m that has no connection with the conduction between the conductor circuits at all.

Also in the case of inner via holes, a dead space with a diameter of about 60 to 70 $\mu$m is created if the diameter of each hole is, for example, 100 $\mu$m. Thus, the diameter of the conventional through holes or inner via holes can be reduced only limitedly, and has no effect on the conduction between the conductor circuits, inevitably.

Normally, the following operation is carried out to form the deposit on the wall surface of each through hole in each of inner layers that are built up in succession. After electrical conductivity is given to the whole surface of a target inner layer (including the wall surface of each existing through hole or inner via hole) by electroless plating, a thin deposit is formed by electroplating the inner layer surface. Then, a dry film, for example, is sticked on the surface of the deposit so as to cover it, and is exposed and developed to expose only those portions corresponding to the through holes. The resulting structure is further electroplated with the remaining portion masked, whereupon a deposit of a given thickness is formed on the surface of each through hole (and land). Thereafter, the dry film is separated, and the thin deposit on the exposed surface of the inner layer and the deposit formed by the electroless plating are removed by, for example, soft etching.

In manufacturing a multilayer circuit board by building up the individual inner layers, therefore, the aforesaid operation must be repeated for each inner layer, so that complicated manufacturing processes are required. Thus, the manufacture takes long time, inevitably entailing high manufacturing costs.

In the case of the inner via holes, solid conduction structures may be formed between the layers by forming a deposit on the wall surface of each via hole and then embedding, for example, electrically conductive paste in the dead space remaining in the center of the deposit.

In this case, the solid conduction structures may possibly be formed by simultaneously electrodepositing and filling a conductive material in all the via holes by electroplating in place of the embedding of the conductive paste. In the build-up method, however, it is necessary to provide a conduction path separately for an input terminal for electroplating in advance in the first stage of the manufacture, so that the manufacturing processes are more complicated.

In forming a packaging substrate such as a semiconductor device package or a circuit board, such as a mother board, that has a projecting bump pattern on its packaging surface by the build-up method, a bump material is electrodeposited by, for example, electroplating to form the bump pattern with an intended height on a predetermined portion of a conductor circuit in the top layer, among other conductor circuits built up in succession.

In actual electroplating operation, however, all bumps that constitute the bump pattern cannot be formed with the same height, due to influences of delicate fluctuation in the plating conditions or variation in the flows of electric current to spots for the formation of the individual bumps, so that the bump height varies. In the case where the target bump height is 0.03 mm, for example, the bump height variation is about ±0.003 mm.

If the variation in the bump height is too wide, then some bumps will not be connected to the lands of the semiconductor device package even though the lands are positioned for a reflow process. Thus, reliable packaging cannot be effected.

In consideration of these circumstances, it is necessary to minimize the variation in the height of the bumps in the case of the circuit board that has the bump pattern formed on its packaging surface.

A contact head for checking wiring circuits in LSIs, liquid crystal panels, etc. for troubles is a kind of circuit board. Conventionally, in the contact head of this type, pin probes or L-shaped needles are embedded in an electrically insulating rigid material, and are fixed to the body of the head at predetermined pitches so that their respective tip ends can come into contact with predetermined inspection spots in a wiring circuit as an object of inspection. Also, wires are soldered individually to the respective other ends of the probes or needles so that signals for the inspection spots can be fetched from the other ends. On the other hand, there is a bump system in which bumps are formed by, for example, electroplating in specific circuit portions of a circuit board that has a predetermined circuit pattern, or by a film forming method that is used in the field of semiconductor production, and these bumps are operated in place of the aforesaid pin probes or L-shaped needles.

Recently, the circuit patterns of various circuit components as objects of inspection, and therefore, the pitches between the inspection spots have been becoming finer and finer.

To match the fine pitches between the inspection spots, in the case of a pin-probe head, holes to allow the tip ends of the pin probes to project are formed and arranged zigzag at infinitesimal intervals in the surface of the head. In the case of a head that uses L-shaped needles, the needles to be fixed are tiered.

These countermeasures, however, entail operation to fix at regular pitches the individual pin probes or L-shaped needles that increase remarkably in number as the pitches between the inspection spots become finer, and also, operation to solder a wire to each probe or needle. Thus, completion of products requires a great deal of skill and long operating time, so that the resulting heads are very expensive, inevitably. Even after the pin probes or L-shaped needles are fixed to the head, moreover, their respective tip ends require an accurate location and rearrangement therefor. During storage before shipping, furthermore, close attention must be paid not to run the probe or needle tips against other articles.

In the case of a head having tiered L-shaped needles, the respective elongate portions of the needles are arranged parallel to one another. If the frequencies of input and output signals are heightened, for example, to increase the speed of inspection, therefore, the resulting characteristics of the head may be adversely affected to cause inspection errors, in some cases.

In forming bumps of a bump-type head by electroplating, on the other hand, the bump height is subject to a substantial variation, as mentioned before. The wide variation in the bump height is fatal to the head in which all the bumps must be brought securely into contact with their corresponding inspection spots in the wiring circuit, as a vital necessity.

In the case where bumps are formed by means of a thin film manufacturing apparatus, which is used in the field of semiconductor production and is very expensive, the resulting heads are also very expensive, and a mechanism for integrating the heads with probe cards is necessary. Also required is a drive mechanism for moving the bumps upward, in order to bring them into contact with the inspection spots in the wiring circuit at the time of inspection, and downward after the inspection. Thus, the heads obtained are complicated in construction and more expensive.

If an attempt is made to mount semiconductor components on the conventional packaging substrate at high density, the dead space inevitably enlarges with the increase of spots for mounting the components, since the conduction structures are based on through holes or inner via holes, as mentioned before. In a packaging substrate of a certain standard size, therefore, the number of regions for the formation of necessary bump patterns (or lands) for component packaging and the extent thereof are limited, so that the effort toward high-density packaging is restricted. If high-density packaging is intended to be achieved, the arrangement of additional signal patterns is needed, so that the multilayer structure of the substrate or circuit board is bound to be further complicated. Accordingly, wires in the signal patterns are lengthened, so that the reliability of the electrical properties of the resulting packaging substrate may be lowered in some cases.

OBJECTS AND SUMMARY OF THE INVENTION

An object of the present invention is to provide a circuit board which has a bump pattern or patterns formed on at least one surface thereof so that the surface serves as a packaging surface for a bare chip or semiconductor device package, whereby the circuit board can be used as a substrate or mother board for semiconductor device packaging.

Another object of the invention is to provide a circuit board subject to a very narrow variation in bump height.

Still another object of the invention is to provide a circuit board designed so that small-diameter conduction structures can be secured between conductor circuits, thus permitting high-density packaging of a bare chip or semiconductor device package, etc.

A further object of the invention is to provide a circuit board capable of mounting a bare chip or semiconductor device package directly by means of bumps, thus ensuring labor-saving component packaging.

An additional object of the invention is to provide a manufacturing method for a circuit board, in which bump patterns with a narrow variation in height are formed on at least one surface of the circuit board by, so to speak, an inverted build-up process, without carrying out machining that is required in manufacturing a multilayer circuit board by the conventional build-up process.

Another object of the invention is to provide a manufacturing method for a circuit board, in which conductor circuits and conduction structures can be formed by an electroplating process with a high current density such that the desired circuit board can be manufactured with high productivity.

A further object of the invention is to provide a bump-type contact head, capable of readily matching fine-pitch arrangement, if any, of an object of inspection, ensuring high-frequency inspection without errors, and enjoying low-cost production, and a manufacturing method therefor.

A further object of the invention is to provide a semiconductor component packaging module of a novel structure, in which a bare chip or semiconductor device package is mounted or packaged by means of bumps, and the bumps and land circuits of the bare chip or semiconductor device package are mechanically in contact with one another for electrical continuity.

In order to achieve the above objects, according to the present invention, there is provided a circuit board comprising: an insulating base having at least bumps on at least one surface thereof; conductor circuits in at least one layer on at least the one surface of and/or inside the insulating base; and a conduction structure for electrical connection formed between the bumps and the conductor circuits and/or between the conductor circuits, at least each of the bumps being a multilayer structure formed by successively electrodepositing at least two different electrically conductive materials.

Preferably, the conduction structure is formed of pillar-shaped conductors, and each bump is a two-layer structure having an outer layer portion formed of a corrosion-resistant conductive material, such as gold, nickel, or nickel alloy, and an inner layer portion formed of copper.

According to the invention, there is provided a method for manufacturing a circuit board, comprising: a step A of manufacturing a member A composed of an electrically conductive substrate, a thin conductor layer formed on at least one surface of the conductive substrate, an electrodeposit layer formed on one surface of the thin conductor layer, bumps of a multilayer structure embedded in predetermined positions in the electrodeposit layer and formed by successively electrodepositing at least two different electrically conductive materials, a resist portion A formed by coating the electrodeposit layer, first pillar-shaped conductors, conductor circuits, or land circuits embedded in the resist portion A and connected to the bumps, and second pillar-shaped conductors embedded in the resist portion A, connected to the conductor circuits or land circuits, and having an end face exposed in the surface of the resist portion A; a step B of manufacturing a member B(1) having a conductor circuit in a layer on the surface of the resist portion A of the member A or a member B(2) having conductor circuits in a plurality of layers and pillar-shaped conductors embedded in another resist portion B, the pillar-shaped conductors connecting the conductor circuits, and the last conductor circuit being formed on the surface of the resist portion B; a step C of manufacturing an integrated structure C formed by bonding that surface of the member B(1) or B(2) on the conductor circuit side to the surface of the insulating base by thermocompression so that the conductor circuits are embedded in the insulating base; and a step D of exposing the bumps by separating the conductive substrate from the integrated structure C and then successively removing the thin conductor layer and the electrodeposit layer by etching.

Preferably, the step A includes: a step $A_1$ of forming the thin conductor layer by coating at least the one surface of the conductive substrate by electroplating; a step $A_2$ of forming a resist layer $a_1$ by coating the thin conductor layer and then optically exposing and developing the resist layer $a_1$ so that the other surface of the thin conductor layer is exposed with the resist layer $a_1$ left only on expected bump formation spots; a step $A_3$ of forming the electrodeposit layer by electrodepositing an electrically conductive material on the exposed surface of the thin conductor layer by electroplating so that the conductive material is flush with the resist layer $a_1$; a step $A_4$ of forming recesses for bump, through which the surface of the thin conductor layer is exposed, in the electrodeposit layer by removing the resist layer $a_1$ left on the expected bump formation spots; a step $A_5$ of forming a resist layer $a_2$ by coating the surface of the electrodeposit layer and then optically exposing and developing the resist layer $a_2$, thereby forming the resist layer $a_2$ with first holes connecting individually with the recesses for bump and plane patterns corresponding to the respective circuit patterns of the land circuits to be formed; a step $A_6$ of electrodepositing a first conductive material in a layer in the recesses for bump and the first holes and on the plane patterns by electroplating, then additionally electrodepositing at least one conductive material different from the first conductive material on the resulting lamina, and filling up the recesses for bump, first holes, and plane patterns with a multilayer structure formed of two or more different conductive materials stacked in layers, thereby collectively forming the bumps, first pillar-shaped conductors, and land circuits; a step $A_7$ of exposing the surface of the electrodeposit layer by removing the resist layer $a_2$; a step $A_8$ of coating the exposed surface of the electrodeposit layer, thereby forming a resist layer $a_3$ with a thickness such that the respective end faces of the first pillar-shaped conductors are exposed; a step $A_9$ of coating the respective end faces of the resist layer $a_3$ and the first pillar-shaped conductors and forming a deposit film by electroless plating; a step $A_{10}$ of forming a resist layer $a_4$ by coating the deposit film, then optically exposing and developing the resist layer $a_4$, and forming a plane pattern corresponding to the circuit pattern of the conductor circuit to be formed and plane patterns of holes connecting with the land circuits on the resist layer $a_4$ so that the surface of the deposit film is exposed from the plane patterns; a step $A_{11}$ of electrodepositing a conductive material on the plane patterns by electroplating, thereby collectively forming the conductor circuit and the pillar-shaped conductors connected to the land circuits; a step $A_{12}$ of exposing the resist layer $a_3$ by removing the resist layer $a_4$ and removing the exposed deposit film by etching; a step $A_{13}$ of forming the resist portion A composed of the resist layer $a_3$ and a resist layer $a_5$ by coating the conductor circuit, the pillar-shaped conductors connected to the land circuits, and the resist layer $a_3$ with the resist layer $a_5$ and then optically exposing and developing the resist layer $a_5$, thereby forming second holes connecting with the conductor circuit and the pillar-shaped conductors connected to the land circuits; and a step $A_{14}$ of forming the second pillar-shaped conductors by filling up the second holes with a conductive material by electroplating.

According to the invention, moreover, the step B(1) preferably includes: a step $B_1$ of coating the whole surface of the resist layer $a_5$ of the member A and forming a deposit film by electroless plating; a step $B_2$ of forming a resist layer $b_1$ by coating the deposit film, then optically exposing and developing the resist layer $b_1$, and forming a plane pattern corresponding to the circuit pattern of the conductor circuit to be formed so that the surface of the deposit film is exposed from the plane pattern; a step $B_3$ of electrodepositing a conductive material on the exposed surface of the deposit film by electroplating, thereby forming the conductor circuit; and a step $B_4$ of exposing the resist layer $a_5$ by removing the resist layer $b_1$ and removing the exposed deposit film by etching.

According to the invention, moreover, the step B(2) includes: a step $B_5$ of forming a resist layer $b_2$ by coating the resist layer $a_5$ and the conductor circuit of the member B(1), then optically exposing and developing the resist layer $b_2$, and forming the resist layer $b_2$ with a hole connecting with the conductor circuit; a step $B_6$ of electrodepositing a conductive material in the hole by electroplating, thereby forming the pillar-shaped conductors; a step $B_7$ of coating the whole surface of the resist layer $b_2$ and forming a deposit film by electroless plating; a step $B_8$ of forming a resist layer $b_3$ by coating the deposit film, then optically exposing and developing the resist layer $b_3$, and forming the resist layer $b_3$ with a plane pattern corresponding to the circuit pattern of the conductor circuit to be formed so that the surface of the deposit film is exposed from the plane pattern; a step $B_9$ of electrodepositing a conductive material on the plane pattern by electroplating, thereby forming the conductor circuit; and a step $B_{10}$ of exposing the resist layer $b_2$ by removing the resist layer $b_3$ and removing the exposed deposit film by etching, each of the steps $B_5$ to $B_{10}$ being carried out at least once for the resist layer $b_2$ and the conductor circuit on the surface thereof.

According to the invention, furthermore, the step A preferably includes: a step $A_1$ of forming the thin conductor layer by coating at least the one surface of the conductive substrate by electroplating; a step $A_2$ of forming a resist layer $a_1$ by coating the thin conductor layer and then optically exposing and developing the resist layer $a_1$ so that the other surface of the thin conductor layer is exposed with the resist layer a1 left only on expected bump formation spots; a step $A_3$ of forming the electrodeposit layer by electrodepositing an electrically conductive material on the exposed surface of the thin conductor layer by electroplating so that the conductive material is flush with the resist layer $a_1$; a step $A_4$ of forming recesses for bump, through which the surface of the thin conductor layer is exposed, in the electrodeposit layer by removing the resist layer $a_1$ left on the expected bump formation spots; a step $A_{15}$ of forming a resist layer $a_2$ by coating the surface of the electrodeposit layer and then optically exposing and developing the resist layer $a_2$, thereby forming the resist layer $a_2$ with plane patterns connecting individually with the recesses for bump and corresponding to the respective circuit patterns of the conductor circuits to be formed, and if necessary, plane patterns corresponding to the respective circuit patterns of the land circuits; a step $A_{16}$ of electrodepositing a first conductive material in a layer in the recesses for bump and on the plane patterns by electroplating, then electrodepositing at least one conductive material different from the first conductive material on the resulting lamina, and filling up the recesses for bump, the conductor circuits, and if necessary, the land circuits with a multilayer structure formed of two or more different conductive materials stacked in layers, thereby collectively forming the bumps, conductor circuits, and if necessary, land circuits; a step $A_{17}$ of forming a resist layer $a_3$ by coating the conductor circuits, and if necessary, the land circuits, then optically exposing and developing the resist layer $a_3$, and forming the resist layer $a_3$ with first holes connecting individually with the conductor circuits, and if necessary, the land circuits; and a step $A_{18}$ of electrodepositing a conductive material in the first holes by electroplating, thereby forming the pillar-shaped conductors.

According to the present invention, moreover, there is provided a bump-type contact head comprising: an insulating substrate; a movable region formed in a predetermined position in the insulating substrate so that at least the upper surface of the movable region can move up and down, the upper surface of the movable region being flush with the upper surface of the insulating substrate; a plurality of signal conductors arranged on the upper surface of and/or inside the insulating substrate and extending to the movable region, at least the tip end of each of the signal conductors being situated in the movable region; and bumps protruding individually from the upper surfaces of the respective tip ends of the signal conductors, each of the bumps being a multilayer structure formed by successively electrodepositing at least two different electrically conductive materials.

Preferably, the movable region includes an aperture formed across the thickness of the insulating substrate and an elastic member disposed in the aperture, the upper surface of the elastic member being exposed through the top opening of the aperture.

Preferably, moreover, the movable region includes a thin-wall portion of an aperture having a stepped structure formed across the thickness of the insulating substrate so that the top side of the insulating substrate is thin-walled, the top opening of the aperture having a square plane shape such that slits extending toward the peripheral edge portion of the insulating substrate are cut individually in the four corners of the square opening so as to reach at least the basal part of the thin-wall portion of the stepped structure, the thin-wall portion having a plane shape analogous to a tongue.

Preferably, furthermore, the movable region includes an aperture having a stepped structure formed across the thickness of the insulating substrate so that the top side of the insulating substrate constitutes a thin-wall portion, the top opening having a square plane shape such that slits extending toward the peripheral edge portion of the insulating substrate are cut individually in the four corners of the square opening so as to reach at least the basal part of the thin-wall portion of the stepped structure, the thin-wall portion having a plane shape analogous to a tongue; and an elastic member disposed in the aperture, the upper surface of the elastic member being exposed through the top opening of the aperture so that the signal conductors are arranged extending up to the upper surface of the elastic member.

According to the present invention, there is provided a method for manufacturing a bump-type contact head, comprising: a step of forming a first resist layer by coating the surface of an electrically conductive sheet and then optically exposing and developing the first resist layer so that the surface of the conductive sheet is exposed in spots corresponding to the positions of bumps to be formed; a step of forming recesses for bump in theexposed surface of the conductive sheet by etching and then removing the first resist layer; a step of forming a second resist layer by coating the exposed surface of the conductive sheet and then optically exposing and developing the second resist layer, thereby exposing the surface of the conductive sheet in plane patterns corresponding to the respective patterns of signal conductors to be formed; a step of electrodepositing a first conductive material in a layer in the recesses for bump and on the plane patterns by electroplating, then additionally electrodepositing at least one conductive material different from the first conductive material on the resulting lamina, and filling up the recesses for bump and the plane patterns with a multilayer structure formed of two or more different conductive materials stacked in layers, thereby collectively forming the bumps and the signal conductors; a step of removing the second resist layer and then bonding the resulting exposed surface to the opening-side surface of an insulating substrate formed with an aperture having an opening in a predetermined shape; and a step of filling up a hollow portion defined by the aperture and the conductive sheet with an elastic member and then removing the conductive sheet by etching, thereby exposing the respective upper surfaces of the bumps and the signal conductors.

According to the present invention, moreover, there is provided a method for manufacturing a bump-type contact head, comprising: a step of forming a thin conductor layer by coating at least one surface of a conductive substrate by electroplating; a step of forming a first resist layer by coating the thin conductor layer and then optically exposing and developing the first resist layer so that the other surface of the thin conductor layer is exposed with the first resist layer left only on expected bump formation spots; a step of forming an electrodeposit layer by electrodepositing an electrically conductive material on the exposed surface of the thin conductor layer by electroplating so that the conductive material is flush with the first resist layer; a step of forming recesses for bump, through which the surface of the thin conductor layer is exposed, in the electrodeposit layer by removing the first resist layer left on the expected bump formation spots; a step of forming a second resist layer by coating the surface of the electrodeposit layer and then optically exposing and developing the second resist layer, thereby exposing the surface of the electrodeposit layer in plane patterns corresponding to the respective patterns of signal conductors to be formed; a step of electrodepositing a first conductive material in a layer in the recesses for bump and on the plane patterns by electroplating, then additionally electrodepositing at least one conductive material different from the first conductive material on the resulting lamina, and filling up the recesses for bump and the plane patterns with a multilayer structure formed of two or more different conductive materials stacked in layers, thereby collectively forming the bumps and the signal conductors; a step of removing the second resist layer and then bonding the resulting exposed surface to the opening-side surface of an insulating substrate formed with an aperture having an opening in a predetermined shape; and a step of filling up a hollow portion defined by the aperture and the electrodeposit layer with an elastic member, then separating the conductive substrate, successively removing the thin conductor layer and the electrodeposit layer by etching, thereby exposing the bumps and the signal conductors.

According to the present invention, furthermore, there is provided a semiconductor component packaging module comprising: a circuit board including an insulating base having bumps on at least one surface thereof, the bumps having a multilayer structure formed by electrodepositing two or more different conductive materials in layers; and a semiconductor component mounted on the circuit board with an adhesive, the semiconductor component having lands mechanically in contact with the bumps.

Preferably, the adhesive used for packaging is a bonding agent that contracts when set.

DETAILED DESCRIPTION OF THE INVENTION

First, circuit boards and a manufacturing method therefor according to the present invention will be described in detail with reference to the accompanying drawings.

Figure 1:
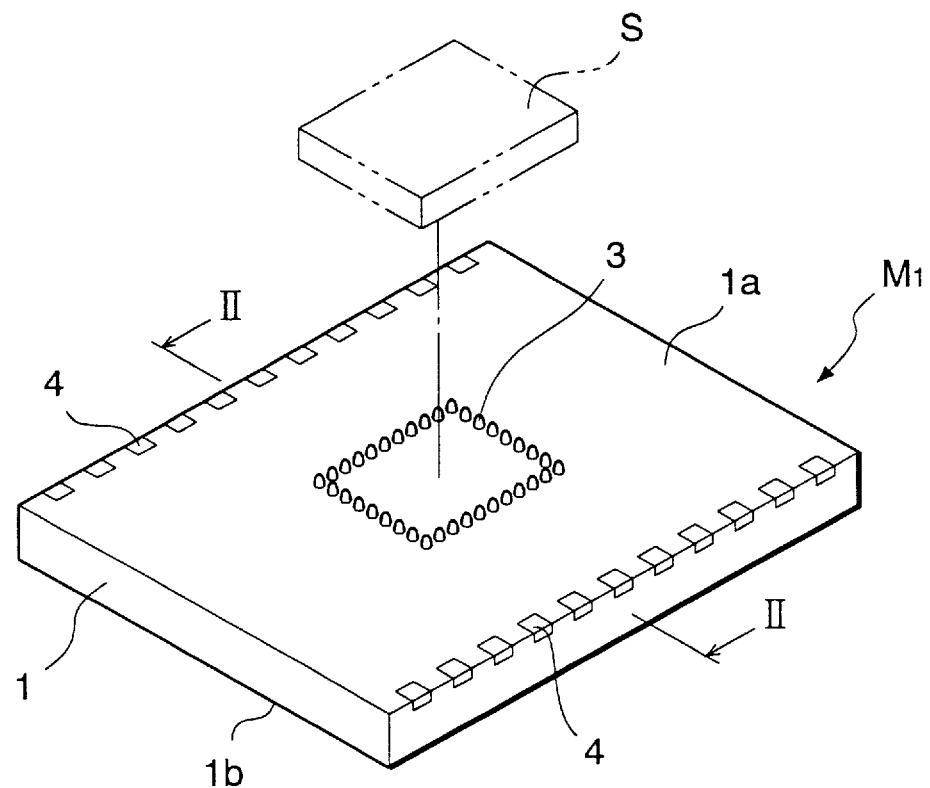
FIG. 1 is a perspective view showing a circuit board $M_1$ according to the present invention.
Figure 2:
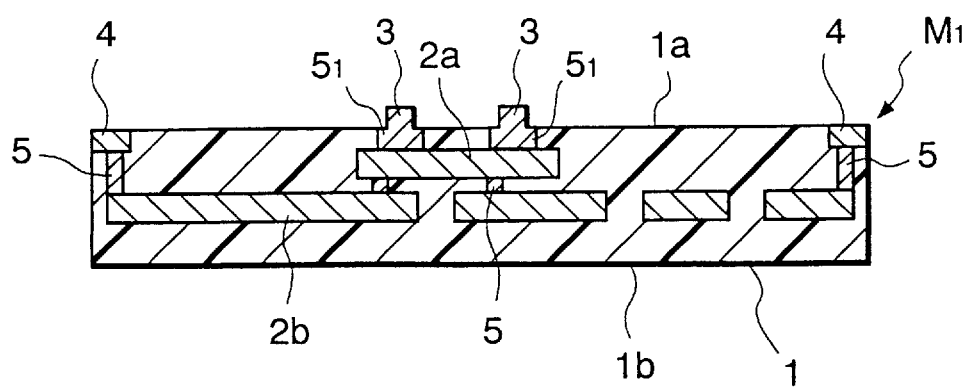
FIG. 2 is a sectional view taken along line II—II of FIG. 1.
Figure 3:
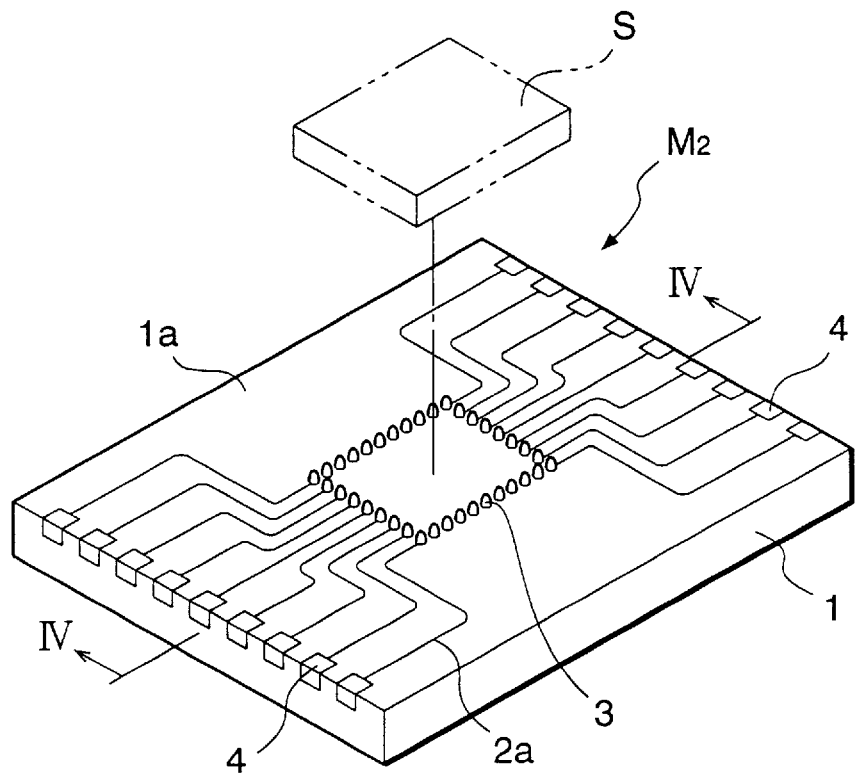
FIG. 3 is a perspective view showing another circuit board $M_2$ according to the invention.
Figure 4:
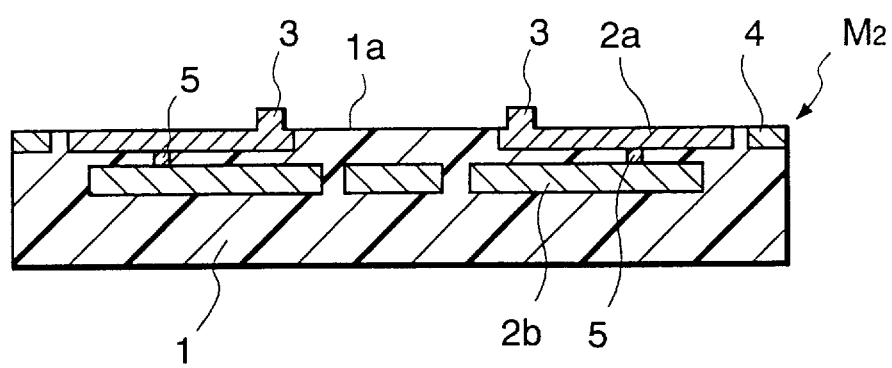
FIG. 4 is a sectional view taken along line IV—IV of FIG. 3.

FIG. 1 and FIG. 2, which is a sectional view taken along line II—II of FIG. 1, show a circuit board $M_1$ according to the invention, and FIG. 3 and FIG. 4, which is a sectional view taken along line IV—IV of FIG. 3, show another circuit board $M_2$ of the invention.

Figure 5:
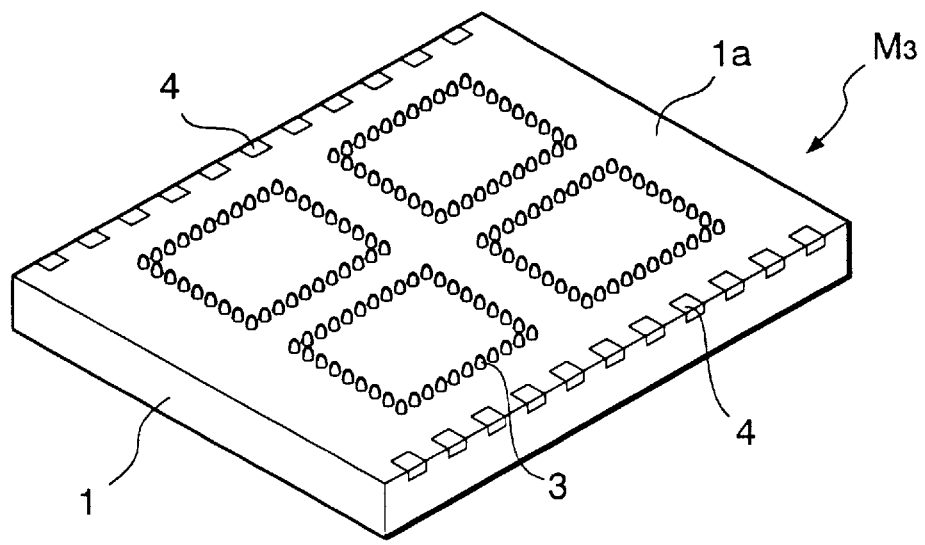
FIG. 5 is a perspective view showing a multi-chip bump board $M_3$ as a modification of the circuit board $M_1$.
Figure 6:
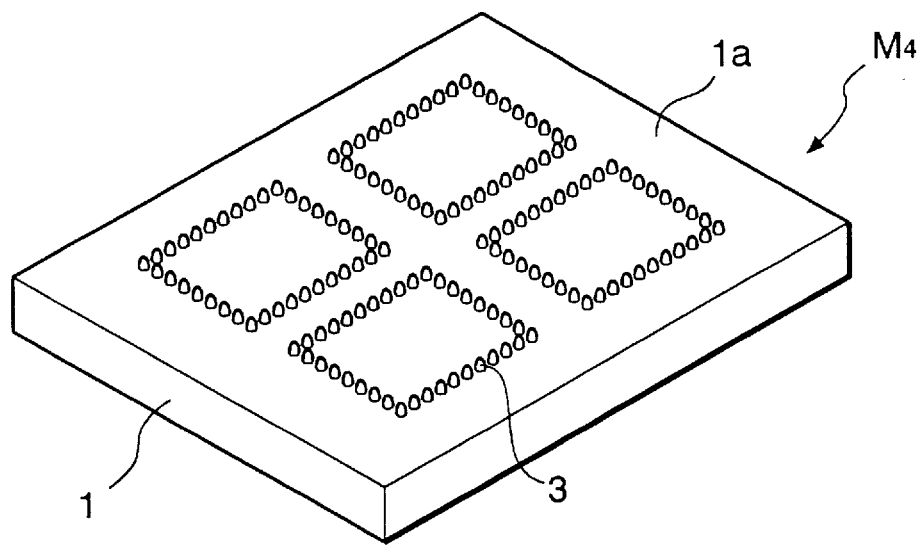
FIG. 6 is a perspective view showing another multi-chip bump board $M_4$ according to the invention.

FIGS. 5 and 6 are perspective views showing further circuit boards (multi-chip bump boards) $M_3$ and $M_4$ according to the invention, respectively.

These circuit boards $M_1$, $M_2$, $M_3$ and $M_4$ have common bumps 3 in a predetermined plane pattern or patterns, projecting from a surface $1a$ of an insulating base 1. In any of the circuit boards $M_1$, $M_2$ and $M_3$, land circuits (or lands) 4 are exposed in the surface $1a$ of the insulating base 1. In the circuit board $M_4$, however, the land circuits are formed within the base 1 without being exposed.

Although conductor circuits (mentioned) are not exposed in the surface $1a$ of the insulating base 1 in the case of the circuit board $M_1$, a conductor circuit $2a$ is exposed in the base surface $1a$ in the case of the circuit board $M_2$.

The respective basic constructions of these circuit boards can be represented by those of the circuit boards $M_1$ and $M_2$. The circuit board (multi-chip bump board) $M_3$ differs from the circuit board $M_1$ only in the number of bump patterns, and can be regarded as a modification of the circuit board $M_1$. The circuit board (multi-chip bump board) $M_4$ can be obtained by arranging the land circuits 4 in a predetermined pattern in the insulating base 1 by a manufacturing method mentioned later.

Based on these circumstances, the circuit boards $M_1$ and $M_2$ will first be described in detail.

In either of the circuit boards $M_1$ and $M_2$, conductor circuits $2a$ and $2b$ in a plurality of layers (two layers as illustrated) are embedded in the insulating base 1, spaced from each other in the thickness direction of the base 1.

In the case of the circuit board $M_1$, the bumps 3 project from the surface $1a$ of the insulating base 1, and the land circuits 4 are exposed. The conductor circuit $2a$ in the top layer on the surface side is not exposed in the surface $1a$, and the bumps 3 and conductor circuit $2a$, the land circuits 4 and conductor circuit $2b$, and the two conductor circuits $2a$ and $2b$ are connected electrically to one another by means of pillar-shaped conductors $5_1$ and 5 (mentioned later), individually.

In this case, first pillar-shaped conductors $5_1$, which constitute a conduction structure for the bumps 3 and conductor circuit $2a$, are larger than the bumps 3 in profile size, on account of conditions for the manufacturing method mentioned later. The other pillar-shaped conductors, however, have a smaller diameter.

In the case of the circuit board $M_2$, on the other hand, the conductor circuit $2a$ in the top layer and the land circuits 4 are exposed in the surface $1a$ of the insulating base 1, and the bumps 3 are formed integrally on the tip of the conductor circuit $2a$.

The circuit board $M_2$ with this construction can be used as a bump-type contact head (mentioned later) according to the present invention, if it is provided with only the conductor circuit $2a$ in the top layer without including a plurality of conductor layers.

As indicated by imaginary lines in FIGS. 1 and 3, a predetermined semiconductor component S is mounted on the bump pattern of each of the circuit boards $M_1$ and $M_2$. If the semiconductor component S is a bare chip, in this case, each of the circuit boards $M_1$ and $M_2$ can be used as a packaging substrate for assembling a semiconductor device package. If the semiconductor component S is a semiconductor device package that is already assembled, on the other hand, each circuit board can be used as a mother board.

Figure 7:
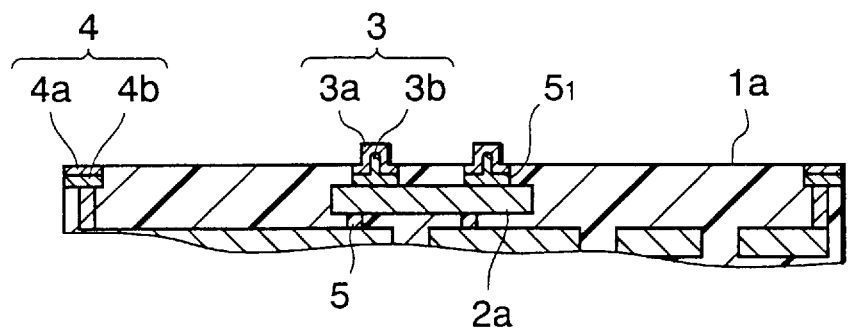
FIG. 7 is a partial sectional view showing a profile of the circuit board $M_1$ near the upper surface thereof.

In the case of the circuit board $M_1$, as shown in FIG. 7, each bump 3 is a multilayer structure (two-layer structure as illustrated) including stacked laminae 3a and 3b that are formed by successively electrodepositing different conductive materials, and each land circuit 4 is also a multilayer structure (two-layer structure as illustrated) including stacked laminae 4a and 4b that are formed by successively electrodepositing different conductive materials. The laminae 3a and 4a, which constitute outer layer portions of each bump 3 and each land circuit 4, respectively, are formed of one and the same conductive material, while the laminae 3b and 4b, which constitute inner layer portions of each bump 3 and each land circuit 4, respectively, are also formed of one and the same conductive material.

In this case, the outer layer portions 3a and 4a are expected to function as barrier layers against an etchant that is used in the manufacturing method mentioned later, so that they are formed of a conductive material that is resistant to corrosion by the etchant. In the case where the etchant used is one that is adapted for the etching of copper, for example, gold, nickel, or nickel-cobalt or other nickel alloy may be used as a suitable conductive material for the outer layer portions 3a and 4a. On the other hand, the inner layer portions 3b and 4b should preferably be formed of copper that is highly electrically conductive.

In the case of each first pillar-shaped conductor $5_1$, which has a profile larger than that of each bump 3, a layer of the conductive material that constitutes the outer layer portion 3a is formed in a stepped structure near the boundary between the conductor $5_1$ and its corresponding bump 3, while the whole remaining portion is formed of the same conductive material as the inner layer portion 3b.

Figure 8:
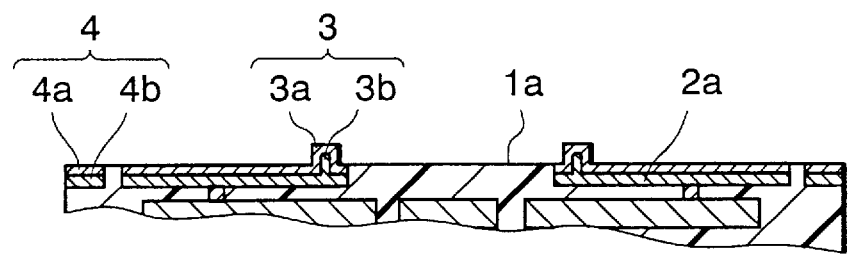
FIG. 8 is a partial sectional view showing a profile of the circuit board $M_2$ near the upper surface thereof.

In the case of the circuit board $M_2$, as shown in FIG. 8, on the other hand, each bump 3 and the conductor circuit 2a that are exposed in the surface 1a of the insulating base 1, like each bump 3 of the circuit board $M_1$, are multilayer structures each composed of the outer and inner layer portions 3a and 3b. Also, each land circuit 4 that is exposed in the surface 1a has its upper surface formed of a layer of the same material as the outer layer portion 3a, and the portion underlying the upper surface is formed of the same material as the inner layer portion 3b.

Although each multilayer structure described above is a two-layer structure, it is not limited to this arrangement, and its outer layer portion may, for example, be a laminar structure formed by electrodepositing different conductive materials in two or more layers. Also in this case, however, the top layer should be formed of a material that is resistant to corrosion by the etchant used in the step described later, as mentioned before.

In these circuit boards $M_1$ and $M_2$, the pillar-shaped conductors $5_1$ and 5 are formed by filling a conductive material into holes that are formed by a method mentioned later. In doing this, the conductive material is electrodeposited by electroplating. Thus, if those holes have the same diameter as the conventional through holes or inner via holes, for example, the current capacity is much larger than in the case of the conventional conduction structure in which a deposit is formed on the wall surfaces of the through holes or inner via holes. In other words, the diameter of the pillar-shaped conductors 5 can be made smaller than in the conventional structure based on the through holes or inner via holes in the case where an attempt is made to secure a necessary current capacity for the activation of the circuit boards.

Accordingly, the aforesaid dead space can be minimized, as compared with the conventional conduction structure including the through holes or inner via holes. Thus, the distribution density of the bumps 3 that can be formed on the surface of the circuit board can be improved, and therefore, high-density packaging of semiconductor components can be effected.

In the circuit boards $M_1$ and $M_2$, the continuity between the conductor circuits is secured by means of the pillar-shaped conductors 5. Accordingly, manufacture of these circuit boards does not require machining such as drilling, which is necessary in forming the through holes or inner via holes that penetrate regions between the conductor circuits. Thus, the plane patterns can be made finer, and high-density packaging of semiconductor components can be effected also for this reason.

The most distinguishing feature of the manufacturing method for circuit boards according to the present invention is that the bumps are formed first and conductor circuits in a plurality of layers are then successively formed under the bumps with the pillar-shaped conductors between them.

Each circuit board of the invention is manufactured by carrying the aforementioned steps A, B, C and D in the order named. In the step A, a member A (mentioned later) is manufactured embedding bumps, first pillar-shaped conductors, and top-layer conductor circuits and/or land circuits in a resist portion. In the step B, a member B(1) or B(2) (mentioned later) is manufactured by attaching an additional conductor circuit and pillar-shaped conductors to the member A. In the step C, an integrated structure C is manufactured by integrating the member B(1) or B(2) with an insulating substrate. Finally, the intended circuit board is manufactured in the step D.

In this case, the circuit board $M_1$ can be manufactured by carrying out the steps $A_1$ to $A_{14}$ that constitute the step A, while the circuit board $M_2$ can be manufactured by executing the steps $A_{15}$ to $A_{18}$ in place of the steps $A_5$ to $A_{14}$, out of the steps $A_1$ to $A_{14}$ of the step A.

The manufacturing method for the circuit board $M_1$ will be described first.

First, the member A is manufactured in the following manner. The individual steps will now be described in succession.

Step $A_1$

Figure 9:
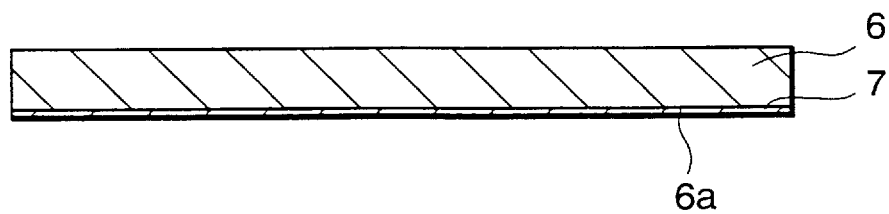
FIG. 9 is a sectional view showing a structure in which a thin conductor layer is formed by coating the surface of a conductive substrate.

As shown in FIG. 9, a thin conductor layer 7 with a thickness of about 2 to 3 $\mu$m is formed on one surface 6a of an electrically conductive substrate 6, such as a stainless-steel plate, by electroplating the surface with, for example, copper in a conventional manner. The conductive substrate may alternatively be a copper plate.

Step $A_2$

Figure 10:
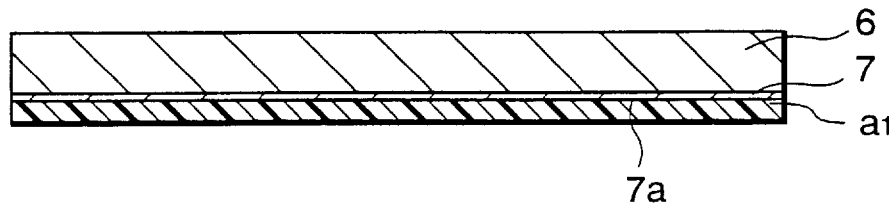
FIG. 10 is a sectional view showing a structure obtained by forming a resist layer $a_1$ on the surface of the thin conductor layer.

Then, a resist layer $a_1$ is formed by coating a surface 7a of the thin conductor layer 7 (FIG. 10). The resist layer $a_1$ is formed, for example, by using a conventional dry film or printing a liquid resist. The thickness of the resist layer $a_1$ is adjusted so as to be substantially equal to the height of bumps to be formed.

Figure 11:
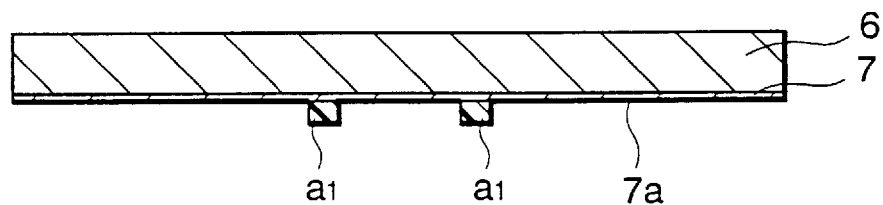
FIG. 11 is a sectional view showing a structure obtained by leaving the resist layer $a_1$, in expected bump formation spots.

The resist layer $a_1$ is optically exposed and developed, and all of it is removed except those portions which correspond to expected bump formation spots. Thereupon, the surface 7a of the thin conductor layer 7 is exposed in the region cleared of the resist layer $a_1$, as shown in FIG. 11.

Step $A_3$

Figure 12:
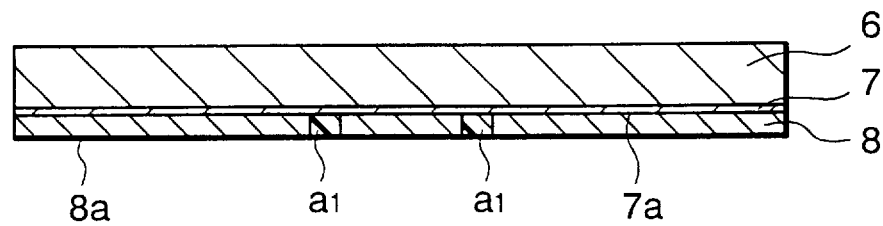
FIG. 12 is a sectional view showing a structure obtained by forming an electrodeposit layer on the surface of the thin conductor layer.

Subsequently, electroplating is carried out with the conductive substrate 6 used as a negative electrode, and an electrodeposit layer 8 is formed by electrodepositing a prescribed conductive material on the exposed surface 7a of the thin conductor layer 7 so that it is flush with the remaining resist layer $a_1$ (FIG. 12).

The conductive material used in this step is not subject to any special restrictions, and may be copper, silver, aluminum, or gold, for example. Usually, copper is preferred.

Step $A_4$

Figure 13:
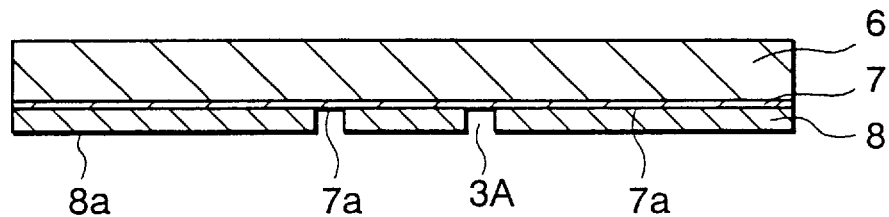
FIG. 13 is a sectional view showing a structure obtained by forming recesses for bump in the electrodeposit layer.

Then, the resist layer $a_1$ remaining in the expected bump formation spots is removed. In consequence, recesses for bump 3A are formed in a predetermined plane pattern in the electrodeposit layer 8 such that the surface 7a of the thin conductor layer 7 is exposed through the recesses, as shown in FIG. 13.

Step $A_5$

Figure 14:
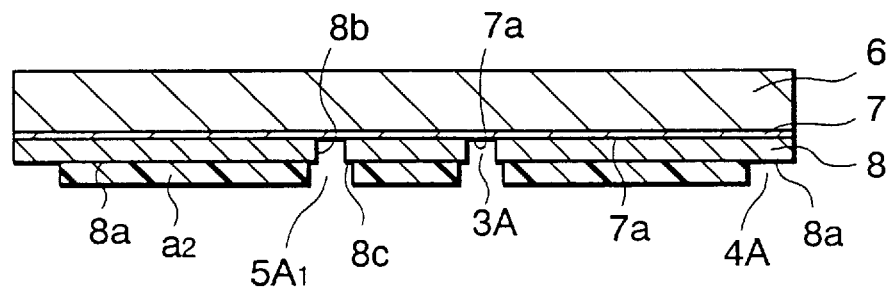
FIG. 14 is a sectional view showing a structure obtained by forming a resist layer $a_2$ with first holes connecting individually with the recesses for bump and plane patterns corresponding to land circuits.

Then, a resist layer $a_2$ is formed on a surface 8a of the electrodeposit layer 8 such that its thickness is substantially equal to the height of first pillar-shaped conductors to be formed, and is optically exposed and developed. Thereupon, first holes $5A_1$, which connect individually with the recesses for bump 3A, and plane patterns 4A, which correspond to the circuit patterns of land circuits to be formed, are formed simultaneously in the resist layer $a_2$, as shown in FIG. 14.

The profile of each first hole $5A_1$ formed in this manner is larger than that of each bump recess 3A. Thus, each first hole $5A_1$ and its corresponding bump recess 3A form one cavity as a whole. The surface 7a of the thin conductor layer 7 and a side wall 8b of the electrodeposit layer 8 are exposed at the bottom of the bump recess 3A, while the surface 8a of the electrodeposit layer 8 is exposed through the plane patterns 4A. Since the profile of each first hole $5A_1$ is larger than that of the bump recess 3A into which it opens, moreover, the cavity that is defined by the recess 3A and the hole $5A_1$ has a stepped configuration, so that a partial surface 8c of the electrodeposit layer 8 is exposed in the first hole $5A_1$ in the boundary region between the two. Usually, a dry film is used in the formation of the resist layer $a_2$ in this step $A_5$, although a liquid resist may be used instead.

If a permanent resist is used to form the resist layer $a_2$ in this step $A_5$, steps $A_7$ and $A_8$ described below need not always be carried out.

Step $A_6$

Subsequently, the whole resulting structure is immersed in a plating bath to be electroplated with the conductive substrate 6 used as the negative electrode.

In this case, the electroplating is carried out at least twice in different plating baths. Specifically, in the case where the electrodeposit layer 8 is formed of copper, a first cycle of electroplating is carried out to electrodeposit layer a corrosion-resistant first conductive material, such as gold, nickel, or nickel-cobalt alloy, that cannot be corroded by the etchant used in an etching process in the step D, which will be mentioned later. In this first electroplating cycle, the first conductive material is electrodeposited in a layer on the exposed surface 7a of the thin conductor layer 7, the side wall 8b of the electrodeposit layer 8, and the partial surface 8c of the electrodeposit layer 8 in the boundary region, in each cavity that is formed of each bump recess 3A and its corresponding first hole $5A_1$. The same electrodeposition also advances in the plane patterns 4A.

After the first electroplating cycle is finished, another cycle of electroplating is carried out. In this second cycle, another conductive material is electrodeposited on the lamina of the first conductive material. The conductive material deposited in this process may be any suitable material, such as copper or aluminum, that enjoys high electrical conductivity.

In this process of electroplating, the first conductive material, which is resistant to corrosion by the etchant used in the step D, is first deposited in a layer in the bump recess 3A, and the second conductive material is further deposited on the layer, in each cavity formed of the bump recess 3A and its corresponding first hole $5A_1$ and in each plane pattern 4A. As a result, the cavity and the plane pattern are filled up with these conductive materials.

Figure 15:
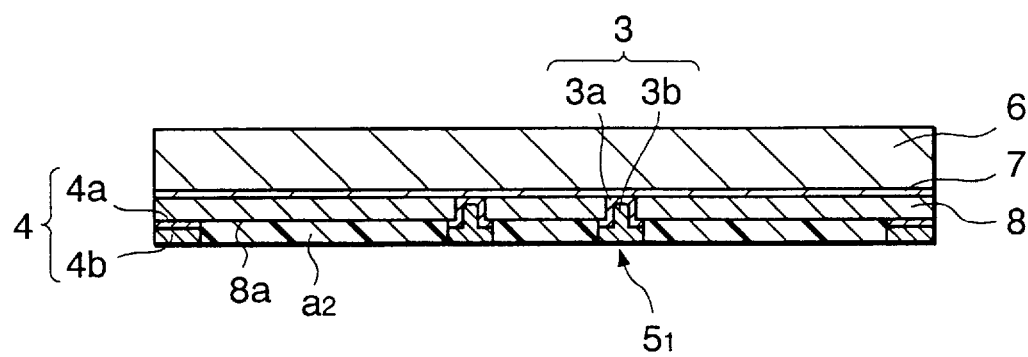
FIG. 15 is a sectional view showing a structure formed having bumps, first pillar-shaped conductors, and land circuits.

When the step $A_6$ is finished, therefore, the bumps 3 are formed in a manner such that each bump recess 3A is filled up with a two-layer structure that is composed of the outer and inner stacked laminae (layer portions) 3a and 3b, as shown in FIG. 15. Also in each plane pattern 4A, a two-layer structure each composed of the outer and inner stacked laminae (layer portions) 4a and 4b, which are formed of the same materials as the laminae 3a and 3b, respectively, is formed as the land circuit 4. Collectively formed in the first holes $5A_1$ are first pillar-shaped conductors $5_1$ as two-layer structures, each including the lamina 3a in the vicinity of the stepped portion and an underlying portion formed of the same material as the lamina 3b.

In this process of electroplating, the profile of each first hole $5A_1$ is larger than that of each bump recess 3A, so that the individual conductive materials are smoothly electrodeposited in the recesses for bump and then in the first holes. If the plating bath is subjected to ultrasonic vibration during the electroplating process, it is allowed to penetrate securely into the first holes $5A_1$ and the recesses for bump 3A, even though these holes and recesses are small-sized, and gas generated during the electroplating process can be quickly removed from the holes $5A_1$ and the recesses 3A. Thus, high-reliability plating can be effected.

The conductive substrate 6, thin conductor layer 7, and electrodeposit layer 8, which have a wide area, constitute a conduction path for the electroplating. Accordingly, a large electric current can be supplied, so that the current density for the electroplating can be increased. In consequence, the recesses for bump 3A, first holes $5A_1$, and plane patterns 4A can be filled up with the conductive materials in a short time.

In this step $A_6$, the cycles of electroplating are not limited to two in number, and the electroplating may be repeated thrice or more, if necessary. Even in this case, however, a corrosion-resistant first conductive material, such as the aforesaid one, must be electrodeposited in a layer in the first electroplating cycle.

Step $A_7$

Figure 16:
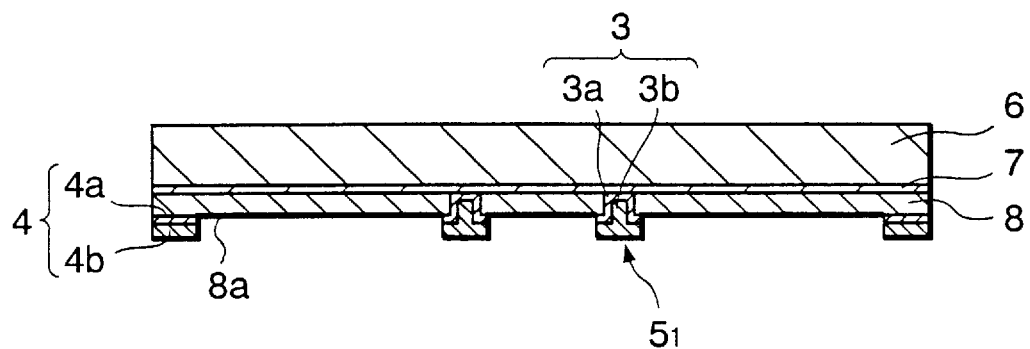
FIG. 16 is a sectional view showing a structure obtained by removing the resist layer $a_2$ to expose the surface of the electrodeposit layer.

When the recesses for bump 3A, first holes $5A_1$, and plane patterns 4A are filled up with the multilayer structures of the conductive materials, that is, when the whole deposit surface becomes flush with the resist layer $a_2$, the electroplating is suspended, and the layer $a_2$ is then removed. As a result, the surface 8a of the electrodeposit layer 8 is exposed, and the bumps 3, each composed of a multilayer structure of a conductive material filling each bump recess, and the first pillar-shaped conductors $5_1$, projecting individually from the bumps, are integrally formed in predetermined portions of the electrodeposit layer 8, as shown in FIG. 16. At the same time, the land circuits 4, each composed of a multilayer structure of a conductive material, is formed.

Step $A_8$

Figure 17:
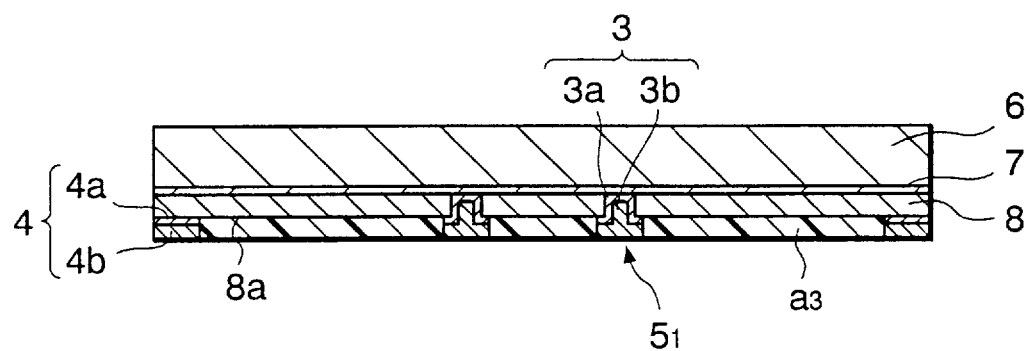
FIG. 17 is a sectional view showing a structure including a resist layer $a_3$ formed by coating the surface of the electrodeposit layer.

Then, the exposed surface 8a of the electrodeposit layer 8 is coated to form a resist layer $a_3$ with a thickness such that the profile of each first pillar-shaped conductor $5_1$ and the surface of each land circuit 4 are exposed, as shown in FIG. 17. More specifically, a liquid resist, for example, is applied to the surface 8a, and optically exposed and developed to form an insulating layer.

Step $A_9$

Figure 18:
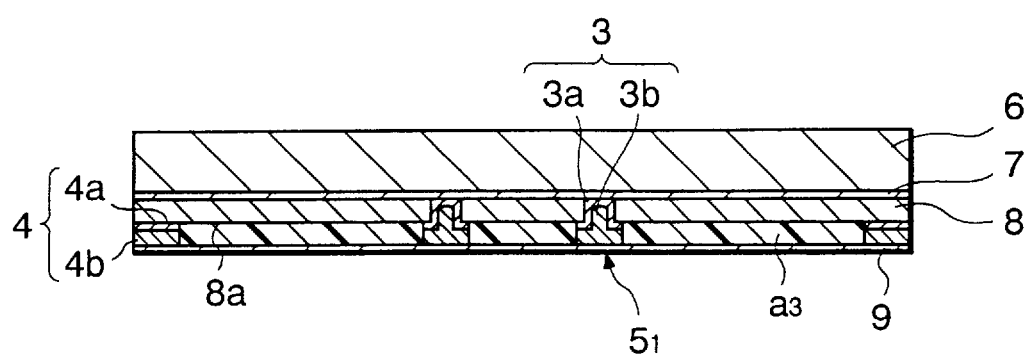
FIG. 18 is a sectional view showing a structure obtained by forming a deposit film on the respective surfaces of the resist layer $a_3$, first pillar-shaped conductors, and land circuits by electroless plating.

After the surface of the resist layer $a_3$ is roughened, it is subjected to electroless plating. Thereupon, the respective surfaces of the resist layer $a_3$, first pillar-shaped conductors $5_1$, and land circuits 4 are coated to form a deposit film 9, as shown in FIG. 18.

Step $A_{10}$

Then, a resist layer $a_4$ substantially as thick as a conductor circuit to be formed is formed by coating the surface of the deposit film 9, and is optically exposed and developed. Thereupon, a plane pattern 2A corresponding to the circuit pattern of the conductor circuit to be formed and plane patterns $5A_1'$ corresponding to pillar-shaped conductors to be connected to the land circuits 4 are formed simultaneously.

Figure 19:
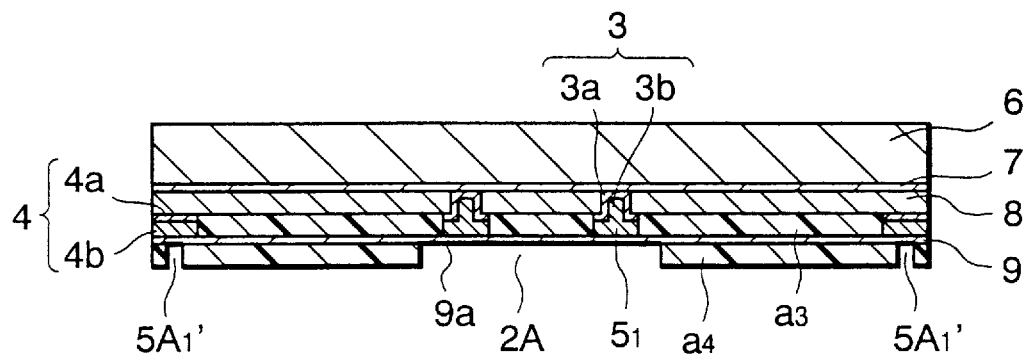
FIG. 19 is a sectional view showing a structure obtained by forming a resist layer $a_4$ on the deposit film of FIG. 18 and then forming the layer $a_4$ with a plane pattern corresponding to a conductor circuit to be formed and holes for pillar-shaped conductors.

As a result, the plane patterns 2A and $5A_1'$ for the conductor circuit and pillar-shaped conductors are formed having predetermined plane shapes on a surface 9a of the deposit film 9, and the film surface 9a is exposed through these plane patterns, as shown in FIG. 19. Either a dry film or liquid resist may be used in forming the resist layer $a_4$ in this step.

Step $A_{11}$

Figure 20:
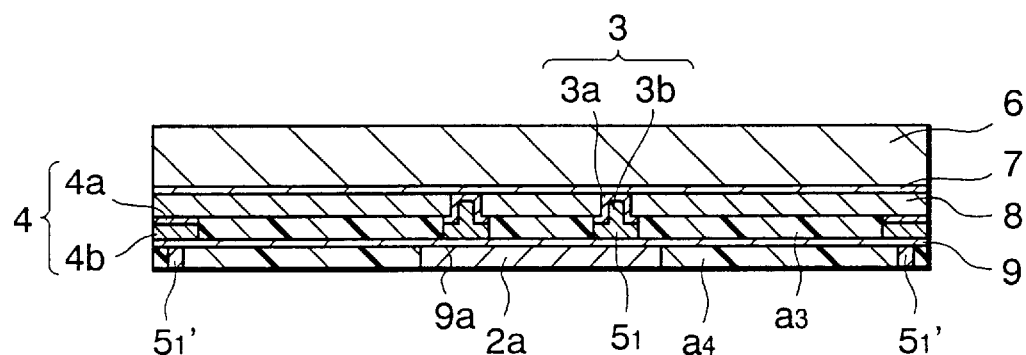
FIG. 20 is a sectional view showing a structure obtained by electroplating the plane pattern and the holes for the pillar-shaped conductors of FIG. 19 with a conductive material.

Subsequently, electroplating is carried out with the conductive substrate 6 used as the negative electrode, and a conductive material, such as copper, that enjoys high electrical conductivity is electrodeposited on the surface 9a of the deposit film 9, which is exposed through the plane patterns 2A and $5A_1'$, so as to be flush with the surface of the resist layer $a_4$, as shown in FIG. 20.

Step $A_{12}$

Figure 21:
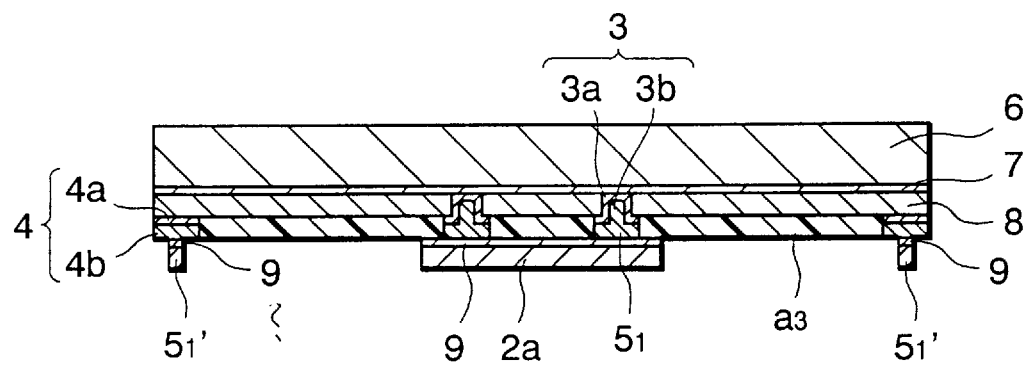
FIG. 21 is a sectional view showing a structure obtained by removing the resist layer $a_4$ and then removing the deposit film to form the conductor circuit and the pillar-shaped conductors on the resist layer $a_3$.

After the resist layer $a_4$ is then removed to expose the surface 9a of the deposit film 9, only the exposed surface is removed by soft etching, for example. As a result, the surface of the resist layer $a_3$ is exposed, and the conductor circuit 2a and the pillar-shaped conductors $5_1'$, which are connected to individually the land circuits 4, are formed on the exposed surface, as shown in FIG. 21.

Step $A_{13}$

Figure 22:
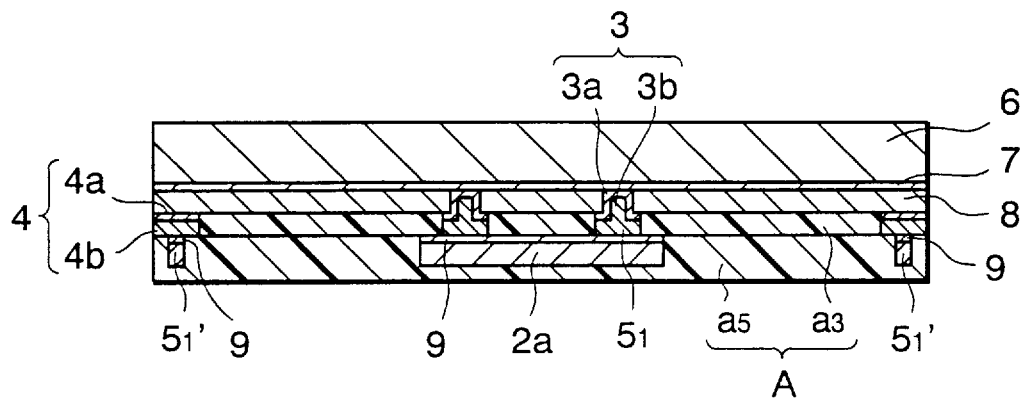
FIG. 22 is a sectional view showing a structure including a resist layer $a_5$ formed by coating the conductor circuit and the pillar-shaped conductors.

Then, the exposed surface of the resist layer $a_3$, the conductor circuit 2a, and the pillar-shaped conductors $5_1'$ are coated entire to form a resist layer $a_5$, as shown in FIG. 22. Although either a dry film or liquid resist may be used in forming the resist layer $a_5$, the liquid resist is preferred.

Thus, the previously formed resist layer $a_3$ and the resist layer $a_5$ are unified to form a resist portion A as an insulating layer, and the conductor circuit 2a and the pillar-shaped conductors $5_1'$ are embedded in the insulating layer. In this case, the thickness of the resist layer $a_5$ in the regions corresponding to the circuit 2a and the conductors $5_1'$ is adjusted so as to be substantially equal to the height of second pillar-shaped conductors (mentioned later) to be formed.

Figure 23:
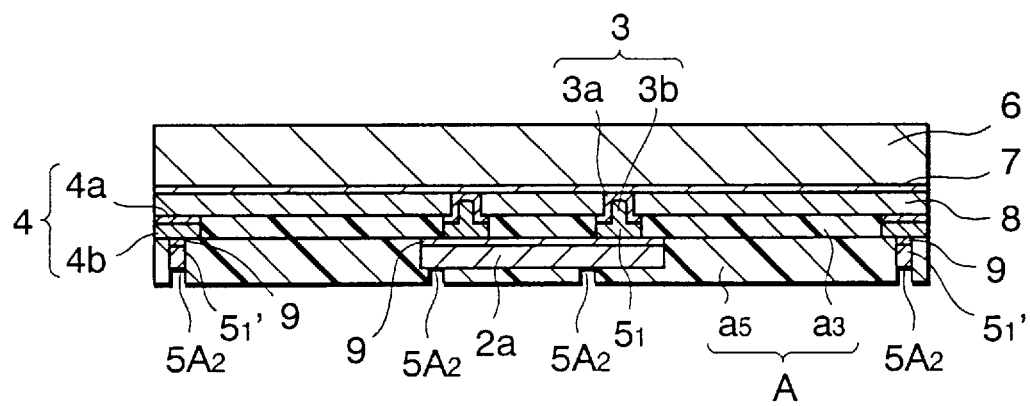
FIG. 23 is a sectional view showing a structure obtained by forming holes in the resist layer $a_5$.

Thereafter, the resist layer $a_5$ is optically exposed and developed to be formed with the conductor circuit 2a and second holes $5A_2$, which connect with the pillar-shaped conductors $5_1'$, as shown in FIG. 23. Thus, the respective end faces of the circuit 2a and the conductors $5_1'$ are exposed through the second holes $5A_2$.

Step $A_{14}$

Finally, electroplating is carried out with the conductive substrate 6 used as the negative electrode, a conductive material is electrodeposited on the respective surfaces of the conductor circuit 2a and the pillar-shaped conductors $5_1'$ that are exposed through the second holes $5A_2$, and the holes $5A_2$ are filled up to form second pillar-shaped conductors $5_2$ whereupon the step A is finished. In this case, the second pillar-shaped conductors $5_2$ which are connected electrically to the land circuits 4, are formed integrally with their corresponding pillar-shaped conductors $5_1'$ that are formed previously.

Figure 24:
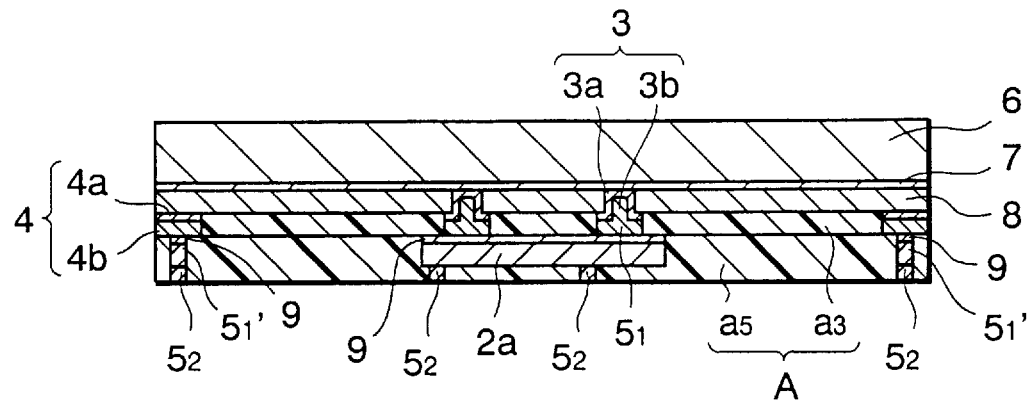
FIG. 24 is a sectional view showing a member A obtained by forming pillar-shaped conductors by filling up the holes of FIG. 23 with a conductive material by electroplating.

When the step A is finished, the bumps 3 are situated in the electrodeposit layer 8, the first pillar-shaped conductors $5_1$, land circuits 4, conductor circuit 2a, and second pillar-shaped conductors $5_2$ are embedded in a resist portion A, and the respective end faces of the pillar-shaped conductors $5_2$ are exposed in a predetermined pattern on the surface of the resist layer $a_5$, as shown in FIG. 24. The member A is manufactured in this manner.

Thus, in this member A, conduction structures are formed individually between the bumps 3, first pillar-shaped conductors $5_1$, deposit film 9, conductor circuit 2a, and second pillar-shaped conductors $5_2$ and between the land circuits 4, deposit film 9, and second pillar-shaped conductors $5_2$.

Then, another additional conductor circuit is attached to the resulting member A by subjecting the member A to the following step B.

In this case, the step B is composed of either the step B(1) or B(2) mentioned before. If the step B(1), which includes steps $B_1$ to $B_4$ (mentioned later), is employed, an intermediate member B(1) for the circuit board $M_1$, in which the two conductor circuits are embedded, as shown in FIGS. 1 and 2, can be manufactured. If the step B(2), which includes steps $B_5$ to $B_{10}$, is employed, on the other hand, an intermediate member B(2) for the circuit board $M_1$ having three or more conductor circuits embedded therein.

The step B(1) will be described first.

Step $B_1$

Figure 25:
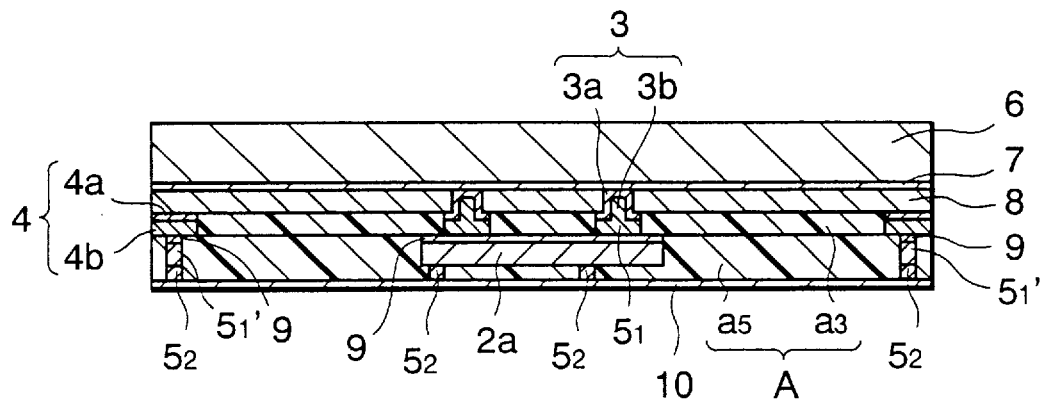
FIG. 25 is a sectional view showing a structure obtained by coating the resist layer $a_5$ and the respective end faces of the pillar-shaped conductors of the member A to form a deposit film thereon by electroless plating.

First, the surface of the resist layer $a_5$ of the member A manufactured in the step A is subjected to electroless plating, whereupon a deposit film 10 is formed covering the whole surface, as shown in FIG. 25.

Step $B_2$

Figure 26:
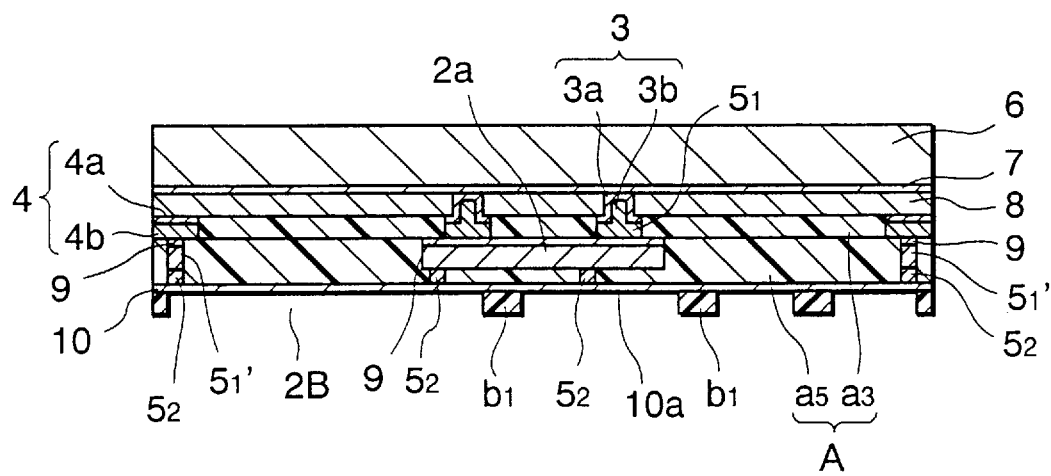
FIG. 26 is a sectional view showing a structure obtained by forming a resist layer $b_1$ on the deposit film and then forming the layer $b_1$ with plane patterns corresponding to conductor circuits to be formed.

Then, a surface 10a of the deposit film 10 is coated to form a resist layer $b_1$, which is optically exposed and developed, whereupon a plane pattern 2B corresponding to the circuit pattern of a conductor circuit to be formed is formed. As a result, the conductor circuit pattern 2B is formed having a predetermined plane shape on the surface 10a of the deposit film 10, and the film surface 10a is exposed through the pattern 2B, as shown in FIG. 26. Either a dry film or liquid resist may be used in forming the resist layer $b_1$ in this case.

Step $B_3$

Figure 27:
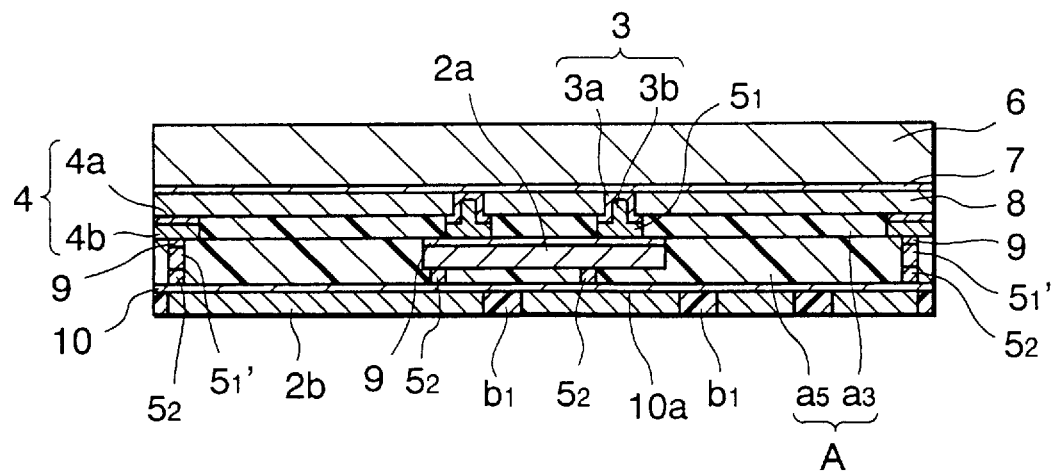
FIG. 27 is a sectional view showing a structure obtained by electroplating the plane patterns of FIG. 26 with a conductive material.

Subsequently, electroplating is carried out with the conductive substrate 6 used as the negative electrode, and a conductive material, such as copper, that enjoys high electrical conductivity is electrodeposited on the exposed surface 10a of the deposit film 10, to a thickness such that it is flush with the resist layer $b_1$. Thereupon, the conductor circuit 2b is formed on the plane pattern 2B, as shown in FIG. 27.

Step $B_4$

Figure 28:
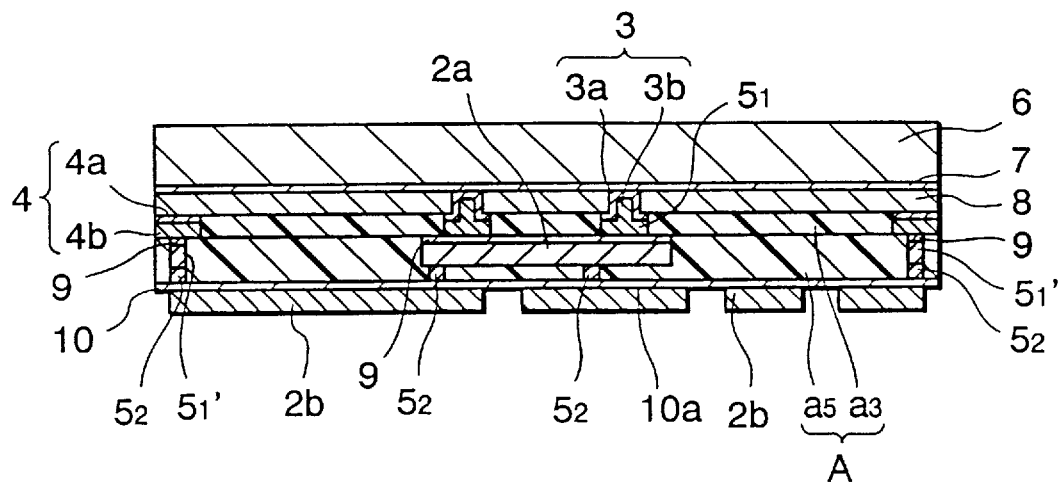
FIG. 28 is a sectional view showing a structure obtained by removing the resist layer $b_1$.

Then, the resist layer $b_1$ is removed. Thereupon, the surface 10a of the deposit film 10 is exposed in the region having so far been occupied by the layer $b_1$, as shown in FIG. 28.

The exposed deposit film 10 is removed by soft etching, for example.

Figure 29:
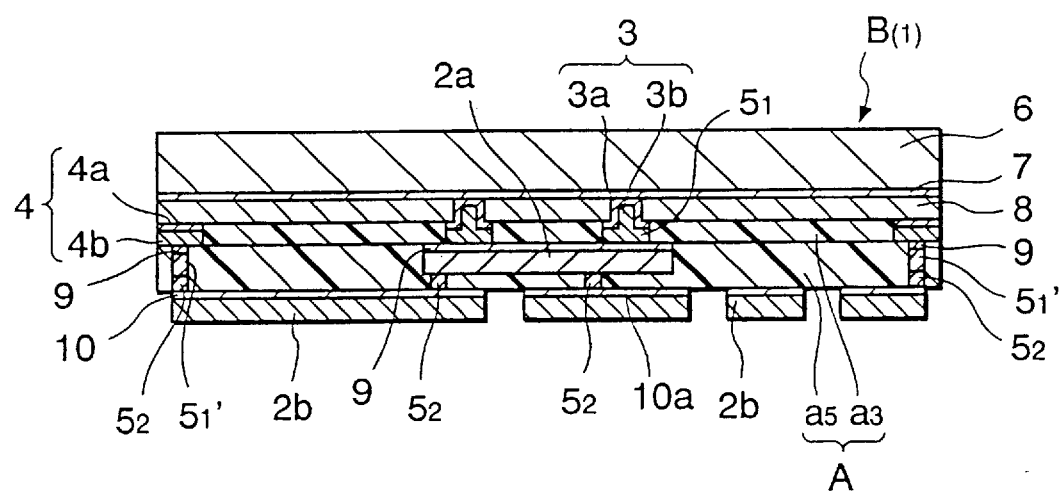
FIG. 29 is a sectional view showing a member B(1) obtained by forming conductor circuits on the resist layer $a_5$.

As a result, the member B(1) is manufactured in which the conductor circuit 2b is formed in a predetermined plane pattern on the surface of the resist layer $a_5$, as shown in FIG. 29. In this member B(1), conduction structures are formed individually between the bumps 3, first pillar-shaped conductors $5_1$ deposit film 9, conductor circuit 2a, second pillar-shaped conductors $5_2$, deposit film 10, and conductor circuit 2b and between the land circuits 4, deposit film 9, second pillar-shaped conductors $5_2$ deposit film 10, and conductor circuit 2b.

If the member B(1) is then subjected to the step C, the resulting circuit board $M_1$ has two conductor circuits embedded therein. More conductor circuits can be embedded by subjecting the member B(1) to the step B(2), which will be described below.

Step $B_5$

Figure 30:
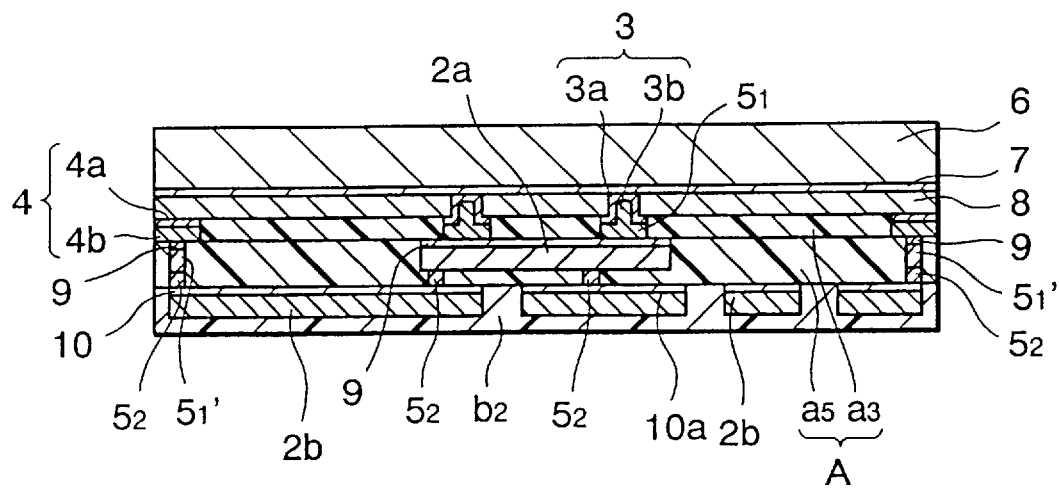
FIG. 30 is a sectional view showing a structure including a resist layer $b_2$ formed by coating the conductor circuits of FIG. 29.

First, the conductor circuit 2b and the resist layer $a_5$ of the member B(1) are coated entire to form a resist layer $b_2$, as shown in FIG. 30. Although the resist layer $b_2$ may be formed using either a dry film or liquid resist, the liquid resist is preferred.

Thus, the resist layers $a_3$ and $a_5$ of the member B(1) and the resist layer $b_2$ are unified to form one insulating layer, and the conductor circuit 2a, land circuits 4, and conductor circuit 2b are embedded in the insulating layer. In this case, the thickness of the resist layer $b_2$ in the region corresponding to the embedded circuit 2b is adjusted so as to be substantially equal to the height of pillar-shaped conductors (mentioned later) to be formed in the next stage.

Figure 31:
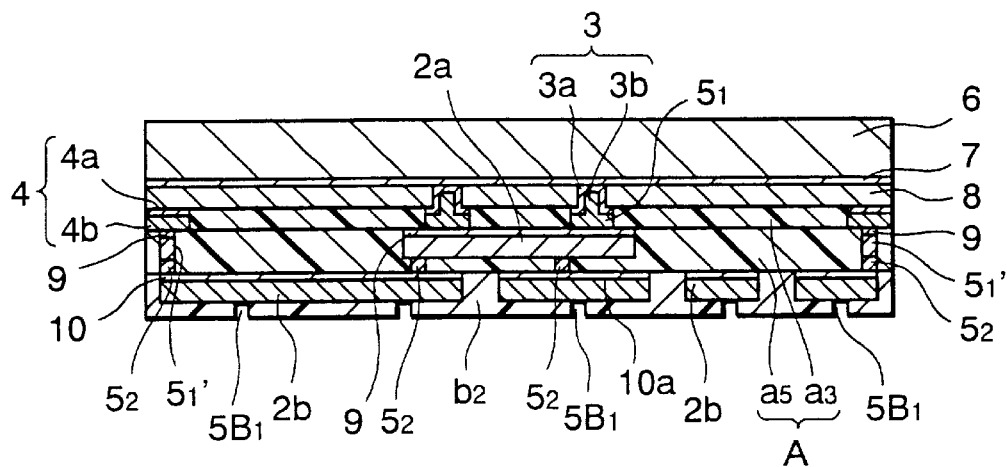
FIG. 31 is a sectional view showing a structure obtained by forming holes for pillar-shaped conductors in the resist layer $b_2$.

Then, the resist layer $b_2$ is optically exposed and developed to be formed with holes $5B_1$ that connect with the conductor circuit 2b, as shown in FIG. 31. Thus, the surface of the circuit 2b is exposed through the holes $5B_1$.

Step $B_6$

Figure 32:
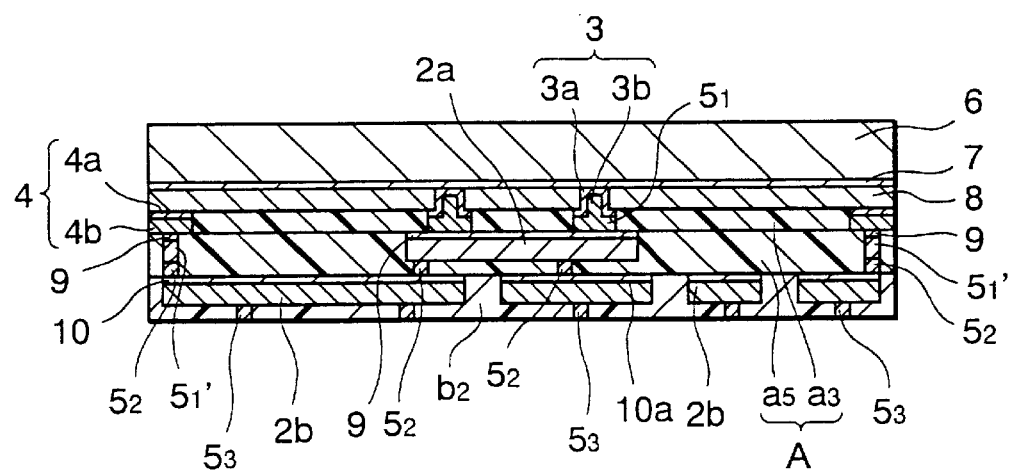
FIG. 32 is a sectional view showing a structure obtained by forming pillar-shaped conductors by filling up the holes of FIG. 31 with a conductive material by electroplating.

Subsequently, electroplating is carried out with the conductive substrate 6 used as the negative electrode, and a conductive material is electrodeposited on the surface of the conductor circuit 2b that is exposed through the holes $5B_1$, whereupon the holes $5B_1$ are filled up with the conductive material. As a result, pillar-shaped conductors $5_3$ integral with the conductor circuit 2b are formed with their respective surfaces exposed from the resist layer $b_2$, as shown in FIG. 32.

Step $B_7$

Figure 33:
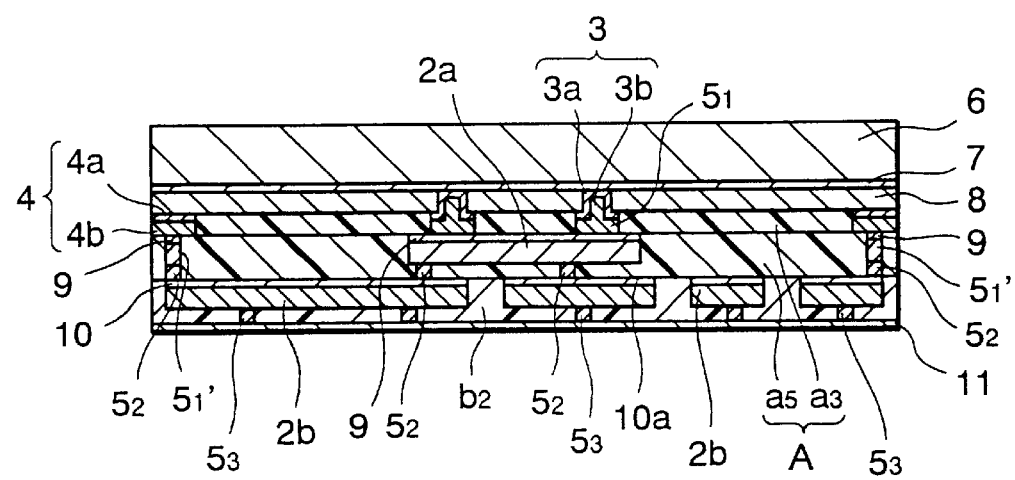
FIG. 33 is a sectional view showing a structure obtained by coating the surface of the resist layer $b_2$ and the respective end faces of the pillar-shaped conductors to form a deposit film thereon by electroless plating.

The whole surface of the resist layer $b_2$ is coated, and a deposit film 11 is formed by electroless plating (FIG. 33).

Step $B_8$

Figure 34:
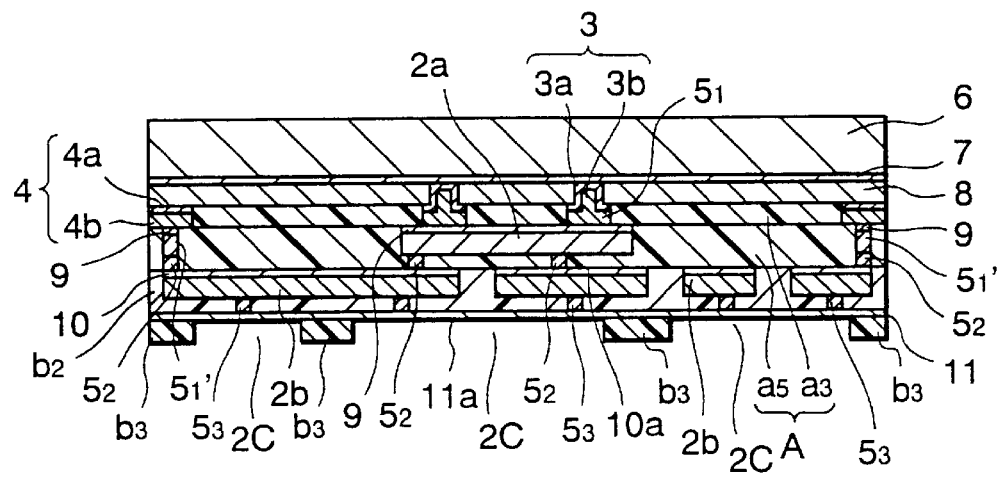
FIG. 34 is a sectional view showing a structure obtained by forming a resist layer $b_3$ on the deposit film of FIG. 33 and then forming the layer $b_3$ with plane patterns corresponding to conductor circuits to be formed.

Then, a surface 11a of the deposit film 11 is coated to form a resist layer $b_3$, which is optically exposed and developed, whereupon a plane pattern 2C corresponding to the circuit pattern of a conductor circuit to be formed under the conductor circuit 2b is formed. As a result, the surface 11a of the deposit film 11 is exposed through the pattern 2B, as shown in FIG. 34. Either a dry film or liquid resist may be used in forming the resist layer $b_3$.

Step $B_9$

Subsequently, electroplating is carried out with the conductive substrate 6 used as the negative electrode, and a conductive material is electrodeposited on the exposed surface 11a of the deposit film 11, to a thickness corresponding to the remaining resist layer $b_3$.

Figure 35:
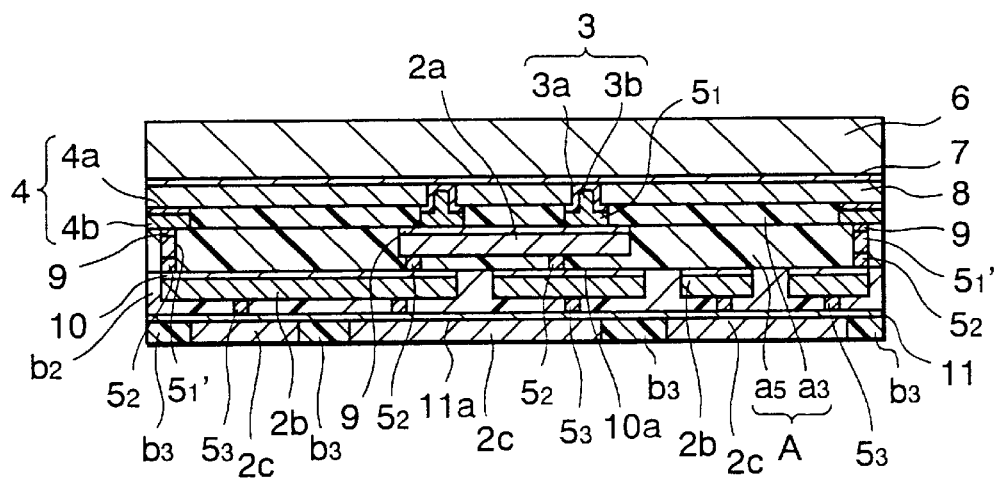
FIG. 35 is a sectional view showing a structure obtained by electroplating the plane patterns of FIG. 34 with a conductive material.

As a result, a conductor circuit 2c is formed in a predetermined plane pattern on the surface 11a of the deposit film 11, as shown in FIG. 35.

Step $B_{10}$

Figure 36:
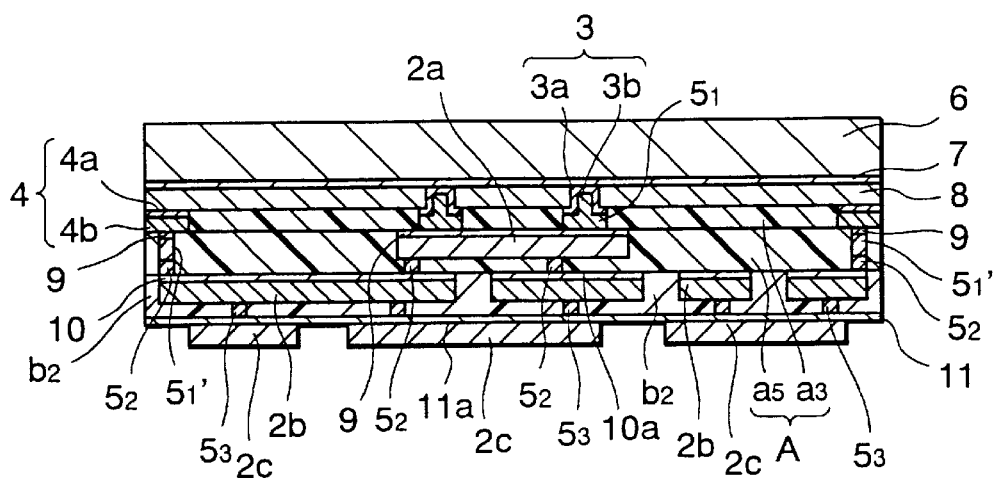
FIG. 36 is a sectional view showing a structure obtained by removing the resist layer $b_3$.

Then, the resist layer $b_3$ is removed. As a result, the surface 11a of the deposit film 11 is exposed in the region corresponding to the removed layer $b_3$, as shown in FIG. 36.

Figure 37:
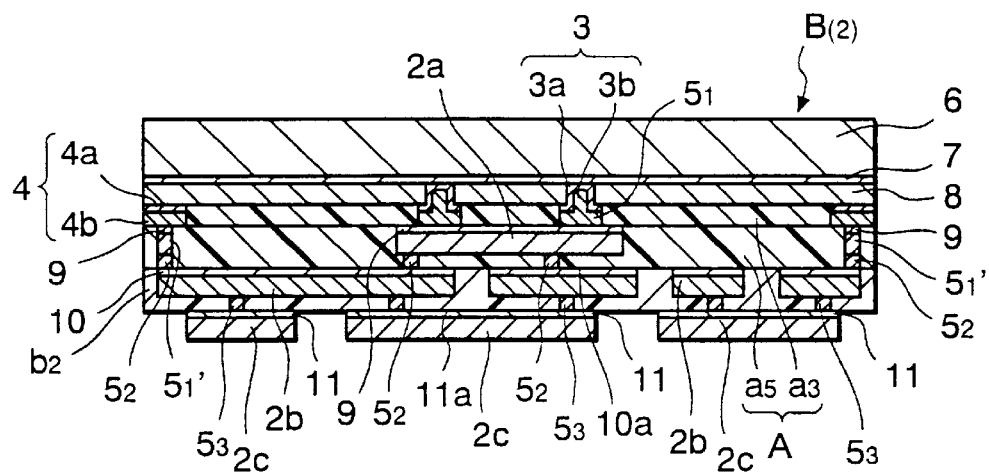
FIG. 37 is a sectional view showing a member B(2) obtained by forming conductor circuits on the resist layer $b_2$.

Then, the exposed deposit film 11 is removed by soft etching, for example. Thereupon, the member B(2) is manufactured in which the conductor circuit 2c is formed in a predetermined plane pattern on the surface of the resist layer $b_2$, as shown in FIG. 37.

In this member B(2), the two conductor circuits 2a and 2b are embedded in the resist layers $a_5$ and $b_2$, respectively, while the conductor circuit 2c is formed on the surface of the resist layer $b_2$.

In this case, the new conductor circuit 2b and the new pillar-shaped conductors $5_3$, which are additionally attached to the member A, are embedded in a resist portion B that is composed of the resist layer $b_2$. Conduction structures are formed individually between the bumps 3, first pillar-shaped conductors $5_1$, deposit film 9, conductor circuit 2a, second pillar-shaped conductors $5_2$ deposit film 10, conductor circuit 2b, pillar-shaped conductors $5_3$, deposit film 11, and conductor circuit 2c and between the land circuits 4, deposit film 9, second pillar-shaped conductors $5_2$ deposit film 10, conductor circuit 2b, pillar-shaped conductors $5_3$, deposit film 11, and conductor circuit 2c.

Additional conductor circuits can be attached to the conductor circuit 2c by repeating the processes described with reference to FIGS. 30 to 37 a desired number of times.

Thus, at the end of the step B, an intermediate member in which a prescribed conductor circuit is formed on the surface of a finally formed resist layer is manufactured in either of the steps B(1) and B(2).

This intermediate member is then subjected to the step C. This step will be described in connection with the case of the member B(1) shown in FIG. 29, for example.

Figure 38:
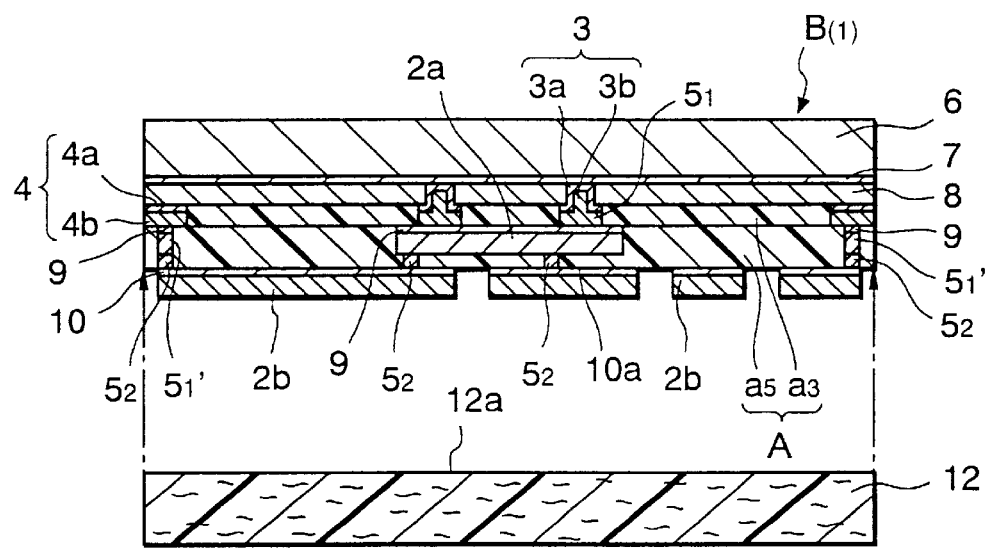
FIG. 38 is a sectional view showing the way the surface of the member B(1) and an insulating substrate are bonded together by thermocompression.
Figure 39:
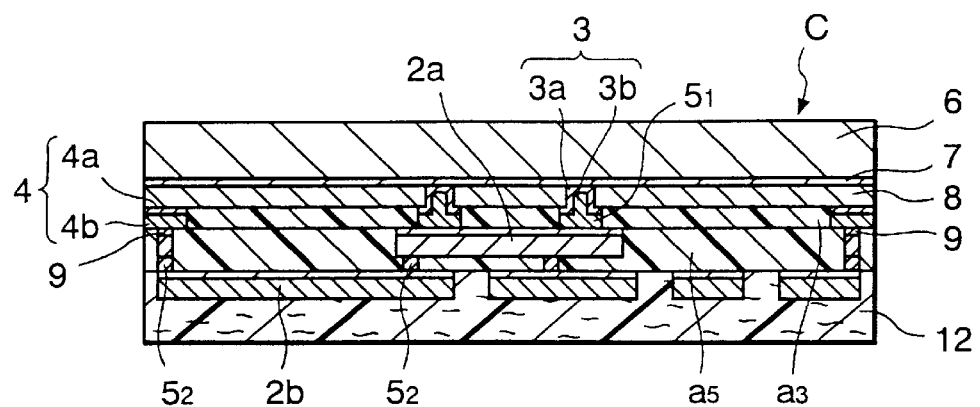
FIG. 39 is a sectional view showing an integrated structure C composed of the member B(1) and the insulating substrate.

An insulating substrate 12 is prepared, and its one surface 12a and that surface of the member B(1) on which the conductor circuit 2b is formed are bonded together by thermocompression, as shown in FIG. 38. Thereupon, the conductor circuit 2b is embedded in the insulating substrate 12, and the integrated structure C, which integrally incorporates the member B(1) and the substrate 12, is manufactured, as shown in FIG. 39.

Preferably, the insulating substrate 12 used in this arrangement should be formed of a material, such as a prepreg, that is semihard at normal temperature and softens when heated. The reason is that since the pattern of the conductor circuit 2b is formed projecting from the surface of the resist layer $a_5$, it can be buried under the upper surface 12a of the plastic insulating substrate 12 when the substrate 12 is contact-bonded to it, and the substrate 12 is thermoset and fixed thereafter.

Even in the case where the insulating substrate 12 is formed of a rigid material, however, the whole pattern of the conductor circuit 2b can be covered by forming a layer of, for example, an uncured epoxy resin on that surface of the member B(1) on which the pattern of the circuit 2b is formed, and the member B(1) and the rigid insulating substrate 12 can be unified by bonding the substrate 12 to the resin layer by thermocompression.

Immediately after the thermocompression bonding, in this case, the layer of the epoxy resin is uncured and soft, so that the pattern of the conductor circuit 2b can be buried therein. At the same time, the resin layer is joined to the upper surface 12a of the insulating substrate 12. As the layer is thermoset, the pattern of the conductor circuit 2b is integrated with the substrate 12 in a manner such that it is buried in the thermoset layer.

The insulating substrate used in this step C may be any electrically insulating substrate, e.g., a glass-epoxy resin substrate, flexible printed board, resin substrate or sheet formed of an epoxy resin, polyimide, polyester, urethane resin, or phenolic resin, ceramic sheet, etc. In consideration of the requirement that the pattern of the conductor circuit 2b be buried after the thermocompression bonding, as mentioned before, the insulating substrate should preferably be formed of a prepreg of a soft glass-epoxy resin. Also, the insulating substrate may be formed having a suitable thickness by stacking a plurality of prepregs in layers, for example.

The integrated structure C manufactured in this manner is then subjected to the step D.

Figure 40:
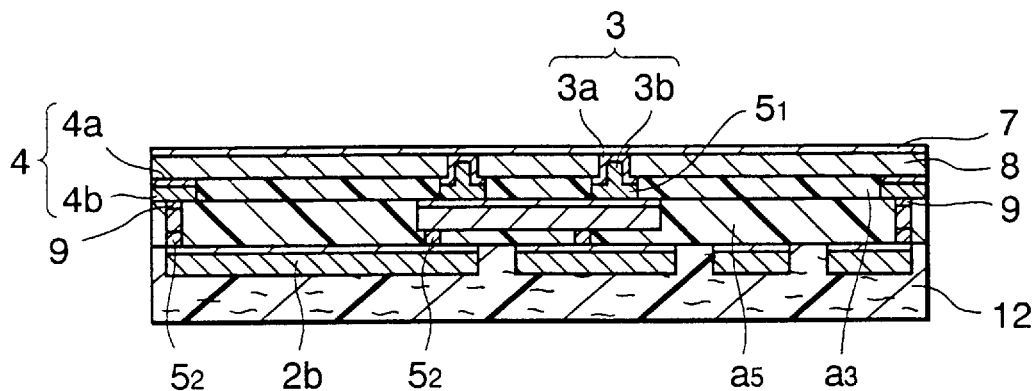
FIG. 40 is a sectional view showing a structure obtained by separating the conductive substrate from the integrated structure C.

In the step D, the conductive substrate 6 is separated first. The surface of the resulting member is covered by the thin conductor layer 7, as shown in FIG. 40.

Figure 41:
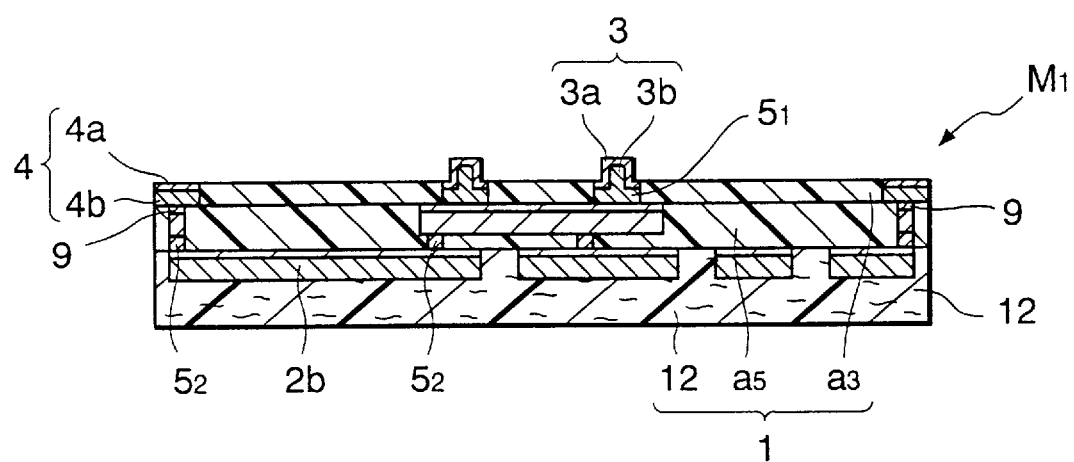
FIG. 41 is a sectional view showing a circuit board $M_1$ according to the invention.

Then, the thin conductor layer 7 and the electrodeposit layer 8 thereunder are successively removed by etching. Thereupon, the circuit board $M_1$ is obtained in which both the conductor circuits 2a and 2b are embedded in the insulating base 1, which is composed of the resist layers $a_3$ and $a_5$ and the insulating substrate 12, the bumps 3 project from the surface of the resist layer $a_3$ only, and the land circuits 4 are exposed, as shown in FIG. 41.

As the thin conductor layer 7 and the electrodeposit layer 8 are removed by etching, the respective surfaces of the bumps 3 and the land circuits 4 come into contact with the etchant. Since the respective outer layer portions 3a and 4a of each bump 3 and each land circuit 4 are formed of the first electrically conductive material that is resistant to corrosion by the etchant, as mentioned before, however, the bumps and the land circuits cannot be corroded by the etchant during the etching process.

Since any of the bumps 3 are multilayer structures that individually fill the recesses for bump of the same depth in the electrodeposit layer 8 having the predetermined thickness, their height is equal to the depth of the recesses for bump and is subject to a very narrow variation.

The following is a description of a manufacturing method for the circuit board $M_2$.

This manufacturing method is the same as the method for the circuit board $M_1$ except for the step A, that is, the other steps B, C and D are carried out in the same manner as aforesaid.

Accordingly, the step A for the manufacture of the circuit board $M_2$ will now be described with reference to the accompanying drawings.

Figure 42:
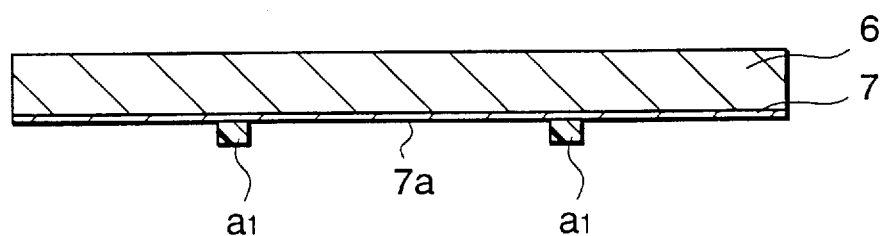
FIG. 42 is a sectional view showing a structure obtained by leaving a resist layer $a_1$ in expected bump formation spots on the deposit film.
Figure 43:
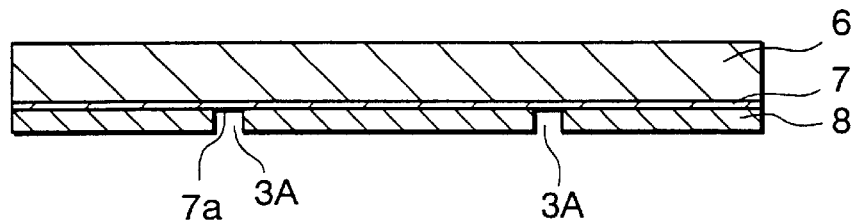
FIG. 43 is a sectional view showing a structure obtained by forming recesses for bump in an electrodeposit layer.

First, the steps $A_1$ to $A_4$ are carried out in the same manner as in the manufacture of the circuit board $M_1$. After the resist layer $a_1$ is left on the expected bump formation spots in the surface 7a of the thin conductor layer 7, as shown in FIG. 42, an electrodeposit layer is formed on the other surface by electroplating, and the resist layer $a_1$ is then removed. Thereupon, the recesses for bump 3A are formed in the electrodeposit layer 8, and the surface 7a of the conductor layer 7 is exposed through the recesses 3A, as shown in FIG. 43.

In this step, either a dry film or liquid resist may be used in forming the resist layer $a_1$.

Thereafter, the member A is manufactured by successively carrying out the following steps $A_{15}$ to $A_{18}$.

Step $A_{15}$

Figure 44:
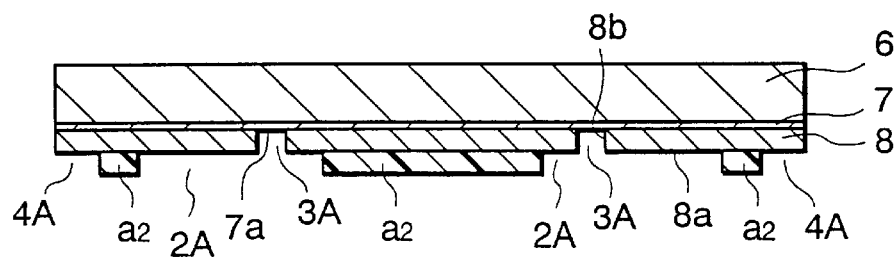
FIG. 44 is a sectional view showing a structure obtained by forming a resist layer $a_2$ with plane patterns for conductor circuits, which connect individually with the recesses for bump, and plane patterns for land circuits.

The resist layer $a_2$ is formed by coating the surface 8a of the electrodeposit layer 8, and is optically exposed and developed. Thereupon, the plane pattern 2A corresponding to the circuit pattern of the conductor circuit to be formed is formed so as to connect with the recesses for bump 3A, and at the same time, the plane patterns 4A corresponding to the circuit patterns of the land circuits to be formed are formed, as shown in FIG. 44.

Usually, a dry film is used in the formation of the resist layer $a_2$ in this step.

Step $A_{16}$

Subsequently, the whole resulting structure is immersed in a plating bath in the same manner as in the step $A_6$ for the manufacture of the circuit board $M_1$, and is electroplated at least twice with the conductive substrate 6 used as the negative electrode, whereupon a multilayer structure of different conductive materials is obtained.

Figure 45:
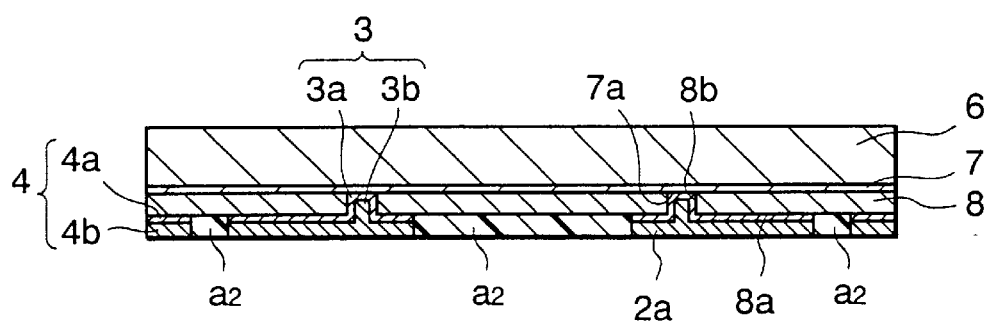
FIG. 45 is a sectional view showing a structure obtained by electroplating the plane patterns of FIG. 44 to form bumps, conductor circuits, and land circuits.

When this electroplating is finished, the plane patterns 4A for the land circuits are filled up individually with the two-layer structures, each including the lamina 4a of a corrosion-resistant conductive material and the lamina 4b of another conductive material, whereupon the land circuits 4 are formed, as shown in FIG. 45.

In the recesses for bump 3A and the plane pattern 2A for the conductor circuit, a corrosion-resistant first conductive material is electrodeposited in a layer on the surface 8a of the electrodeposit layer 8, the side walls 8b of the recesses for bump, and the surface 7a of the thin conductor layer 7, thereby forming the laminae (outer layer portions) 3a, in a first cycle of electroplating. In the next cycle of electroplating, another conductive material is electrodeposited on the laminae 3a to form the laminae (inner layer portions) 3b, whereupon the bumps 3 and the conductor circuit 2a are formed en bloc as a two-layer structure composed of these laminae.

Step $A_{17}$

Figure 46:
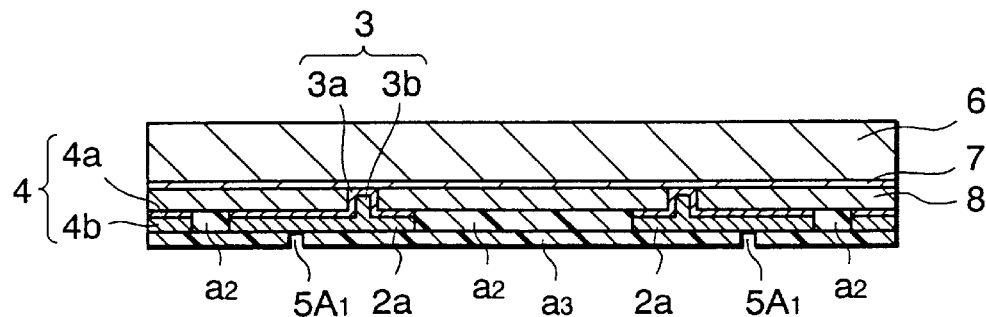
FIG. 46 is a sectional view showing a structure obtained by coating the conductor circuits, land circuits, and resist layer $a_2$ to form a resist layer $a_3$ and then forming the layer $a_3$ with holes for pillar-shaped conductors.

Then, the resist layer $a_3$ is formed by coating the conductor circuit 2a and the land circuits 4, as shown in FIG. 46, and is optically exposed and developed. Thereupon, the first holes $5A_1$, which connect with the conductor circuit 2a (or land circuits 4), are formed in the resist layer $a_3$. Accordingly, the surface of the conductor circuit 2a (or land circuits 4) is exposed through the first holes $5A_1$. The thickness of the resist layer $b_3$ in this state is adjusted so as to be substantially equal to the height of pillar-shaped conductors to be formed, and either a dry film or liquid resist may be used in forming the layer $a_3$.

Step $A_{18}$

Finally, electroplating is carried out with the conductive substrate 6 used as the negative electrode, a conductive material is electrodeposited on the surface of the conductor circuit 2a (or land circuits 4) that are exposed through the first holes $5A_1$, and the holes 5A, are filled up to form the pillar-shaped conductors.

Figure 47:
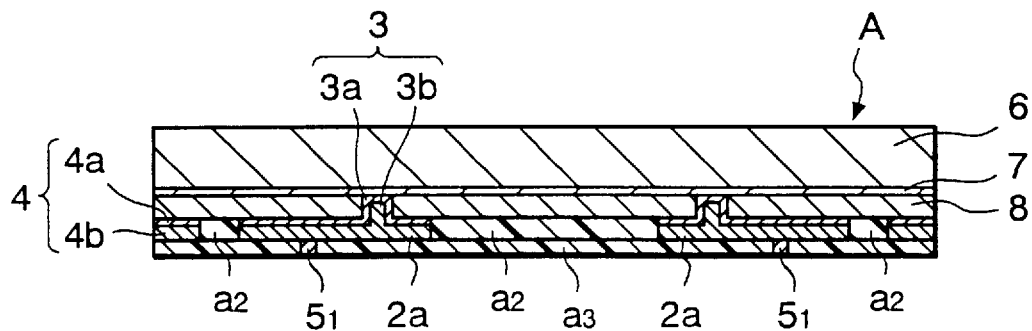
FIG. 47 is a sectional view showing a member A obtained by forming pillar-shaped conductors by filling up the holes of FIG. 46 with a conductive material by electroplating.

As a result, the member A is manufactured in which the respective first pillar-shaped conductors $5_1$ are exposed in a predetermined pattern on the surface of the resist layer $a_3$, as shown in FIG. 47. In this member A, a conduction structure is formed between the bumps 3, conductor circuits 2, and first pillar-shaped conductors $5_1$.

Thereafter, the circuit board $M_2$ (FIG. 3) is manufactured by successively carrying out the aforementioned steps B, C and D. In the circuit board $M_2$, the conductor circuit 2a and the land circuits 4 are exposed in a predetermined plane pattern in the surface of the insulating base, and the bumps 3 project from the tip surface of the conductor circuit 2a.

In manufacturing the circuit board $M_4$ shown in FIG. 6, in which the land circuits are not exposed in the surface 1a of the insulating base 1, the plane patterns 4A that correspond to the circuit patterns of the land circuits are not formed in the step $A_5$ (FIG. 14) for the manufacture of the circuit board $M_1$. Instead, the plane patterns 4A are formed in any of the subsequent steps, e.g., step B, a conductive material is electrodeposit on the patterns to form the land circuits, and the land circuits are embedded in the resist layer so as to be connected to the exposed bump pattern.

Although the manufacture of the circuit boards for single-side packaging has been described above, circuit boards for double-side packaging can be also manufactured in the following manner. The following is a description of a case in which the members B(1) and B(2) obtained during the manufacture of the circuit board $M_1$ are used, for example.

Figure 48:
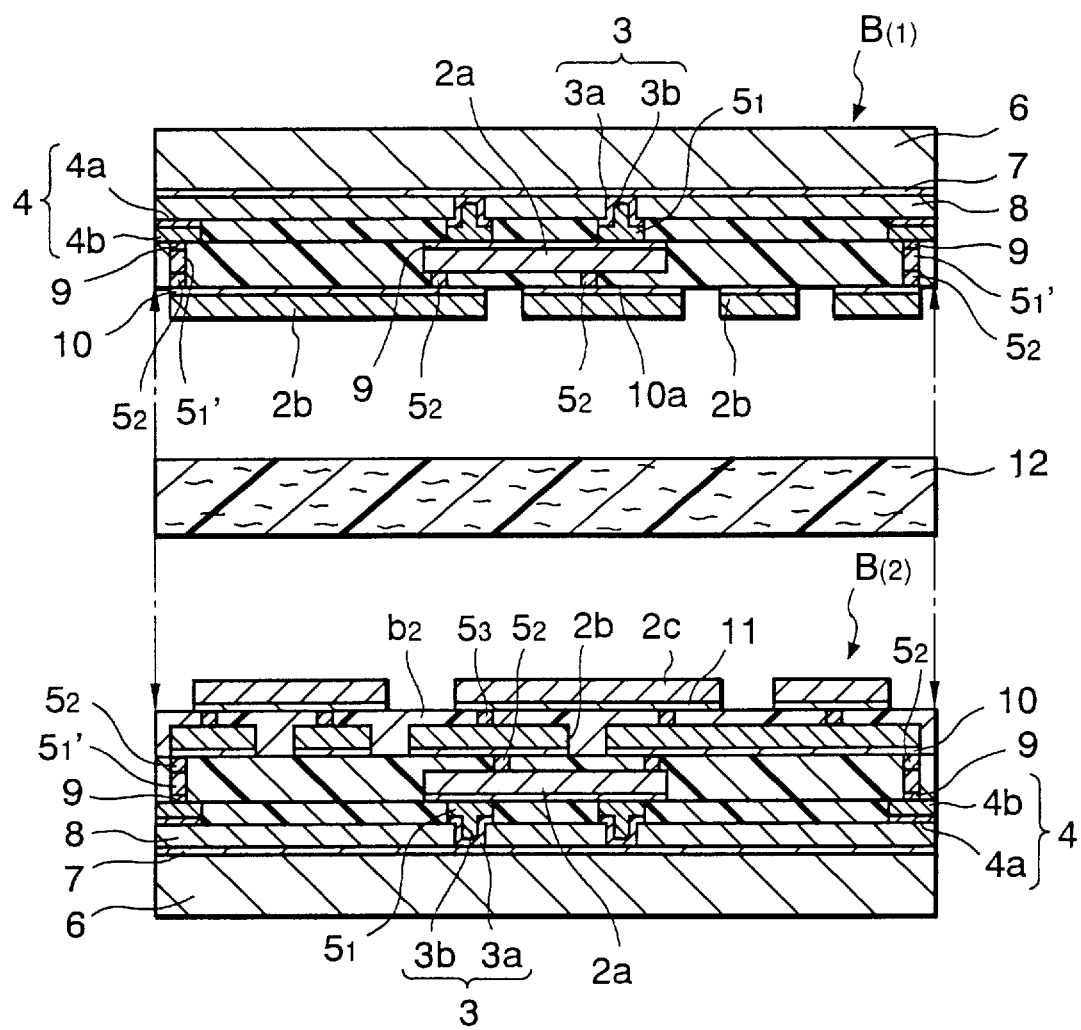
FIG. 48 is a sectional view showing the way the members B(1) and B(2) are bonded to an insulating substrate by thermocompression.
Figure 49:
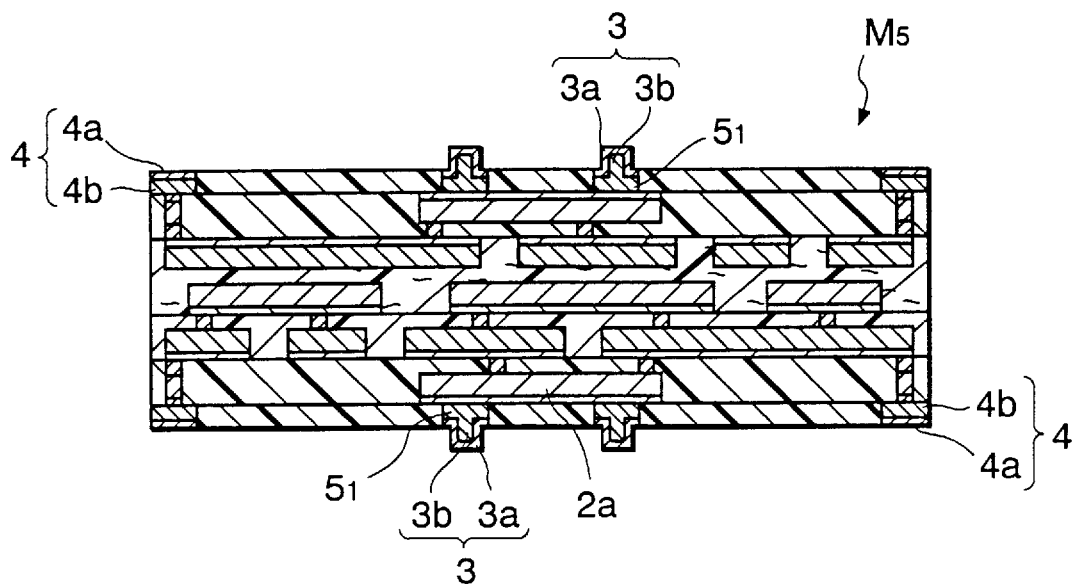
FIG. 49 is a sectional view showing a circuit board $M_5$ for double-side packaging manufactured by a method according to the invention.

First, as shown in FIG. 48, those respective surfaces of the members B(1) and B(2) on the conductor circuit side are bonded individually to their corresponding surfaces of the insulating substrate 12 by thermocompression, whereby the members B(1) and B(2) and the substrate 12 are unified. Then, the conductive substrates on the opposite sides of the integrated structure are separated, and the thin conductor layers and the electrodeposit layers are successively removed by etching. Thereafter, through holes (not shown) are formed in the resulting structure, whereupon a circuit board $M_5$ for double-side packaging is obtained, as shown in FIG. 49.

Also, an intended circuit board for double-side packaging can be obtained by separating the conductive substrate 6 from the member shown in FIG. 39 and successively removing the thin conductor layer 7 and the electrodeposit layer 8 by etching after building up another conductor circuit on the insulating substrate 12 by the conventional subtractive or additive method.

Moreover, a circuit board for double-side packaging can be obtained by successively stacking the predetermined conductor circuit and pillar-shaped conductors on that surface of, for example, the member B(1) which carries the conductor circuit 2b thereon by means a permanent resist, without using the insulating substrate 12 shown in FIG. 48, and finally forming the predetermined conductor circuit and land circuits.

Figure 50:
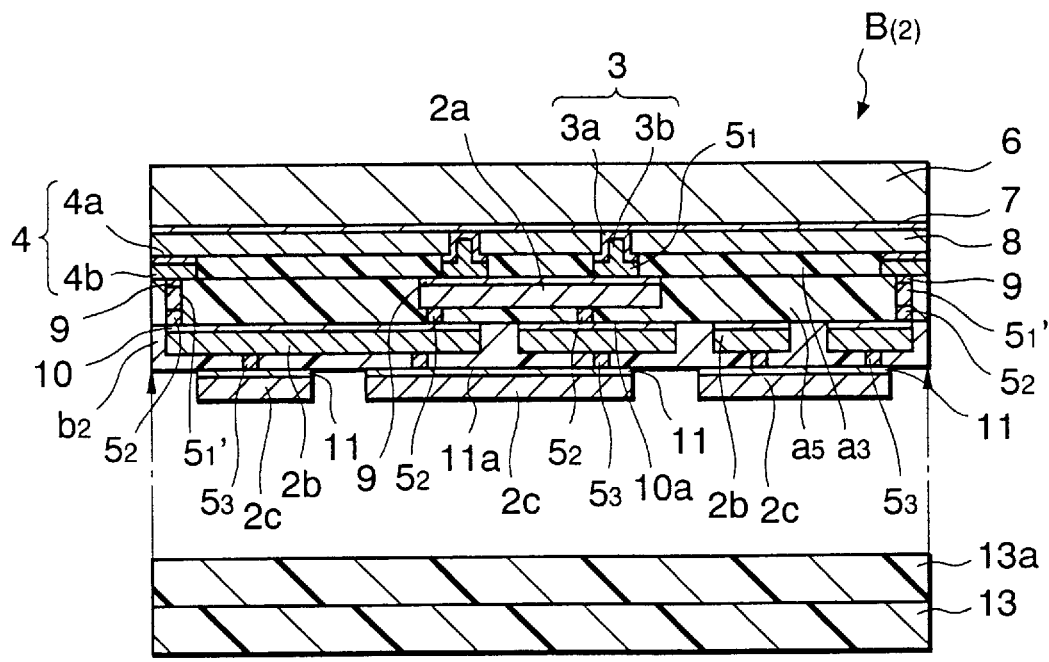
FIG. 50 is a sectional view showing the way a film is sticked on the member B(2) as the circuit board for double-side packaging is manufactured.
Figure 51:
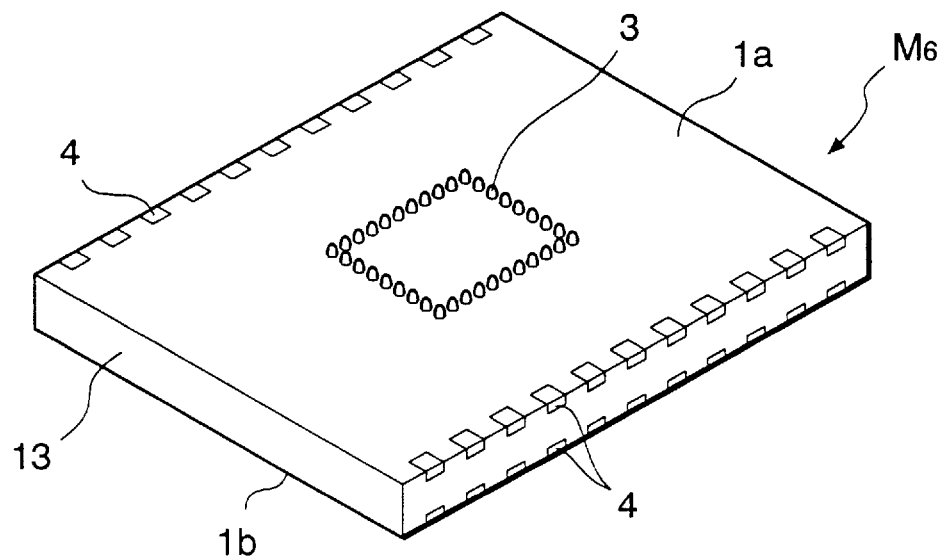
FIG. 51 is a perspective view showing a circuit board $M_6$ for double-side packaging manufactured by using a circuit board according to the invention.

Alternatively, a circuit board for double-side packaging may be manufactured in the following manner. First, a film 13, having an adhesive layer 13a on one side thereof, is sticked on that surface of, for example, the member B(2) which carries the conductor circuit 2c thereon, as shown in FIG. 50. Then, the film 13 and the adhesive layer 13a are subjected to, for example, laser processing or machining to form hole patterns for pillar-shaped conductors in the film. The hole patterns are electroplated to form the pillar-shaped conductors, and the whole resulting structure is subjected to electroless plating. After a predetermined circuit pattern is formed on the surface of the structure by a conventional method, e.g., the subtractive or additive method, a conductive material is electrodeposited by electroplating with the conductive substrate 6 used as the negative electrode, the substrate 6 is separated, and the thin conductor layer 7 and the electrodeposit layer 8 are removed in succession. Thereupon, a circuit board $M_6$ for double-side packaging, which has the land circuits formed in its lower surface 1b, can be obtained, as shown in FIG. 51.

In forming the conductor circuit 2c of the member B(2) shown in FIG. 37, moreover, pillar-shaped conductors may be formed in place of the circuit 2c. In this case, a soft thermosetting resin sheet is hot-pressed on the pillar-shaped conductors so that the conductors penetrate the resin sheet and project on the opposite side. If the pillar-shaped conductors are not made to project, the surface of the resin sheet is polished by machining to expose the respective surfaces of the pillar-shaped conductors. Thereafter, the whole resulting structure is subjected to electroless plating, and a predetermined circuit pattern is then formed by the aforesaid conventional method. The circuit board $M_6$ for double-side packaging may be manufactured in this manner.

Figure 52:
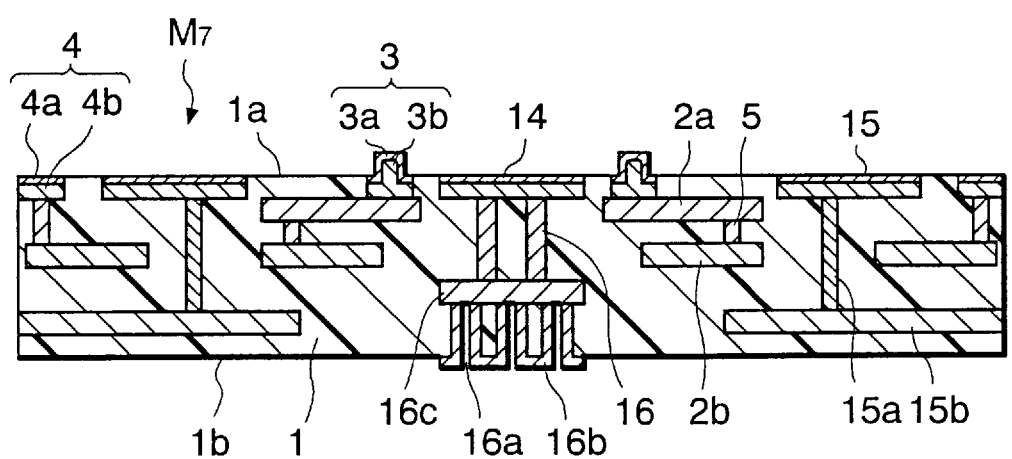
FIG. 52 is a perspective view showing a circuit board $M_7$ according to the invention provided with a heat sink and a heat transfer path.

According to the method of the present invention, furthermore, a circuit board $M_7$ can be obtained in which a heat sink 14 is formed in a position corresponding to the bumps 3 to which the semiconductor component is to be connected, and a pattern of a ground wire circuit 15 is exposed in the surface 1a of the insulating base 1, as shown in FIG. 52.

In the steps shown in FIGS. 14 to 16, for example, the heat sink 14 may formed at the same with the land circuits. As the conductor circuits and pillar-shaped conductors are formed in the subsequent steps, it is necessary only that solid pillars 16 of a conductive material be formed by electroplating, thereby constituting a heat transfer path 16, so that the path 16 is exposed n the other surface 1b of the insulating base 1. In this case, the bumps 3, heat sink 14, and land circuits are simultaneously formed in at least two cycles of electroplating, so that the sink 14 is also a multilayer structure of electrically conductive materials.

In a preferred arrangement shown in FIG. 52, the solid heat transfer path 16 is formed so as to extend halfway, a conductor film portion 16c about 100 μm thick is formed thereafter, and a hole 16a that leads to the film portion 16c is bored through the other surface 1b of the insulating base 1 by machining, for example. Then, a deposit 16b is formed by electroplating the conductive material to a thickness of, e.g., about 10 to 30 μm on the wall surface of the hole 16a. By doing this, the radiating area of the whole structure is increased so that an outstanding heat dissipation effect can be obtained.

In the case of this circuit board $M_7$, heat generated from the semiconductor component when component is die-bonded to the bumps 3, for example, can be dissipated from the surface 1b of the board $M_7$ via the heat sink 14, solid heat transfer path 16, conductor film portion 16c, and deposit 16b.

The ground wire circuit 15 may be formed as a predetermined pattern at the same time with the land circuits 4 in the steps shown in FIGS. 14 to 16. In this case, the wire circuit 15 is also a multilayer structure of electrically conductive materials. As the conductor circuits and pillar-shaped conductors are formed in the subsequent steps, it is necessary only that signal conductors 15a and signal grounds 15b be formed in a predetermined pattern at the same time.

Thus, a measure is taken to counter EMS by providing the ground wire circuit 15 on the surface of the circuit board $M_7$. In the case where the circuit board is a multichip bump board, such as the one shown in FIG. 5, the bumps only project from its surface on the component packaging side, so that a signal conductor circuit need not be formed on the remaining surface portion. Accordingly, the ground wire circuit 15 can be formed over the whole remaining surface portion, thereby providing a measure to counter electromagnetic waves in conjunction with the signal conductors 15a and the signal grounds 15b that are embedded in the insulating base 1.

Presently, multi-chip bump boards are protected against electromagnetic waves by fixing packaged circuit boards to frames or casings. In contrast with this, the measure according to the present invention can reduce the number of assembly processes.

In the circuit boards of the invention arranged in this manner, the bumps projecting from the board surface are each formed as a multilayer structure that is formed in a predetermined position in the electrodeposit layer of a uniform thickness and has a height equal to the thickness of the electrodeposit layer. Therefore, the height of the bumps is subject to a very narrow variation, and the packaging reliability for the connection between the bumps and the semiconductor component is very high.

Moreover, the circuit boards according to the present invention can be manufactured by combining the light exposure and developing processes, which are applied to the manufacture of the conventional circuit boards, and electroless plating or electroplating, without requiring machining operation. Accordingly, the conductor circuits and the conduction structures between them can be made finer, so that the semiconductor component can enjoy high-density packaging. Since the conductor circuits are connected by means of the pillar-shaped conductors, in particular, their current capacity is larger than that of the conventional through hole structure, so that the bump distribution density can be increased, and therefore, high-density packaging of the semiconductor component can be realized. Since the packaged component can be directly in contact with the bumps, moreover, the component packaging can be labor-saving. Since the inner via holes need not be left hollow at all, furthermore, their diameters can be made much smaller (e.g., 30 to 50 μm) than in the conventional case.

In any of the aforesaid cases, electroplating is carried out with the conductive substrate 6 used as the negative electrode, so that all the small holes can be filled up together with the conductive material, and much higher productivity can be ensured than in the case of through hole plating.

The bump-type contact head according to the present invention, which uses the aforementioned circuit boards, and the manufacturing method therefor will now be described in detail with reference to the accompanying drawings.

Figure 53:
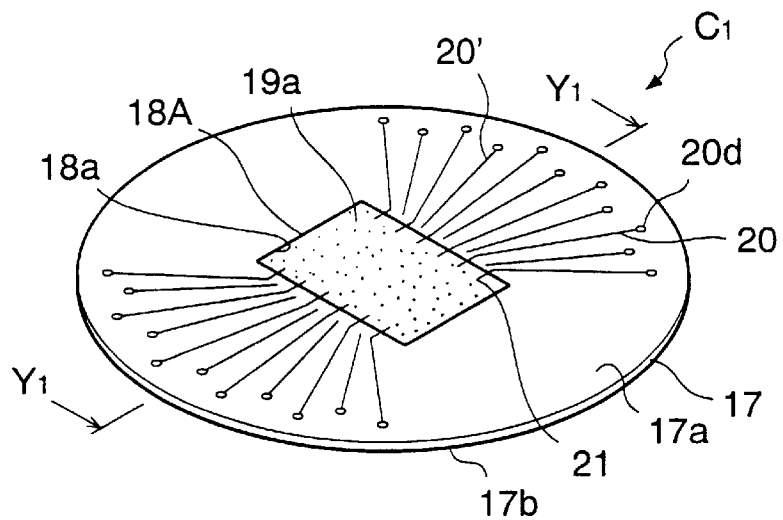
FIG. 53 is a perspective view showing a head $C_1$ according to the invention.
Figure 54:
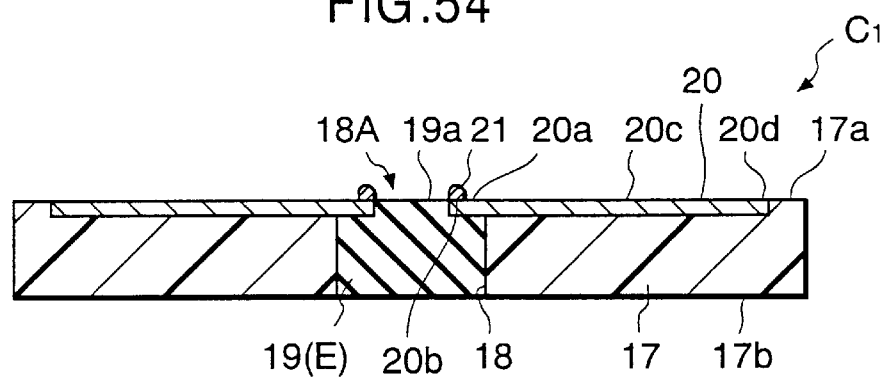
FIG. 54 is a sectional view taken along line $Y_1$—$Y_1$ of FIG. 53.

FIG. 53 is a perspective view showing an example $C_1$ of the head according to the invention, and FIG. 54 is a sectional view taken along line $Y_1—Y_1$ of FIG. 53.

In the case of this head $C_1$, an aperture 18 is formed penetrating a predetermined portion (central portion as illustrated) of a disk-shaped insulating substrate 17 from an upper surface 17a thereof to a lower surface 17b. A top opening 18A having a suitable shape (square as illustrated) is formed at the top of the hole 18. The aperture 18 is filled up with an elastic member 19, of which an upper surface 19a is flush with the upper surface 17a of the insulating substrate 17.

If a predetermined upward force is applied to the elastic member 19, therefore, the member 19 is deformed so that its upper surface 19a bulges upward. When the upward force is removed, the upper surface 19a of the elastic member 19 is restored to its original position, where it is flush with the upper surface 17a of the insulating substrate 17.

Thus, at least the upper surface 19a of the elastic member 19 functions as a movable region E that can move up and down.

Signal conductors 20 having a given width and length and ground wires 20' are arranged at predetermined pitches on the upper surface 17a of the insulating substrate 17. The ground wires 20' serve to reduce the generation of noises when high frequency is applied to the signal conductors 20. The conductors 20 extends for a given length from the upper surface 17a of the insulating substrate 17 to the upper surface 19a of the elastic member 19. A bump 21 with a given height protrudes from an upper tip surface 20b of an extending portion 20a of each signal conductor 20.

In this head $C_1$, as shown in FIG. 54, each signal conductor 20 is arranged so that the whole body thereof except its upper surface 20c is buried in the insulating substrate 17 and the elastic member 19, and only the upper surface 20c is exposed so as to be flush with the respective upper surfaces 17a and 19a of the substrate 17 and the member 19. An end portion 20d at the other end of each signal conductor 20 is connected, as a terminal of the conductor 20, to a terminal of a signal processor (not shown).

The respective extending portions 20a of the signal conductors 20 are arranged extending parallel to one another for about 2 to 3 mm on the upper surface 19a of the elastic member 19. On the upper surface 17a of the insulating substrate 17, the signal conductors 20 are arranged substantially radially lest they extend parallel to one another. With this wire arrangement, patterns (lines) to form the ground wires 20' can be provided between the signal conductors 20 on the upper surface 17a of the insulating substrate 17. As a result, the parallel extending portions 20a of the signal conductors in the movable region E can be shortened to the length of about 2 to 3 mm. If input and output signals for inspection are high-frequency signals, therefore, errors in the resulting inspection signals are much smaller than in the case of the conventional head that uses the L-shaped needles, so that the head can enjoy better high-frequency characteristics.

When the upper surface 19a of the elastic member 19 is caused to bulge upward, the respective extending portions 20a of the signal conductors 20 on the upper surface 19a of the elastic member 19 and the bumps 21 on the respective upper tip surfaces 20b of the conductors 20 move up. The bumps 21 serve as connecting terminals that come into contact with predetermined inspection spots and can fetch detection signals from the spots. When the upward force on the elastic member 19 is removed, the upper surface of the member 19 is restored to its original position, whereupon the bumps move downward and leave the inspection spots.

In the case of the head $C_1$, the bumps 21 arranged on the upper surface 19a of the elastic member 19 enjoy a high degree of freedom such that they can independently move up and down without interfering with one another.

Figure 55:
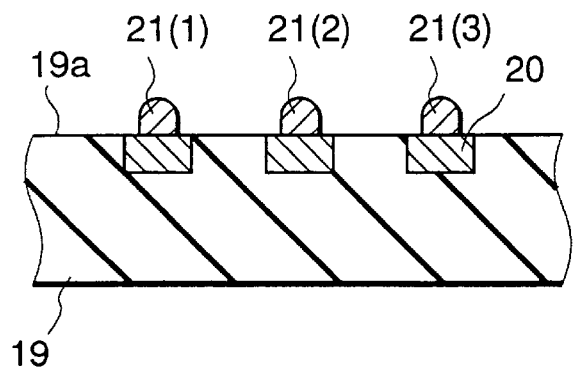
FIG. 55 is a partial sectional view showing an arrangement of bumps on the upper surface of an elastic member.

If a bump 21(2) moves up and down as indicated by the arrow in FIG. 55, for example, the influence of its up-and-down motion on the surroundings is absorbed by the elastic member 19, and the propagation of the motion to adjacent bumps 21(1) and 21(3) is retarded considerably. Even though the bump 21(2) moves up and down, therefore, the bumps 21(1) and 21(3) cannot easily move accompanying it.

This implies that the individual bumps can freely independently move up and down, absorbing variation, if any, of the inspection spots in height, and moreover, can move without exerting any bad influence on the functions of their adjacent bumps, so that the performance of the head is improved.

In actual operation, the head $C_1$ is located in a predetermined position on a wiring circuit as an object of inspection. As the elastic member 19 is elastically pushed up to bulge by lift means, which will be mentioned later, the bumps 21 are brought individually into contact with the inspection spots. After the inspection is finished, the elastic member 19 is restored to its original state, whereupon the bumps 21 are disengaged from the inspection spots.

The lift means may be previously located under the elastic member 19 so that the upward force acts on the member 19. In this case, the head is manufactured with the bumps 21 raised at a given height above the top opening 18A of the aperture 18 so that it can be set directly in a measuring device in actual use.

Figure 56:
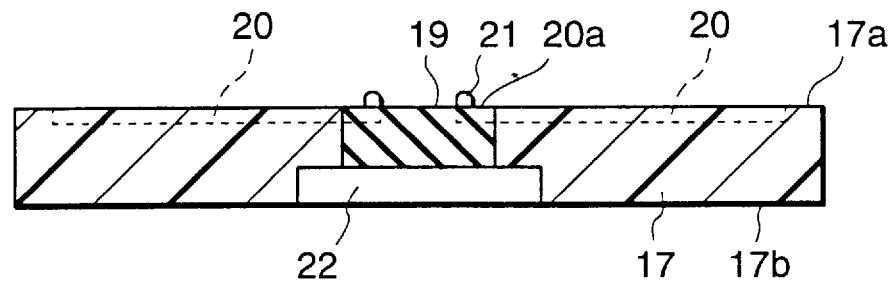
FIG. 56 is a sectional view showing the head $C_1$ provided with lift means (sealed air chamber)

A sealed air chamber 22 formed under the elastic member 19, as shown in FIG. 56, can be used as the lift means. More specifically, a sealed space of a given volume is secured in the lower part of the insulating substrate 17. In this case, compressed air may be forced directly into the space or a balloon that is set in the space.

As the sealed air chamber 22 is pressurized, the elastic member 19 is deformed to bulge upward by its own elasticity, so that the extending portions 20a of the signal conductors 20 and the bumps 21 move upward. Normally, the bumps 21 are designed so as to be able to move up for about 200 to 300 µm. When the air chamber 22 is depressurized, the elastic member 19 is restored to its original state by its own elasticity, whereupon the bumps 21 are disengaged from the inspection spots.

Figure 57:
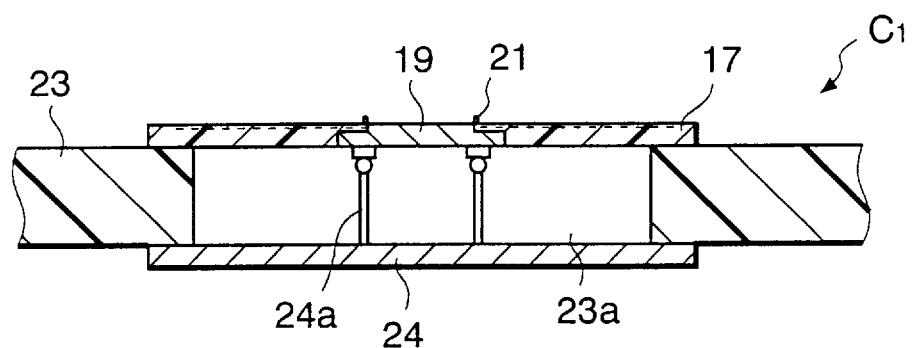
FIG. 57 is a sectional view showing the head $C_1$, provided with another lift means.

FIG. 57 is a sectional view showing another lift means.

In this case, the head $C_1$ shown in FIG. 53 is located over an aperture 23a of a mother board 23, the aperture 23a having a given diameter. The other end of each signal conductor 20 is connected to a terminal of a circuit on the mother board 23.

Fixed under the aperture 23a is a lift jig 24 having a large number of lift pins 24a, which stand together in contact with the lower surface of the elastic member 19. The pins 24a cause the member 19 to bulge upward for about 200 to 300 µm. Preferably, the lift pins 24a are arranged so that they can collectively push up the bumps that are arranged at predetermined pitches on the upper surface of the elastic member 19.

When the lift means is actuated, the upper surface 19a of the elastic member 19 moves up and down, whereupon the respective extending portions 20a of the signal conductors 20 buried under the surface 19a bend vertically around the boundary between the elastic member 19 and the insulating substrate 17, that is, around points on an edge portion 18a of the insulating substrate that form the four sides of the top opening 18A of the aperture 18. Thereupon, the extending portions 20a of the signal conductors 20 embedded in the elastic member 19 are subjected to a force such that they are separated from the member 19.

In the case of the head $C_1$, however, the whole body of each signal conductor 20 except the upper surface 20c is embedded in the insulating substrate and the elastic member. If each conductor 20 is urged to bend, therefore, the three other surfaces of its extending portion 20a, which are secured by the elastic member 19, can be positively restrained from being separated from the member 19.

In actually using the heads constructed according to the present invention, including the head $C_1$, therefore, it is advisable to embed the signal conductors 20 in the insulating substrate and the elastic member.

Further, this embedding of the signal conductors 20 can produce the following effect.

Normally, the ambient temperature for the head $C_1$ in actual use ranges from 70° to 80° C. In the process of actual use, therefore, the respective temperatures of the signal conductors 20 and the points of contact between the bumps 21 and the inspection spots increase. With the progress of this temperature increase, the insulating substrate, elastic member, signal conductors, and bumps thermally expand to specific lengths, depending on their respective coefficients of thermal expansion. In some cases, therefore, the signal conductors may be separated from the insulating substrate or elastic member, for example.

In the case of the head $C_1$, however, a glass-epoxy resin substrate and a rubber material may be used as the insulating substrate 17 and the elastic member 19, respectively. Since the coefficient of thermal expansion of the glass-epoxy resin substrate is lower than that of the rubber material, in this case, the rubber material is restrained from thermally expanding by the substrate surrounding it. Thus, thermal expansion of the signal conductors (formed of a metal with the highest coefficient of thermal expansion) in the elastic member in the pitch direction is also restrained, so that the pitch accuracy can be prevented from being changed by heat.

Figure 58:
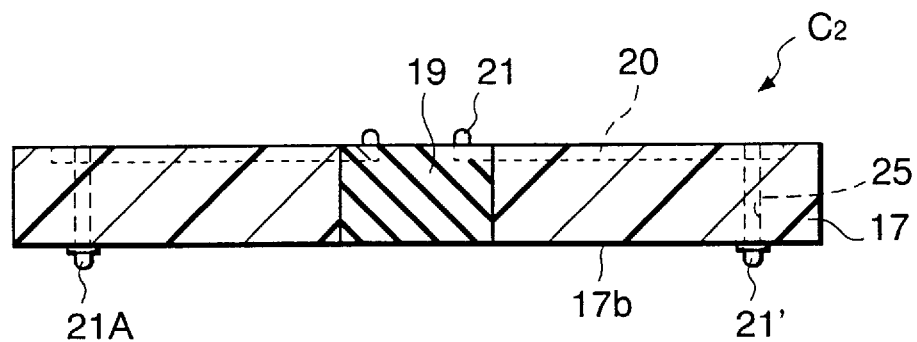
FIG. 58 is a sectional view showing a head $C_2$ according to the invention.

FIG. 58 is a sectional view showing another example $C_2$ of the head according to the present invention.

In this head $C_2$, a through hole 25 is bored through the other end of each of signal conductors 20, which is embedded in an insulating substrate 17 and an elastic member 19, so as to penetrate the substrate 17 in its thickness direction. Electrical conductivity is given to the inner wall of each through hole 25 by a conventional method. Each signal conductor 20 is led out to a lower surface 17b of the insulating substrate 17 through its corresponding through hole 25, and another bump 21' is formed protruding from its corresponding lead-out land. A large number of bumps 21' can be formed simultaneously by blanket soldering if solder is selected as the material of the bumps 21'.

Figure 59:
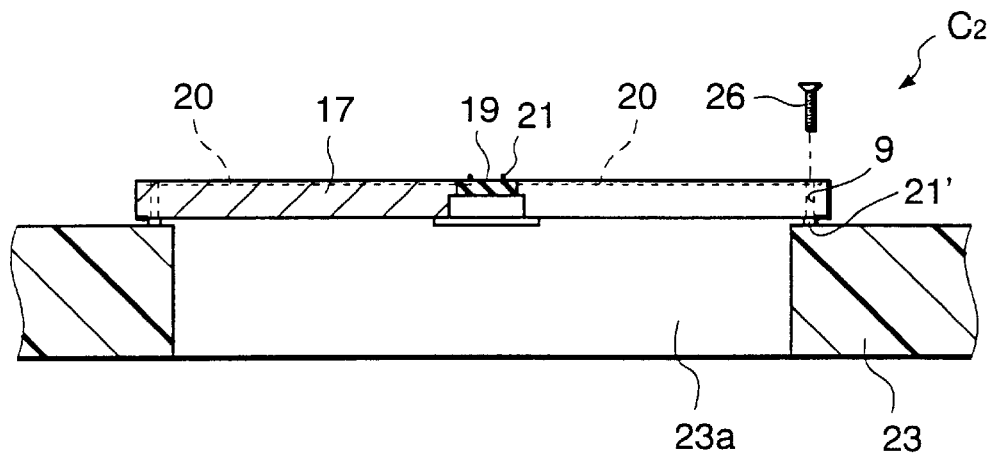
FIG. 59 is a sectional view showing the head $C_2$ disposed on a mother board.

As shown in FIG. 59, the head $C_2$ is placed directly on a mother board 23, which is formed with an aperture 23a having a given diameter, or a specified terminal (not shown) of a sub-board. Further, predetermined input and output signals can be delivered to the signal conductors 20 and the bumps 21' with the head $C_2$ fixed to the mother board 23 by means of fixing jigs 26 such as screws.

Since the head $C_2$ can be used in this manner, it can be removed from the mother board 23 and replaced with another one in case a change of the inspection machine type requires the replacement of the head.

Figure 60:
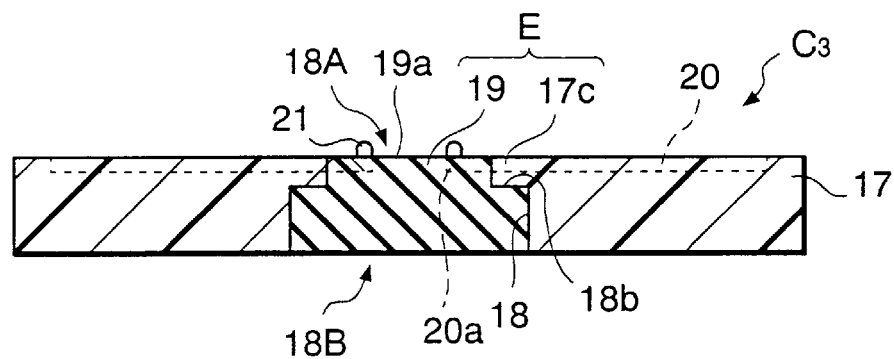
FIG. 60 is a sectional view showing a head $C_3$ according to the invention.

FIG. 60 is a sectional view showing still another example $C_3$ of the head.

In the case of the head $C_3$, an aperture 18 that is formed across the thickness of an insulating substrate 17 is profiled in the same manner as that of the aforesaid head $C_1$ except for a stepped structure such that its top opening 18A is smaller in diameter than its bottom opening 18B.

Since the aperture 18 has the stepped structure described above, the top side of the insulating substrate 17 forms a thin-wall portion 17c that is thinner than the remaining portion of the substrate 17, and is more liable to vertical elastic deformation than the other portion.

When the aperture 18 is filled up with an elastic member 19, the thin-wall portion 17c and the member 19 form a movable region E.

When the elastic member 19 is caused to bulge upward, extending portions 20a of signal conductors 20 and bumps 21 can receive upward lifting force from both an upper surface 19a of the member 19 and the thin-wall portion 17c, which is situated over a stepped portion 18b, so that the bumps 21 can more smoothly move up and down than those of the head $C_1$.

Figure 61:
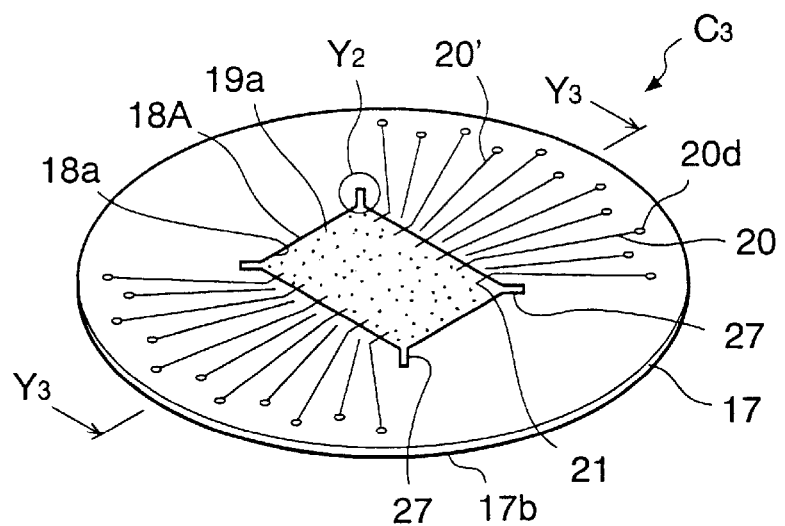
FIG. 61 is a perspective view showing a preferred example of the head $C_3$ according to the invention.
Figure 62:
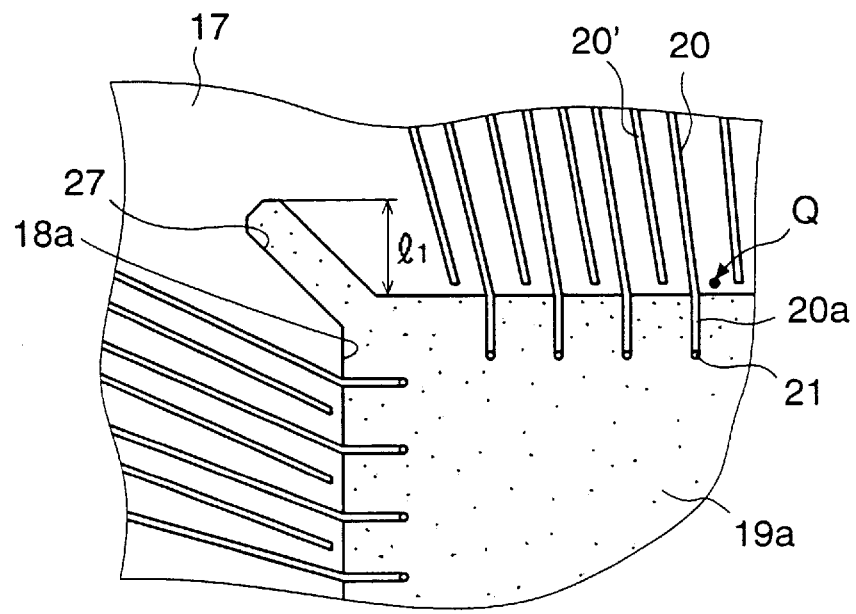
FIG. 62 is a partial enlarged view of a region $Y_2$ circled in FIG. 61.
Figure 63:
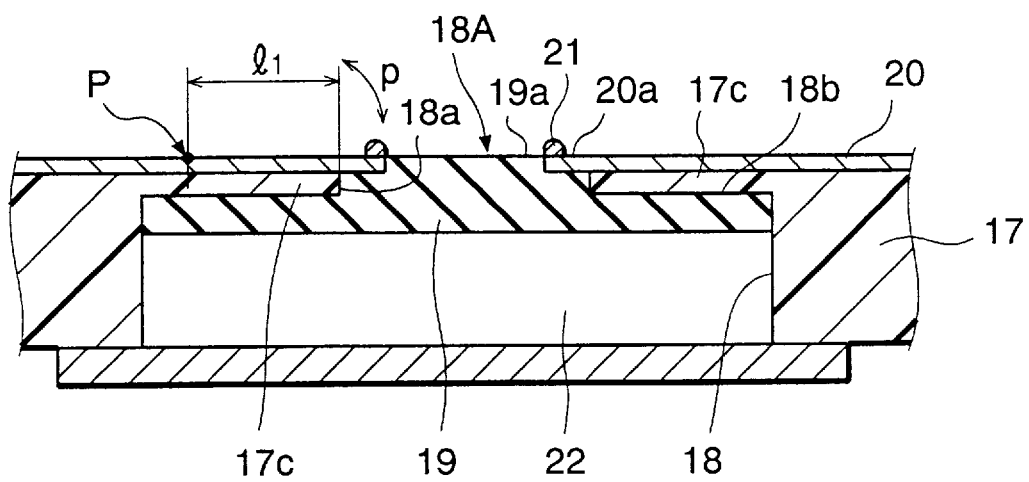
FIG. 63 is a partial sectional view taken along line $Y_3$—$Y_3$ of FIG. 61.

Preferably, the head $C_3$ is formed with a sealed air chamber, such as the one shown in FIG. 56, in the lower part of its elastic member, and is constructed in the manner shown in FIGS. 61 to 63.

FIG. 61 is a perspective view of the head $C_3$, FIG. 62 is a partial enlarged view showing a circled region $Y_2$, and FIG. 63 is a sectional view taken along line $Y_3$—$Y_3$ of FIG. 61.

In the case of the head $C_3$, the top opening 18A of the aperture 18 has a square plane shape, and slits 27 having a given width and length are cut individually in the four corners of the square opening 18A, as shown in FIGS. 61 and 62. Each slit 27 extends toward the peripheral edge of the insulating substrate 17 and reaches the basal part of the thin-wall portion 17c.

As shown in FIG. 63, the aperture 18 of the head $C_3$ has the stepped profile one shown in FIG. 60, and the upper surface 19a of the elastic member 19, which fills the aperture 18, is exposed in its top opening 18A so as to be flush with the upper surface of the insulating substrate 17. Lift means, such as a sealed air chamber 22, is provided in the lower part of the aperture 18.

At an edge portion 18a of the top opening 18A, therefore, that part of the insulating substrate 17 which has a length $l_1$ shown in FIGS. 62 and 63 is situated as the thin-wall portion 17c on the stepped portion 18b, and this part is formed as a tongue portion of the substrate 17. The signal conductors 20 on the insulating substrate 17 extend along the upper surface of the tongue portion (thin-wall portion) 17c to the upper surface 19a of the elastic member 19, and the bumps 21 protrude individually from their respective tip ends.

In the case of the head $C_3$, the tongue portion 17c of the insulating substrate 17 situated on the stepped portion 18b is thin-walled, so that it can elastically move up and down, and the edge portion 18a of the top opening 18A can make an arcuate motion (indicated by arrow p in FIG. 63) around a point or line P (basal part of the thin-wall portion) at a distance equivalent to the length $l_1$ from the edge portion 18a. Thus, the tongue portion 17c acts like a leaf spring as a whole. When the sealed air chamber 22 is pressurized to cause the elastic member 19 to bulge upward, the upper surface 19a of the member 19 also bulges upward, so that the respective extending portions 20a of the signal conductors 20 are pushed up. At the same time, the tongue portion (thin-wall portion with the length $l_1$ shown in FIGS. 62 and 63) 17c is pushed up, and the extending portions 20a of the conductors 20 are also pushed up correspondingly.

Thus, the up-and-down motion of the bumps 21 is regulated not only by the bulging and restoration of the upper surface 19a of the elastic member 19, but also by the upward bending of the tongue portion (thin-wall portion) 17c of the insulating substrate 17. Accordingly, the adjustment effect for the up-and-down motion of the bumps 21 is greater than in the case without the tongue portion 17c. Even if the bumps 21 are subject to variation in height, for example, all of them can be brought securely into contact with the inspection spots by properly selecting the length $l_1$ and thickness of the tongue portion 17c and adjusting the bending angle of the portion 17c.

Since the tongue portion 17c is thin-walled as a whole, moreover, it is very liable to bend, so that it can make an independent up-and-down motion in any desired point Q in the side direction of the edge portion 18a, as shown in FIG. 62, as well as the aforesaid arcuate motion p.

Accordingly, if the inspection spots are subject to substantial indentations, for example, the four tongue portions 17c can independently undergo elastic deformation in both the side direction and the vertical direction, depending on the state of the indentations, so that all the bumps 21 can be brought securely into contact with the inspection spots. If the inspection spots are subject to relatively small indentations, the bumps 21 can be brought satisfactorily into contact with the inspection spots by only moving the elastic member 19 up and down.

In the case of the head $C_3$, moreover, only the inspection spots can be moved up and down with the sealed air chamber 22 pressurized so that the elastic member 19 and the tongue portions 17c bulge upward to be kept in contact with the inspection spots in advance.

In the case of the head $C_3$ constructed in this manner, furthermore, the contact resistance between the bumps 21 and the inspection spots can be stabilized when the bumps 21 are actually used in contact with the inspection spots.

Figure 64:
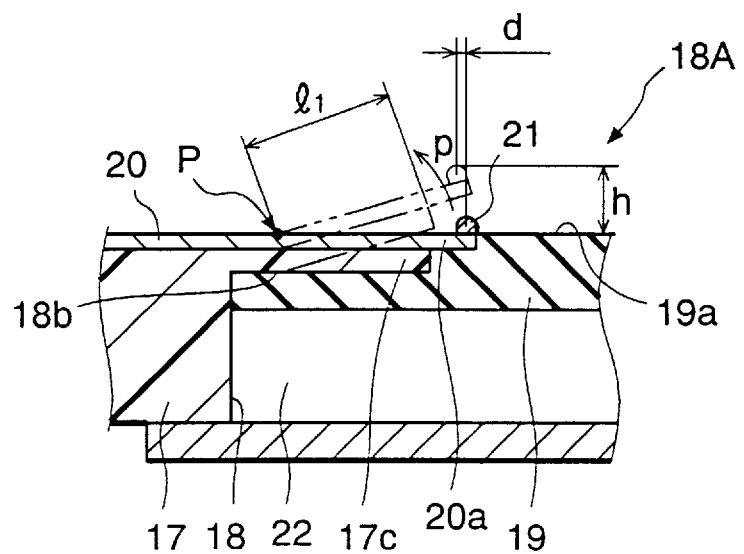
FIG. 64 is a partial sectional view illustrating the bump operation of the head $C_3$.

Let it be supposed, for example, that the elastic member 19 is caused to bulge upward so that its upper surface 19a is moved up by a height h, as indicated by imaginary line in FIG. 64.

Thereupon, each tongue portion 17c with the length $l_1$ makes the arcuate motion in the direction p around the point P, thereby bending upward, so that the bumps 21 also move up by the height h. As this is done, the bumps 21 also makes the arcuate motion in the direction p, so that the horizontal position of each bump 21 is deviated from its original position by a distance d, as indicated by imaginary line.

In other words, each bump 21 moves horizontally for the distance d as it moves up by the height h.

When the bumps 21 are individually in contact with the inspection spots, therefore, they scratch the inspection spots under pressure as they move for the distance d.

Accordingly, electrical contact between the inspection spots and the bumps 21 can be secured. If there are resistance increasing elements, such as dust, oxide films, etc. in the inspection spots, therefore, the scratching effect enables the bumps 21 to remove these elements and come into contact with the inspection spots. Thus, the contact resistance is stabilized.

Figure 65:
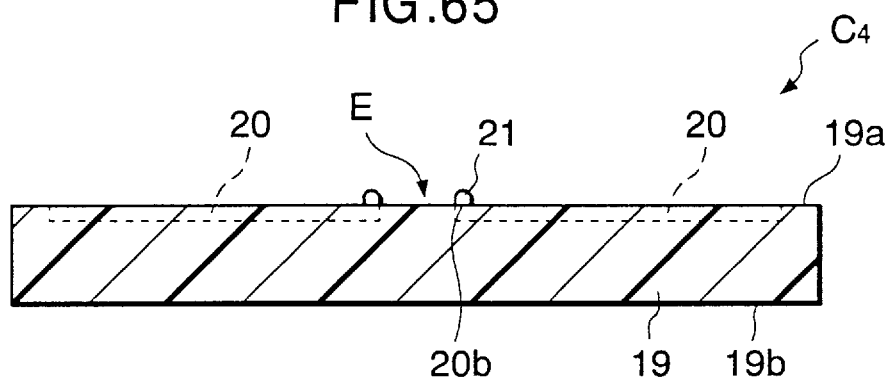
FIG. 65 is a sectional view showing a head $C_4$ according to the invention.

FIG. 65 is a sectional view showing a further example $C_4$ of the head.

The foregoing heads to $C_1$ to $C_3$ are premised on an assumption that the insulating substrate 17 and the elastic member 19 are formed of different materials. In the case of the head $C_4$ shown in FIG. 65, however, an insulating substrate and an elastic member are formed of the same material.

More specifically, an elastic member 19 constitutes an entire structure in which signal conductors 20 are arranged. The conductors 20 are buried under an upper surface 19a of the elastic member 19, and a bump 21 protrudes from an upper tip surface 20b of each conductor 20.

This head $C_4$, unlike the foregoing heads to $C_1$ to $C_3$, is not formed with any aperture. The respective tip ends of the signal conductors 20 are arranged in a plane pattern, such as the one shown in FIG. 53, for example. The wiring area for the signal conductors 20 or at least their respective tip ends forms a movable region E in which the bumps 21 can move up and down.

If the elastic member 19 is formed of a thin sheet, in the case of the head $C_4$, the whole structure is flexible enough to be able to bend freely. Accordingly, a lower surface 19b of the elastic member 19 can be sticked on a base member having a predetermined shape, so that contact heads in various shapes can be manufactured with improved design freedom.

Figure 66:
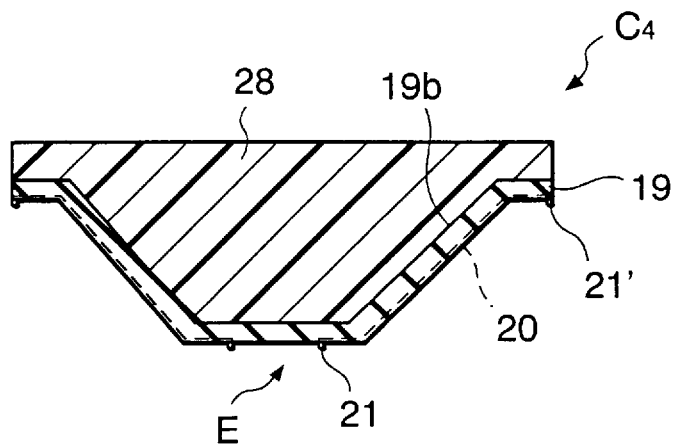
FIG. 66 is a sectional view of a contact head manufactured by using the head $C_4$ of FIG. 65.

As shown in FIG. 66, for example, a contact head can be obtained by forming bumps 21' individually on the respective other ends of the signal conductors 20 and sticking the lower surface 19b of the elastic sheet of the head $C_4$ on a rigid member 28 having a trapezoidal surface, for example.

Figure 67:
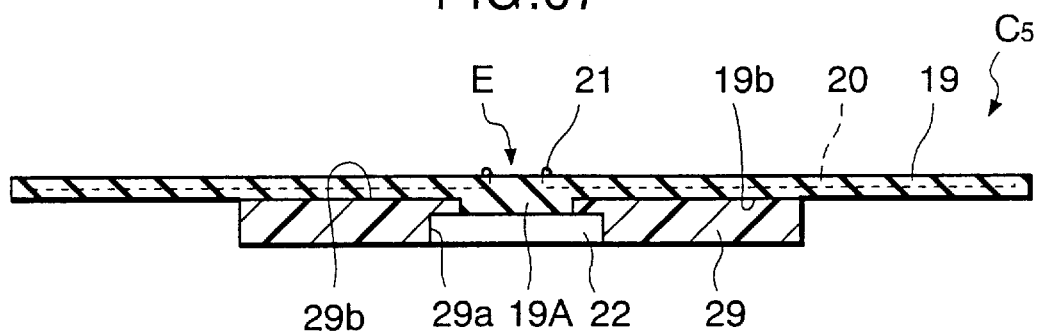
FIG. 67 is a sectional view showing a head $C_5$ according to the invention.

Further, a contact head $C_5$ with the construction shown in FIG. 67 can be manufactured by using the head $C_4$ shown in FIG. 65.

First, the head $C_4$ shown in FIG. 65 is manufactured by using a thin sheet for the elastic member 19, and an aperture is formed in a spot to define the movable region E in which the bumps 21 are moved up and down.

On the other hand, a rigid insulating substrate 29 being formed a stepped aperture 29a in a spot corresponding to the aforesaid opening of the elastic member 19 and having an overall size smaller than that of the sheet of the elastic member 19 is prepared. The lower surface 19b of the sheet of the elastic member 19 is sticked on a surface 29b of the insulating substrate 29 so that the two members are unified, the resulting hollow portion 29a is filled with another elastic member 19A, and a sealed air chamber 22 is provided under the member 19A, whereupon the head $C_5$ is completed.

Thus, in the case of the head $C_5$, the elastic member 19 with high flexibility, in which the signal conductors 20 are embedded projects from the sheet of the insulating substrate 29, and the spot filled with the second elastic member 19A forms the movable region E in which the bumps 21 can move up and down.

Figure 68:
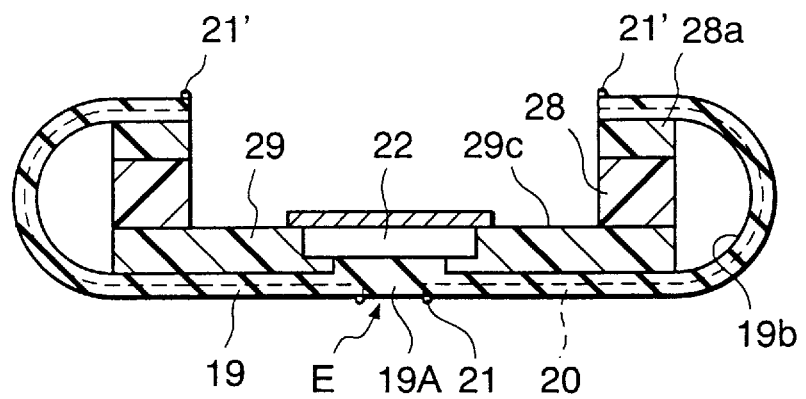
FIG. 68 is a sectional view showing the head $C_5$ of FIG. 67 mounted on a mother board.

The head $C_5$ can be actually used in the manner shown in FIG. 68.

Another bump 21' is formed on the other end of each signal conductor 20, and a base member 28 is mechanically fixed to the peripheral edge of a back surface 29c of the insulating substrate 29 by means of, for example, screws. Then, the projecting portion of the sheet of the elastic member 19 is bent, the back surface 19b of the member 19 is put on and fixed to another base member 28a by mechanical means such as screws, and the bumps 21 are connected to a mother board (not shown).

A cushioning effect can be obtained if either of the base members 28 and 28a is formed of a soft material.

With the head $C_5$ used in this manner, the elastic member 19 need not be formed with any through holes for connecting the bumps 21 and 21'. In case of head replacement required by a change of the inspection machine type, moreover, the base members 28 and 28a can be easily disassembled to facilitate the replacement.

Figure 69:
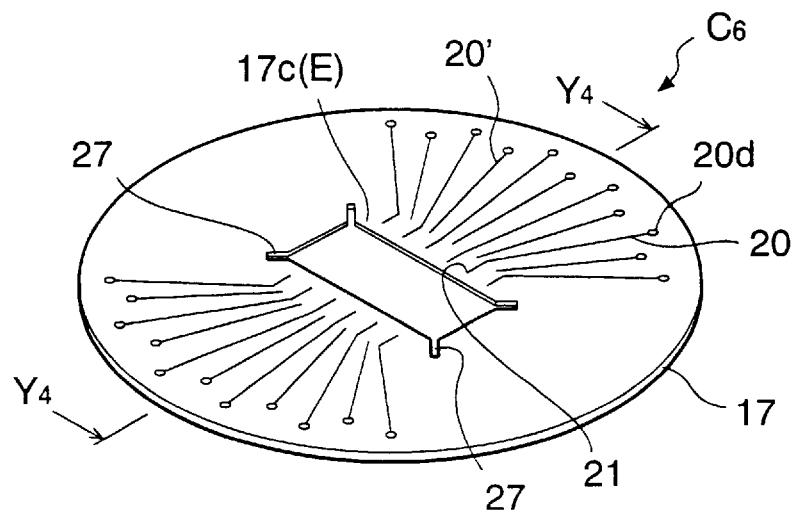
FIG. 69 is a perspective view showing a head $C_6$ according to the invention.
Figure 70:
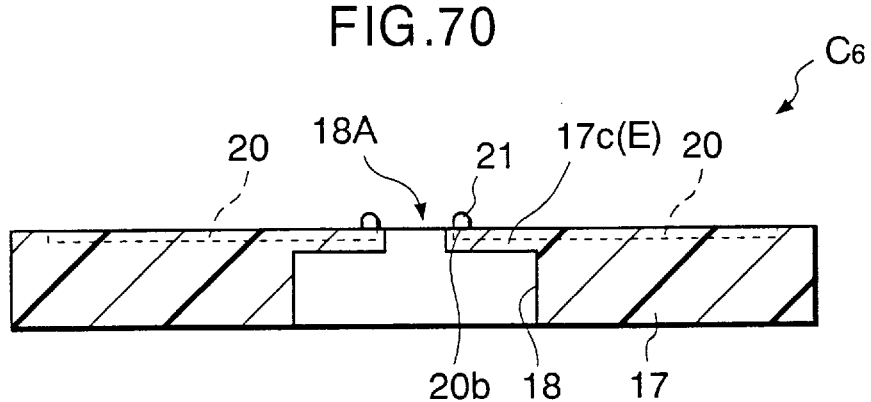
FIG. 70 is a sectional view taken along line $Y_4$—$Y_4$ of FIG. 69.

FIG. 69 is a perspective view showing another head $C_6$ according to the present invention, and FIG. 70 is a sectional view taken along line $Y_4$—$Y_4$ of FIG. 69.

The head $C_6$ is constructed in the same manner as the head $C_3$ shown in FIGS. 60 to 63 except that its aperture 18 is not filled up with any elastic member.

More specifically, the stepped aperture 18 is formed across the thickness of an insulating substrate 17. A top opening 18A of the aperture 18 has a square plane shape, and slits 27 are cut individually in the four corners of the square opening 18A. Thus, as in the case of the head $C_3$, the top side of the insulating substrate 17 forms a thin-wall portion (tongue portion) 17c.

Signal conductors 20 are arranged extending close to the peripheral edge of the thin-wall portion 17c, and a bump 21 protrudes from an upper tip surface 20b of each conductor 20.

Thus, in the head $C_6$, the flexible thin-wall portion 17c itself forms a movable region E in which the bumps 21 can move up and down.

The thin-wall portion 17c, and therefore, the bumps 21 can be moved up and down by properly adjusting the thickness and projection length (length of slits 27) of the portion 17c and by inflating and deflating, for example, a balloon that is set in the aperture (hollow) 18.

In the head $C_1$ to $C_6$ described above, at least the bumps 21 in the movable region E, like the bumps 3 of the aforementioned circuit boards $M_1$ to $M_6$, have a multilayer structure of which an outer layer portion is formed of a corrosion-resistant first conductive material.

The following is a description of manufacturing methods for bump-type contact heads according to the present invention.

A first manufacturing method will now be described with reference to the accompanying drawings.

Figure 71:
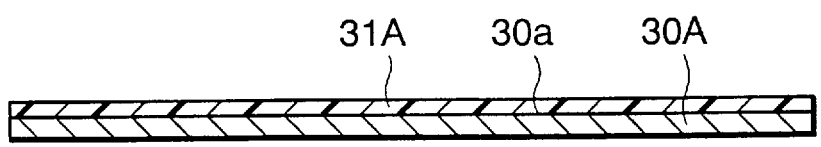
FIG. 71 is a sectional view showing a structure obtained by forming a first resist layer on a conductive sheet.

A conductive sheet 30A of, for example, phosphor bronze with a thickness of about 100 to 150 μm is prepared, and a conventional dry film is sticked on or a liquid resist is applied to the sheet, thereupon a first resist layer 31A with a given thickness is formed entirely covering a surface 30a of the sheet, as shown in FIG. 71.

Figure 72:
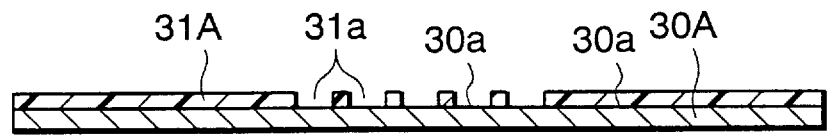
FIG. 72 is a sectional view showing a structure obtained by forming apertures in the first resist layer.

Then, the resist layer 31A is optically exposed and developed so that apertures 31a having predetermined shapes are formed in those portions of the resist layer 31A which correspond individually to spots for the formation of bumps, and the surface 30a of the conductive sheet 30A is exposed through the apertures 31a, as shown in FIG. 72. Subsequently, the resist layer 31A is removed after only those portions of the surface 30a which are exposed through the apertures 31a are etched to a given depth.

Figure 73:
FIG. 73 is a sectional view showing a structure obtained by forming recesses for bump in the conductive sheet.

Thereupon, recesses for bump 21a of a given depth are formed in those portions of the surface 30a of the conductive sheet 30A in which bumps are to be formed, as shown in FIG. 73.

Figure 74:
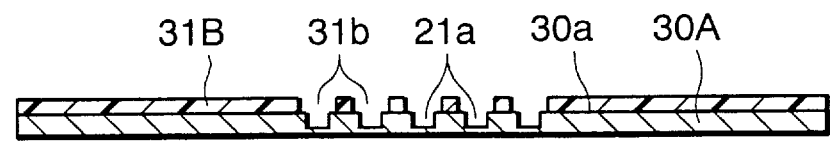
FIG. 74 is a sectional view showing a structure obtained by forming a second resist layer on the conductive sheet and then forming the layer with patterns corresponding to groove patterns for signal conductors to be formed.

Then, a resist layer 31B having a given thickness is formed by sticking the conventional dry film to or applying the liquid resist to the whole surface 30a, and is then optically exposed and developed. Thereafter, those portions of the resist layer 31B which correspond to the respective patterns of signal conductors to be formed are removed so that groove patterns (plane patterns) 31b deep enough to reach the surface 30a of the conductive sheet 30A is formed to expose the sheet surface 30a, as shown in FIG. 74. Thus, the recesses for bump 21a are exposed individually at the respective tip ends of the resulting groove patterns 31b. The thickness of the resist layer 31B is adjusted so as to be substantially equal to that of each signal conductor to be formed.

Each groove pattern 31b is made wider than each underlying bump recess 21a. Thus, a hollow portion defined by each bump recess 21a and its corresponding groove pattern 31b has a stepped profile, and the base of the stepped structure or a part of the conductive sheet 30A is exposed in the groove pattern 31b.

Then, the whole resulting structure is immersed in a specified plating bath, and is electroplated with use of the conductive sheet 30A as a negative electrode.

This electroplating is carried out at least twice in different plating baths. In a first cycle of electroplating, a corrosion-resistant first conductive material is electrodeposited, such as gold, nickel, or nickel-cobalt alloy that cannot be corroded by any etchant used in an etching process, which will be mentioned later. In this first electroplating cycle, the first conductive material is electroplated in a layer on the exposed surface of the conductive sheet 30A, in the hollow portions defined by the recesses for bump 21a and the groove patterns 31b.

Another cycle of electroplating is carried out following the first electroplating cycle, whereupon another conductive material is electrodeposited on the lamina of the first conductive material so as to be flush with the resist layer 31B. This electrodeposited conductive material may be any material that enjoys high electrical conductivity. Copper and aluminum are preferred examples of this material.

In this process of electroplating, the first conductive material is first deposited in a layer in the recesses for bump 21a, in the hollow portions defined by the recesses 21a and the groove patterns 31b, and the second conductive material is then deposited on the lamina of the first material. As a result, the hollow portions are filled up with these conductive materials.

Figure 75:
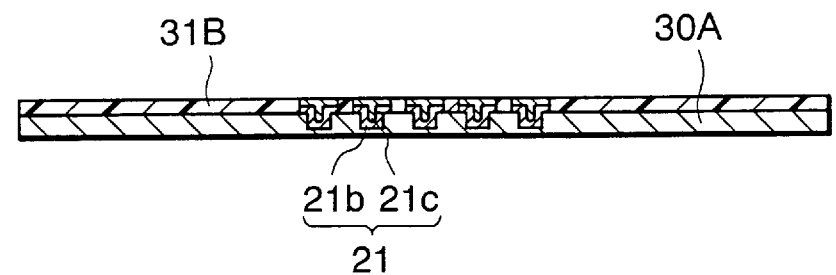
FIG. 75 is a sectional view showing a structure obtained by electrodepositing a conductive material in the recesses for bump and on the groove patterns for signal conductors.

At the end of the electroplating process, therefore, bumps 21 are formed in a manner such that each bump recess is filled up with a two-layer structure that is composed of a lamina 21b covering the exposed surface of the conductive sheet 30A and a lamina 21c formed thereon, as shown in FIG. 75. Also, each groove pattern is formed with a two-layer structure that is composed of a lamina electrodeposited on the exposed surface of the conductive sheet 30A and another conductive material deposited thereon.

Then, the resist layer 31B is removed.

Figure 76:
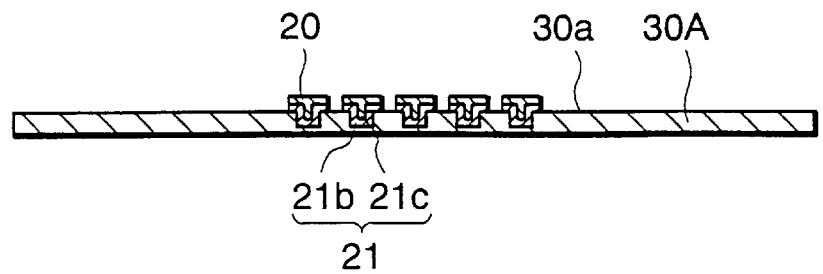
FIG. 76 is a sectional view showing a structure obtained by forming the surface of the conductive sheet with bumps and signal conductors.

Thereupon, signal conductors 20 having a predetermined pattern and the bumps 21 are formed on the surface 30a of the conductive sheet 30A in a manner such that the conductors 20 project above the surface 30a and that the bumps 21 are buried in the sheet 30A so as to be integral with the respective tip ends of the conductors, as shown in FIG. 76.

Figure 77:
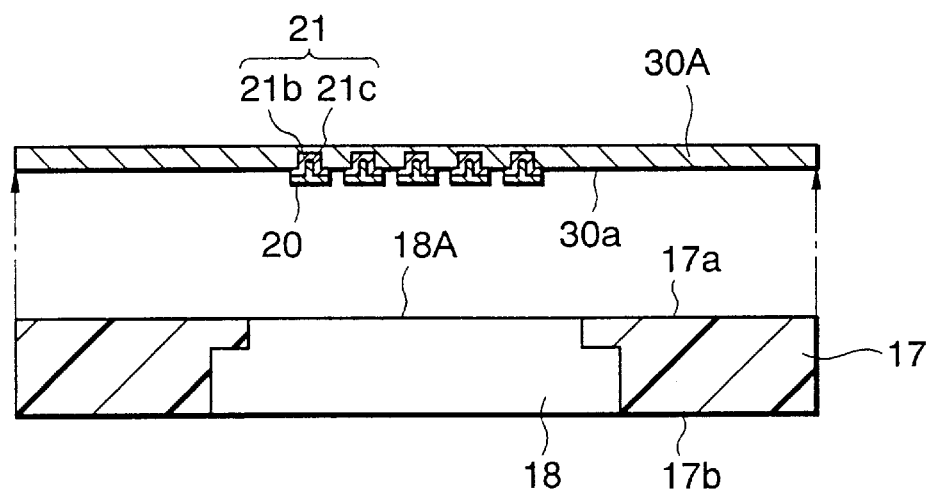
FIG. 77 is a sectional view showing the way the surface of the conductive sheet of FIG. 76 and an insulating substrate are bonded together by thermocompression.

Subsequently, a top surface 17a of an insulating substrate 17 and the surface 30a of the conductive sheet 30A, having the patterns for the signal conductors 20 thereon, are unified by thermocompression bonding, as shown in FIG. 77. The insulating substrate 17 is formed with an aperture 18, penetrating it from the upper surface 17a thereof to its lower surface 17b. The aperture 18 has a stepped profile and a square plane shape as viewed from above, and is slit in its four corners. Thus, the tip end portion of the pattern of each signal conductor 20, on which the bump 21 is formed, is situated corresponding to a top opening 18A of the aperture 18, the remaining portion of the pattern is buried in the insulating substrate 17, and the aperture 18 itself is left as a hollow portion.

Preferably, the insulating substrate 17 used in this arrangement should be formed of a material, such as a prepreg, that is semihard at normal temperature and softens when heated. The reason is that since the pattern of each signal conductor 20 is formed projecting from the surface 30a of the conductive sheet 30A, it can be buried in the upper surface 17a of the plastic insulating substrate 17 when the substrate 17 is contact-bonded to it, and the substrate 17 is thermoset and fixed thereafter.

Figure 78:
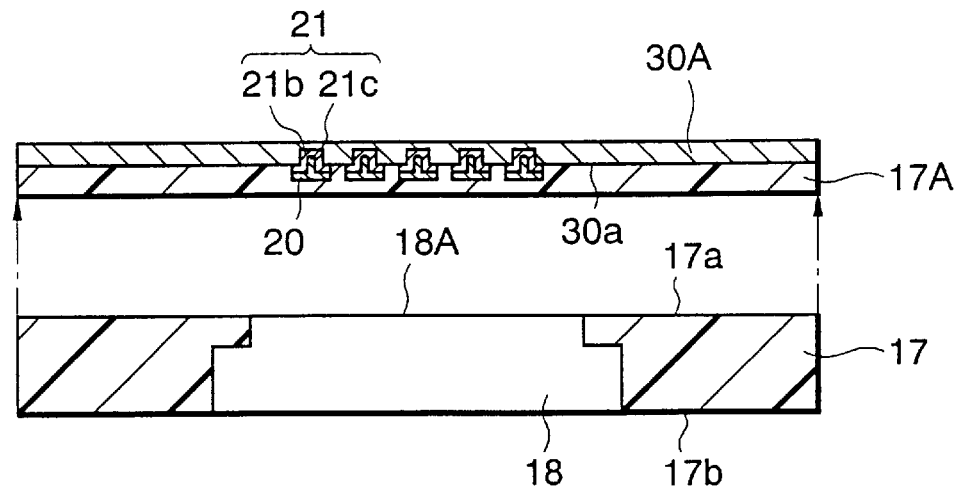
FIG. 78 is a sectional view showing another example of the way the conductive sheet and the insulating substrate are bonded by thermocompression.

Even in the case where the insulating substrate 17 is formed of a rigid material, however, a layer 17A of, for example, an uncured epoxy resin can be formed on the surface 30a of the conductive sheet 30A so that the patterns of the signal conductors 20 are buried in the surface 30a, as shown in FIG. 78, for example, and the rigid insulating substrate 17, having the aperture 18 with the top opening 18A in a predetermined shape, can be boned to the layer 17A by thermocompression for unification.

Immediately after the thermocompression bonding, in this case, the layer 17A is uncured and soft, so that the patterns of the signal conductors 20 can be buried therein. At the same time, the layer 17A is joined to the upper surface 17a of the insulating substrate 17. As the layer 17A is thermoset, the patterns of the signal conductors 20 are integrated with the substrate 17 in a manner such that they are buried in the thermoset layer 17A.

The insulating substrate used in this process may be any electrically insulating substrate, e.g., a glass-epoxy resin substrate, flexible printed board, resin substrate or sheet formed of an epoxy resin, polyimide, polyester, urethane resin, or phenolic resin, ceramic sheet, etc. In consideration of the requirement that the patterns of the signal conductors 20 on the conductive sheet 30A be buried after the thermocompression bonding, as mentioned before, the insulating substrate should preferably be formed of a prepreg of a soft glass-epoxy resin.

Also, the insulating substrate may be formed having a suitable thickness by stacking a plurality of prepregs in layers, for example.

After the unification of the conductive sheet 30A and the insulating substrate 17 is finished, a hollow portion 18C defined by the conductive sheet 30A and the aperture 18 of the insulating substrate 17 is filled up with an elastic member 19.

Figure 79:
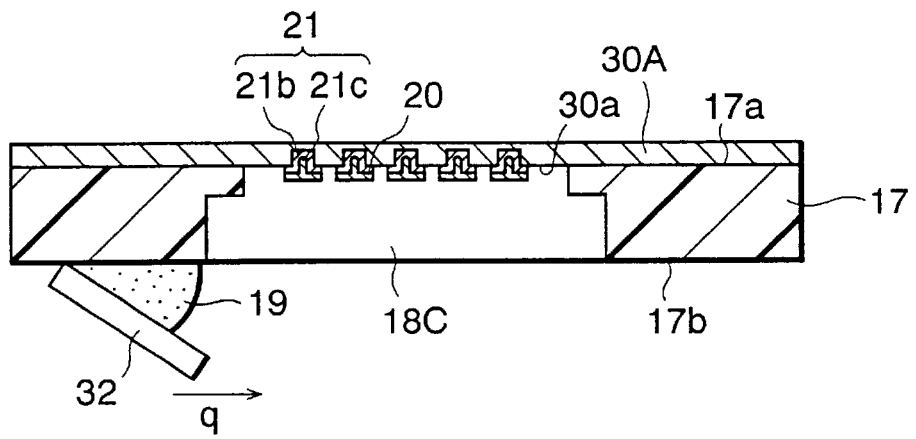
FIG. 79 is a sectional view showing the way an elastic member is filled into a hollow portion formed when the conductive sheet of FIG. 76 and the insulating substrate are joined together.
Figure 80:
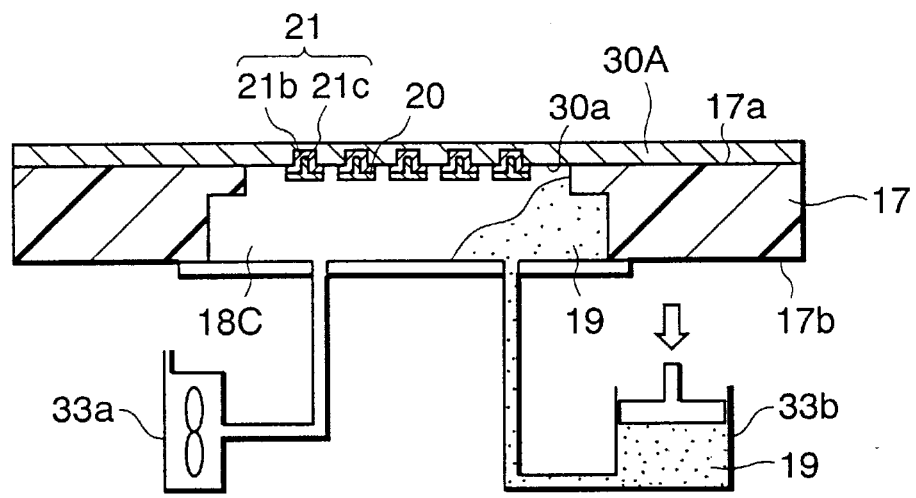
FIG. 80 is a sectional view showing another method for filling the elastic member.

As shown in FIG. 79, for example, the elastic member 19 may be provided on the lower surface 17b of the insulating substrate 17 so that it can be filled into the hollow portion 18C by means o a squeegee 32, moving in the direction of arrow A, for example, and solidified. Alternatively, as shown in FIG. 80, the bottom of the hollow portion 18C may be sealed. In this case, a decompression device 33a is connected to the hollow portion 18C, whereby the sealed space in the hollow portion is decompressed, and a container 33b for storing the elastic member 19 is connected to the sealed space. In this arrangement, the stored elastic member 19 can be solidified after it is injected into the sealed space under differential pressure.

Figure 81:
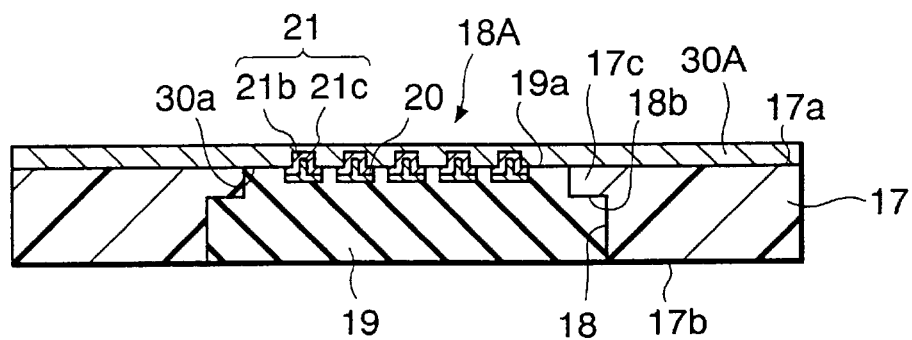
FIG. 81 is a sectional view showing a structure obtained by filling the elastic member into the hollow portion shown in FIG. 79.

By carrying out this process, the hollow portion 18C is filled up with the elastic member 19 in a manner such that the upper surface 19a of the member 19 is in contact with the surface 30a of the conductive sheet 30A and the lower surface of the thin-wall portion (tongue portion) 17c of the insulating substrate 17 at the stepped portion 18b, and that the respective tip ends of the signal conductors 20 and the bumps 21 are buried in the member 19 in the top opening 18A of the aperture 18, as shown in FIG. 81.

Figure 82:
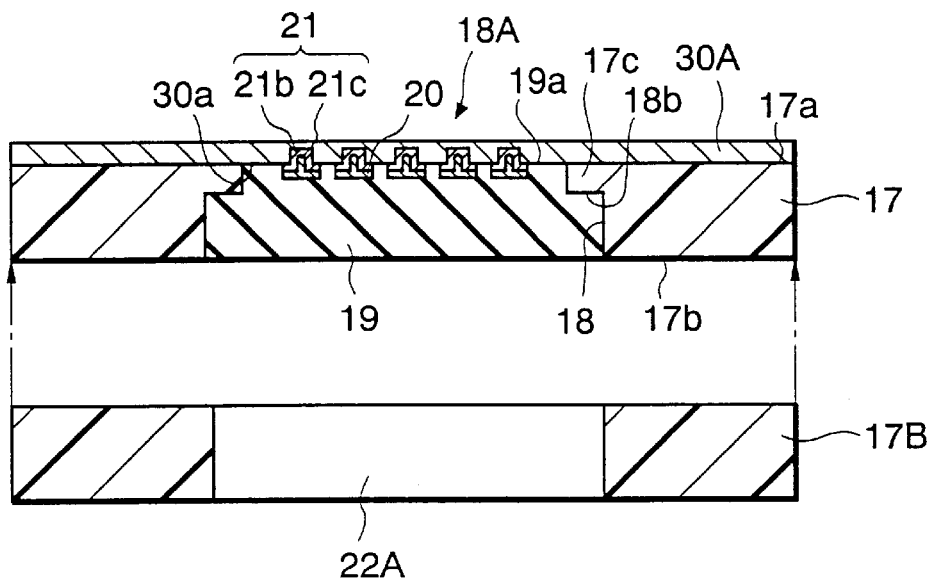
FIG. 82 is a sectional view showing the way another insulating substrate is attached to the structure shown in FIG. 81.

In forming a sealed air chamber 22 under the elastic member 19, as shown in FIG. 63, it is necessary only that another insulating substrate 17B having a aperture 22A large enough to house the elastic member 19 in the hollow portion 18C be adhered to or bonded by thermocompression to the lower surface of the insulating substrate 17, as shown in FIG. 82.

Preferably, the elastic member used in this case should be formed of a material that can maintain appropriate elasticity after it is filled into the hollow portion and solidified, e.g., fluororubber, silicone rubber, acrylic rubber, ethylene-propylene rubber, ethylene-vinyl acetate rubber, chloroprene rubber, nitrile rubber, styrene-butadiene rubber, natural rubber, etc. Also, liquid rubbers, such as liquid polybutadiene, liquid silicone, etc., or thermoplastic elastomers, such as polystyrene, polybutadiene, etc., may be used for this purpose.

According to the above-described method for embedding the signal conductors in the elastic member, the conductive sheet 30A and the insulating substrate 17 are bonded together by thermocompression, and the resulting hollow portion 18C is filled up with the elastic member. Alternatively, however, a predetermined portion of a conductive sheet 30A, such as the one shown in FIG. 76, including the respective tip end portions of the signal conductors 20, may be molded from an elastic member, further solidified, and released from the mold. Thereafter, in this case, the insulating substrate 17 is bonded to the resulting structure by thermocompression for unification, as shown in FIG. 77.

Finally, the elastic member 19 in the hollow portion 18C is solidified, and the whole resulting structure is immersed in a specified etchant, whereupon the conductive sheet 30A is removed by etching.

Figure 83:
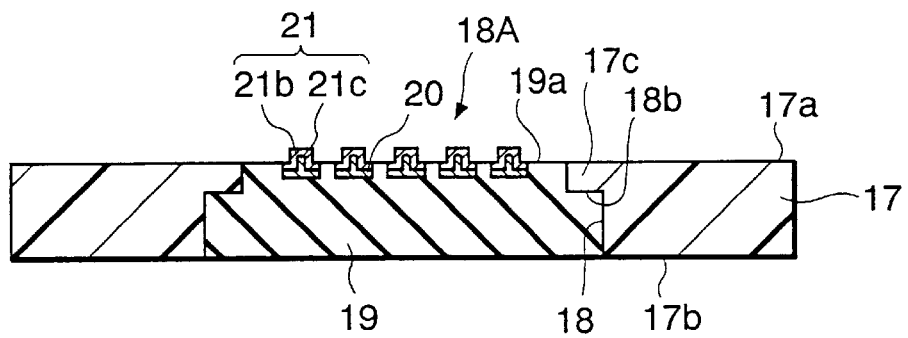
FIG. 83 is a sectional view showing a structure obtained by separating the conductive sheet.

Thus, as shown in FIG. 83, a head is obtained such that each signal conductor 20 is transferred so as to be buried under the respective upper surfaces 17a and 19a of the insulating substrate 17 and the elastic member 19, having only its upper surface exposed, and that the bumps 21 protrude individually upward from the respective tip ends of the conductors 20. The intended head can be obtained by coating the exposed upper surface of the pattern of each signal conductor with, for example, gold by electroplating or electroless plating.

An outer layer portion 21b of each bump 21 is formed of a conductive material that cannot be corroded by an etchant used, so that it can serve as a barrier layer against the etchant. Thus, there is no possibility of the bumps 21 being etched in the etching process.

According to the method described above, the conductive sheet 30A shown in FIG. 71 is formed with the patterns for the recesses for bump and the signal conductors.

However, the bump-type contact heads according to the present invention may be also manufactured by the aforementioned manufacturing method for the circuit board $M_2$.

More specifically, as shown in FIGS. 42 to 45, the recesses for bump 3A are formed in the electrodeposit layer 8 in the step A for the circuit board $M_2$, the plane pattern (groove pattern) 2A for the signal conductors is formed in the resist layer $a_2$ under the electrodeposit layer 8, and the resulting structure is electroplated at least twice. Thereupon, the bumps 3 of a multilayer structure are formed individually in the recesses for bump, and at the same time, the groove pattern is formed with the conductor circuit 2a of a multilayer structure.

After the resulting member is integrated with the insulating substrate, as shown in FIG. 77, the hollow portion defined by the aperture of the insulating substrate is filled up with elastic member. Thereafter, it is necessary only that the conductive substrate be removed, and the thin conductive layer and the electrodeposit layer thereunder be successively removed by etching.

Further, the head $C_4$ shown in FIG. 65 can be manufactured by using an elastic sheet for the insulating substrate 17 in the process for unification shown in FIG. 77.

In manufacturing the head $C_6$ shown in FIG. 69, moreover, it is necessary only that the signal conductors 20 formed on the surface 30a of the conductive sheet 30A be situated on the upper surface of the thin-wall portion (tongue portion) 17c of the insulating substrate 17 as the unification process shown in FIG. 77 is carried out, and that the aperture 18 of the substrate 17 be not filled up with the elastic member.

In the bump-type contact heads according to the invention, as seen from the above description, the signal conductors are arranged extending to the movable region that is flush with the insulating substrate, and the bumps are formed individually on the respective tip ends of the conductors. Accordingly, the bumps can be brought into contact with or disengaged from the inspection spots by pushing up or releasing the upper surface of the movable region.

In any of the heads according to the invention, only the upper surface of each signal conductor is exposed, and the other portions are buried in the insulating substrate and the elastic member (movable region). Thus, these heads exhibit a strong resistance against separating stresses on the signal conductors that are generated as the bumps move up and down during inspection, operate with high reliability, and enjoy a long working life.

In the case of the head $C_3$, those portions of the insulating substrate which are situated close to the top opening of the aperture are in the form of thin-walled independent tongues divided by slits, and these tongue portions can independently act as leaf springs with a high degree of freedom. Thus, the adjustment function for the up-and-down motion of the bumps is improved.

Further, the heads according to the present invention contain the means for pushing up the elastic member and have a simple construction as a whole, never requiring any complicated mechanisms that are used in the conventional heads.

In the case of the heads according to the invention, moreover, the elastic member enables the bumps on its upper surface to move up and down independently of one another.

Furthermore, the heads according to the invention can be designed so that the signal conductors are led out onto the opposite surface side through the through holes, individually, and carry their corresponding bumps thereon.

In actual use, in this case, the bumps are removably mounted on a mother board, and one head can be easily replaced with another in case of a change of the inspection machine type.

In the head $C_4$, the insulating substrate is formed of an elastic member, so that it is flexible enough to be attached to base members having various shapes.

Accordingly, this head is useful to improve the design freedom.

Further, any of these heads can be manufactured combining the exposure/developing process and the electroplating method that are applied to the manufacture of the conventional circuit boards. Even in the case where a large number of signal conductors and bumps are arranged at fine pitches, therefore, they can be collectively formed with high pitch accuracy in accordance with design criteria, without requiring any readjustment that is essential to the conventional heads. Moreover, the heads according to the invention can be manufactured by utilizing equipment that has conventionally been used in the manufacture of printed boards. Thus, the gross manufacturing cost can be lowered considerably, as compared to the manufacture of the conventional heads.

Figure 84:
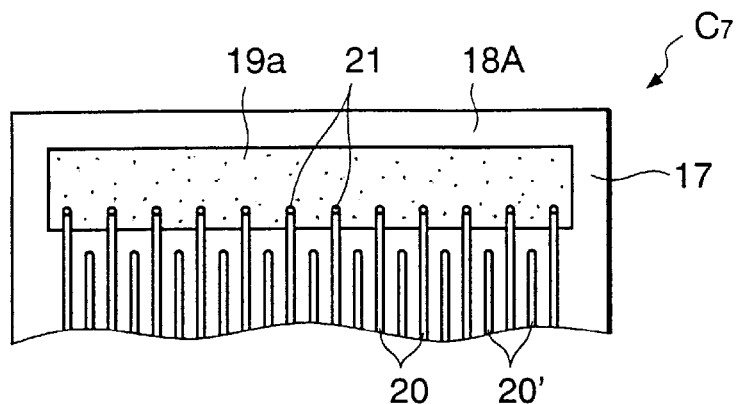
FIG. 84 is a partial plan view showing another contact head $C_7$ according to the invention.

In each head constructed according to the invention, as shown in FIG. 84, moreover, the surface 19 of the elastic member 19 may be exposed through the top opening 18A of the aperture of the insulating substrate 17, which has a square plane shape, so as to be flush with the substrate 17. In this case, a plurality of signal conductors 20 and ground wires 20' are arranged parallel to one another, and the bumps 21 are formed individually on the respective tip ends of the conductors 20. The head constructed in this manner can be readily used for the inspection of circuit components, such as a liquid crystal panel, PDP, TAB, etc.

The following is a description of a semiconductor component packaging module according to the present invention.

Figure 85:
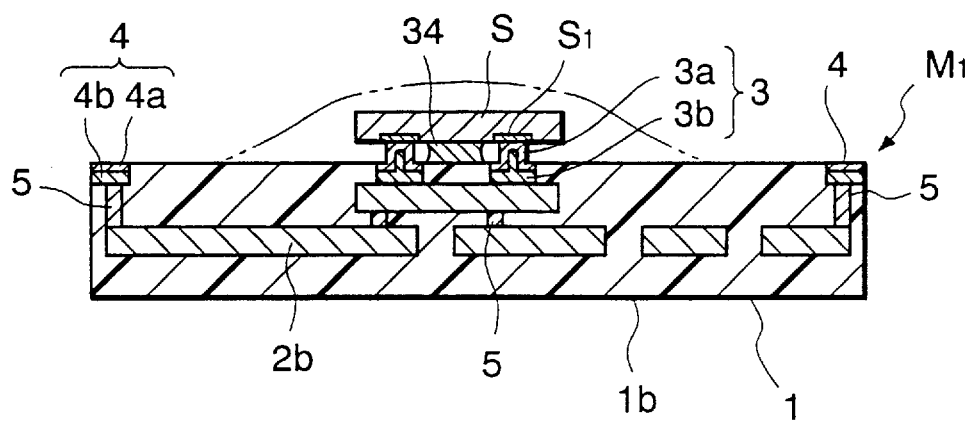
FIG. 85 is a sectional view showing an example of a semiconductor component packaging module according to the invention.

FIG. 85 is a sectional view showing a state in which the semiconductor component S is mounted on the circuit board $M_1$ according to the invention in the manner shown in FIG. 1.

In this module, the semiconductor component S is die-bonded to the surface of the circuit board $M_1$ with an adhesive 34, and a mounting spot is resin-molded, as indicated by imaginary line in FIG. 85.

The bumps 3 projecting in the predetermined pattern from the surface 1a of the circuit board $M_1$ and lands $S_1$ formed in the lower surface of the semiconductor component S are only in mechanical contact with one another.

This arrangement can be obtained by using a bonding agent that contracts when it is cured, as the adhesive 34 for die-bonding the semiconductor component S.

Thus, when the semiconductor component S is adhered to the surface of the insulating base 1 with the adhesive 34 having the aforesaid properties in a manner such that its lands $S_1$ and the bumps 3 are in alignment, the component S is pulled downward by dimensional contraction of the adhesive 34 that advances as the adhesive 34 is cured. In consequence, the lands $S_1$ of the component S and the bumps 3 are brought directly into mechanical contact with one another by the contractile force of the adhesive 34, whereupon a conduction structure is formed.

In this case, the bumps 3 of the circuit board $M_1$ are subject to a very narrow variation in height, so that all of them can securely come into mechanical contact with their corresponding lands $S_1$ of the semiconductor component S. Virtually, therefore, all of a large number of bumps and the lands of the semiconductor component can enjoy secure contact without exception. Thus, the reliability of connection for packaging is very high.

The adhesive 34 for this purpose may be formed of any material that contracts when it is cured. For example, it may be an adhesive that is conventionally used for die bonding.

When the module is in actual operation, the points of contact between the lands $S_1$ and the bumps 3 are subjected to heat load that is attributable to the difference in thermal expansion between the semiconductor component S and the circuit board $M_1$. Even in this case, however, only a rubbing force acts between the lands $S_1$ and the bumps 3, and there is no force acting to separate them, so that the conduction structure between them cannot be broken.

This module can be assembly by only die-bonding the semiconductor component to the circuit board with the adhesive. In contrast with the case of the conventional die bonding, the lands of the semiconductor component and the connecting terminals (e.g., bumps) of the circuit board are not brought indirectly into contact with one another by using, for example, molten solder. Thus, the module can be manufactured very easily.

Although the circuit board $M_1$ has been described above as an example of the packaging substrate, the module according to the present invention is not limited to this, and can be assembled by using any circuit boards, including the aforementioned ones, in which bump patterns project from the board surface.

What is claimed is:

1. A circuit board comprising:
   an insulating base having bumps and lands formed on at least a first surface thereof;
   conductor circuits formed in at least one layer on at least one of: (i) the first surface of the insulating base, and (ii) an inside portion of the insulating base; and
   a conduction structure formed at least one of: (i) between the bumps and the conductor circuits, and (ii) between the conductor circuits,
   wherein said bumps and lands each comprise a same multilayer structure formed by successively electrodepositing at least two different electrically conductive materials.

2. The circuit board according to claim 1, wherein said conduction structure comprises pillar-shaped conductors.

3. The circuit board according to claim 1, wherein said multilayer structure comprises a two-layer structure having an outer layer portion and an inner layer portion, said outer layer portion comprising a metal including any one of gold, nickel, and a nickel alloy, and said inner layer portion comprising copper.

4. The circuit board according to claim 1, wherein said bumps and lands formed on the first surface of the insulating base are exposed.

5. The circuit board according to claim 1, wherein a first layer of the conductor circuits having the same multilayer structure as said bumps and lands is formed on the first surface of the insulating base, and wherein said insulating base is formed with the bumps, the lands, and the first layer of the conductor circuits exposed on the first surface thereof.

6. The circuit board according to claim 1, wherein said insulating base includes at least one of a ground wire circuit and a heat sink formed on the first surface thereof.

7. The circuit board according to claim 1, wherein said insulating base includes a heat sink formed on the first surface thereof and a heat transfer path extending from the heat sink to a second surface of the insulating base, said heat transfer path being exposed at the second surface of the insulating base.

8. A circuit board comprising:
   an insulating base having bumps formed on at least a first surface thereof;
   conductor circuits formed in at least one layer on at least one of: (i) the first surface of the insulating base, and (ii) an inside portion of the insulating base; and
   a conduction structure formed at least one of: (i) between the bumps and the conductor circuits, and (ii) between the conductor circuits,
   wherein at least each of said bumps comprises a multilayer structure formed by successively electrodepositing at least two different electrically conductive materials, and
   wherein said multilayer structure comprises a two-layer structure having an outer layer portion and an inner layer portion, said outer layer portion comprising a metal including any one of gold, nickel, and a nickel alloy, and said inner layer portion comprising copper.

9. The circuit board according to claim 8, wherein said insulating base also has lands formed on the first surface thereof, and wherein the bumps and the lands are exposed on the first surface of the insulating base.

10. The circuit board according to claim 8, wherein said insulating base also has lands formed on the first surface thereof, and wherein said bumps, lands, and at least one of the conductor circuits are exposed on the first surface of the insulating base.

11. The circuit board according to claim 8, wherein said insulating base includes at least one of a ground wire circuit and a heat sink formed on the first surface thereof.

12. The circuit board according to claim 8, wherein said insulating base includes a heat sink formed on the first surface thereof and a heat transfer path extending from the heat sink to a second surface of the insulating base, said heat transfer path being exposed at the second surface of the insulating base.

* * * * *